United States Patent
Huitema et al.

(10) Patent No.: US 9,510,470 B2
(45) Date of Patent: Nov. 29, 2016

(54) SUPPORT STRUCTURES FOR A FLEXIBLE ELECTRONIC COMPONENT

(71) Applicant: POLYERA CORPORATION, Skokie, IL (US)

(72) Inventors: Hjalmar Edzer Ayco Huitema, Belmont, CA (US); Kwok Wah Mok, Valkenswaard (NL); Samuel Mason Curry, Oakland, CA (US)

(73) Assignee: Polyera Corporation, Skokie, IL (US)

( * ) Notice: Subject to any disclaimer, the term of this patent is extended or adjusted under 35 U.S.C. 154(b) by 0 days.

(21) Appl. No.: 14/865,606

(22) Filed: Sep. 25, 2015

(65) Prior Publication Data

US 2016/0014919 A1     Jan. 14, 2016

Related U.S. Application Data

(63) Continuation of application No. PCT/US2014/072328, filed on Dec. 24, 2014.

(60) Provisional application No. 62/095,231, filed on Dec. 22, 2014.

(51) Int. Cl.
| | |
|---|---|
| *H01J 1/62* | (2006.01) |
| *H05K 5/02* | (2006.01) |
| *G09F 9/30* | (2006.01) |
| *G06F 1/16* | (2006.01) |
| *H05K 5/00* | (2006.01) |

(52) U.S. Cl.
CPC ........... *H05K 5/0226* (2013.01); *G06F 1/1652* (2013.01); *G09F 9/301* (2013.01); *H05K 5/0017* (2013.01)

(58) Field of Classification Search
CPC ........................................... G09F 9/301
USPC ................................... 313/511, 498
See application file for complete search history.

(56) References Cited

U.S. PATENT DOCUMENTS

| | | | |
|---|---|---|---|
| 5,065,376 | A | 11/1991 | Choulat |
| 5,438,851 | A | 8/1995 | Geissbuhler |
| 6,369,865 | B2 | 4/2002 | Hinata |
| 6,503,188 | B1 | 1/2003 | August |
| 6,577,496 | B1 | 6/2003 | Gioscia et al. |

(Continued)

FOREIGN PATENT DOCUMENTS

| | | |
|---|---|---|
| CN | 101180669 A | 5/2008 |
| CN | 101180864 A | 5/2008 |

(Continued)

OTHER PUBLICATIONS

Non-Final Office Action from U.S. Appl. No. 14/188,440 dated Aug. 14, 2015.

(Continued)

*Primary Examiner* — Vip Patel
(74) *Attorney, Agent, or Firm* — Karen K. Chan

(57) ABSTRACT

An article includes a flexible electronic component and a flexible support coupled to the flexible electronic component. The flexible support is configured to support the flexible electronic component but also limit local bending of the flexible component. The flexible support defines a plurality of hinge points configured to facilitate movement of the article. The plurality of hinge points are positioned such that the article has a desired bending range.

29 Claims, 34 Drawing Sheets

(56) References Cited

U.S. PATENT DOCUMENTS

| | | | |
|---|---|---|---|
| 6,750,607 | B2 | 6/2004 | Huitema et al. |
| 6,831,769 | B2 | 12/2004 | Holman et al. |
| 7,180,665 | B2 | 2/2007 | Daniel et al. |
| 7,209,114 | B2 | 4/2007 | Radley-Smith |
| 7,453,452 | B2 | 11/2008 | Huitema et al. |
| 7,564,436 | B2 | 7/2009 | Huitema et al. |
| 7,710,370 | B2 * | 5/2010 | Slikkerveer ............... G09F 9/35 345/31 |
| 7,714,801 | B2 | 5/2010 | Kimmel |
| 7,786,951 | B2 | 8/2010 | Huitema et al. |
| 7,787,097 | B2 | 8/2010 | Satoh |
| 7,787,917 | B2 | 8/2010 | Aoki et al. |
| 7,956,820 | B2 | 6/2011 | Huitema et al. |
| 7,965,258 | B2 | 6/2011 | Aoki |
| 8,111,465 | B2 | 2/2012 | Heikenfeld et al. |
| 8,151,501 | B2 | 4/2012 | Bemelmans et al. |
| 8,199,471 | B2 | 6/2012 | Bemelmans et al. |
| 8,358,275 | B2 | 1/2013 | Huitema |
| 8,380,327 | B2 | 2/2013 | Park |
| 8,466,851 | B2 | 6/2013 | Huitema et al. |
| 8,482,909 | B2 | 7/2013 | Douglas |
| 8,502,788 | B2 | 8/2013 | Cho |
| 8,508,920 | B2 | 8/2013 | Huitema et al. |
| 2004/0052044 | A1 | 3/2004 | Mochizuki et al. |
| 2004/0212968 | A1 | 10/2004 | Lin |
| 2005/0110785 | A1 | 5/2005 | Ochiai et al. |
| 2006/0132025 | A1 | 6/2006 | Gao et al. |
| 2006/0204675 | A1 | 9/2006 | Gao et al. |
| 2006/0209218 | A1 | 9/2006 | Lee et al. |
| 2006/0238494 | A1 | 10/2006 | Narayanaswami et al. |
| 2006/0262098 | A1 | 11/2006 | Okamoto |
| 2006/0273304 | A1 | 12/2006 | Cok |
| 2007/0195067 | A1 | 8/2007 | Zotov et al. |
| 2007/0205997 | A1 | 9/2007 | Lieshout et al. |
| 2007/0279852 | A1 | 12/2007 | Daniel et al. |
| 2008/0204367 | A1 | 8/2008 | Lafarre et al. |
| 2008/0218369 | A1 | 9/2008 | Krans et al. |
| 2008/0291225 | A1 | 11/2008 | Arneson |
| 2009/0219225 | A1 | 9/2009 | Cope |
| 2009/0251888 | A1 | 10/2009 | Douglas |
| 2010/0164973 | A1 | 7/2010 | Huitema et al. |
| 2010/0238612 | A1 | 9/2010 | Hsiao et al. |
| 2010/0295761 | A1 | 11/2010 | Van Lieshout et al. |
| 2011/0043976 | A1 | 2/2011 | Visser et al. |
| 2011/0048619 | A1 | 3/2011 | Meinders et al. |
| 2011/0122593 | A1 | 5/2011 | Van Lieshout et al. |
| 2011/0128260 | A1 | 6/2011 | Huitema et al. |
| 2011/0148797 | A1 | 6/2011 | Huitema et al. |
| 2011/0187681 | A1 | 8/2011 | Kim et al. |
| 2011/0227855 | A1 | 9/2011 | Kim et al. |
| 2012/0007796 | A1 | 1/2012 | Jokinen et al. |
| 2012/0194448 | A1 | 8/2012 | Rothkopf |
| 2012/0212433 | A1 | 8/2012 | Lee et al. |
| 2012/0264489 | A1 | 10/2012 | Choi et al. |
| 2012/0283799 | A1 | 11/2012 | Fan |
| 2012/0314546 | A1 | 12/2012 | Brewer et al. |
| 2013/0010405 | A1 | 1/2013 | Rothkopf et al. |
| 2013/0025647 | A1 | 1/2013 | Bouten et al. |
| 2013/0027853 | A1 | 1/2013 | Chen et al. |
| 2013/0044215 | A1 | 2/2013 | Rothkopf et al. |
| 2013/0058063 | A1 | 3/2013 | O'Brien |
| 2013/0070431 | A1 | 3/2013 | Fukuma et al. |
| 2013/0076612 | A1 | 3/2013 | Myers |
| 2013/0076649 | A1 | 3/2013 | Myers et al. |
| 2013/0083496 | A1 | 4/2013 | Franklin et al. |
| 2013/0113761 | A1 | 5/2013 | van Lieshout et al. |
| 2013/0120106 | A1 | 5/2013 | Cauwels et al. |
| 2013/0127690 | A1 | 5/2013 | Tsai |
| 2013/0128439 | A1 | 5/2013 | Walters et al. |
| 2013/0131887 | A1 | 5/2013 | Park |
| 2013/0141405 | A1 | 6/2013 | Huitema et al. |
| 2013/0172068 | A1 | 7/2013 | Zhou et al. |
| 2013/0197680 | A1 | 8/2013 | Cobbett et al. |
| 2013/0222270 | A1 | 8/2013 | Winkler et al. |
| 2013/0235008 | A1 | 9/2013 | Kwon |
| 2013/0265257 | A1 | 10/2013 | Jung et al. |
| 2013/0326790 | A1 | 12/2013 | Cauwels et al. |
| 2013/0335929 | A1 | 12/2013 | Cavallaro |
| 2014/0042406 | A1 | 2/2014 | Degner et al. |
| 2014/0123436 | A1 | 5/2014 | Griffin et al. |
| 2014/0138637 | A1 | 5/2014 | Yang et al. |
| 2014/0226275 | A1 | 8/2014 | Ko et al. |
| 2014/0257050 | A1 | 9/2014 | Kuroda et al. |
| 2015/0227245 | A1 | 8/2015 | Inagaki et al. |

FOREIGN PATENT DOCUMENTS

| | | |
|---|---|---|
| DE | 202006012076 U1 | 10/2006 |
| EP | 1599110 A1 | 11/2005 |
| EP | 2551110 A1 | 1/2013 |
| FR | 2284149 A1 | 4/1976 |
| KR | 1256109 | 4/2013 |
| KR | 1278604 | 6/2013 |
| KR | 1301561 | 9/2013 |
| KR | 20150035232 A | 4/2015 |
| TW | M258364 U | 3/2005 |
| TW | M265636 U | 5/2005 |
| TW | 200815886 A | 4/2008 |
| WO | WO-2006/027727 A1 | 3/2006 |
| WO | WO-2006/085271 A2 | 8/2006 |
| WO | WO-2007/023406 A2 | 3/2007 |
| WO | WO-2007/042987 A1 | 4/2007 |
| WO | WO-2008/054206 A2 | 5/2008 |
| WO | WO-2012/156804 A1 | 11/2012 |

OTHER PUBLICATIONS

"3M Flexible Transparent Touchscreen Concepts" video located on the Internet at <http://www.youtube.com/watch?v=kCZz4jFok_o> (uploaded Jan. 6, 2011).

"Amazin Concept Holo Computer Elodie Delassus", Art, Concepts, Design, Gadgets, downloaded from the Internet at: <http://designskings.com/amazin-concept-holo-computer-elodie-delassus/> (Jan. 18, 2012).

"Athletics and their supporters", Enlightened®: Illuminated Clothing by Janet Hansen, downloaded from the Internet at <http://enlighted.com/pages/athletics.shtml> (Aug. 8, 2013).

"E-Clock", Tokyoflash Japn Product Design Studio, downloaded from the Internet at <http://blog.tokyoflash.com/2010/03/e-clock/> (Mar. 10, 2010).

"Features", SEG Sports Entertainment Gear, downloaded from the Internet at <http://www.segshirts.com/features> (Aug. 8, 2013).

"Flex Mobile, a Flexible Phone That Becomes a Bracelet, Some Other Wearable Piece of Gear", Concept Phones, downloaded from the Internet at <http://www.concept-phones.com/tag/carolina-rebelo/> (Apr. 19, 2011).

"Flexible Smart Phone Fluid Presented by Philips", YouTube, downloaded from the Internet at <http://www.youtube.com/watch?v=Wq9montNgbM&feature=player_detailpage> (Apr. 2, 2012).

"iPING Putter App Cradle Attachment Case for iPhone 5", Carlsbad Golf Center, downloaded from the Internet at <https://www.cgcgolfshop.com/p-50-iping-putter-app-cradle-attachment-case-for-iphone-5.aspx> (Aug. 8, 2013).

"Moment Smartwatch: World's First Wrap Around Smart Watch," Momentum Labs LLC, 28 pp. (Jun. 24, 2014).

"outEDGE iPhone 5 External 2800 mAH Battery Extender Case w/ Flip Screen Cover", outEDGEPOWER Products, downloaded from the Internet at <http://www.outedgepower.com/outedge-iphone-5-external-2800-mah-battery-extender-case-w-flip-screen-cover/> (Aug. 8, 2013).

"Philips unveils world's first 'Rollable Display' pocket e-Reader concept READIUS", Phys.org website(Sep. 1, 2005).

"Rohm shows a flexible-OLED wristband", OLED-Info.com, downloaded from the Internet at <http://www.oled-info.com/rohm-shows-flexible-oled-wristband> (Oct. 5, 2009).

"Samsung concept video for wearables and phones", YouTube screenshot, downloaded from the Internet at <http://www.youtube.com/watch?v=ezriwGwJGOs> (Jul. 15, 2013).

(56) References Cited

OTHER PUBLICATIONS

"Samsung Galaxy X Concept Packs the Same Specs of teh Galaxy S II Plus a 12 MP Camera", Concept Phones website (May 15, 2011).
"Samsung Smart Watch Trademarks Filed, Wearable Internet Nearing Debut", Fox News Latino, downloaded from the Internet at <http://latino.foxnews.com/latino/money/2013/08/07/samsung-smart-watch-trademarks-filed-wearable-internet-nearing-debut/> (Aug. 7, 2013).
"Sony Smartwatch 2 goes official: water-resistant, open API", phoneArena.com, downloaded from the Internet at <http://www.phonearena.com/news/Sony-Smartwatch-2-goes-official-water-resistant-open-API_id44469> (Jun. 25, 2013).
"Taiwan Company to Begin Production of Large Format Flexible Electronic Paper Display Technology", Over the Wire, downloaded from the Internet at <http://www.naylornetwork.com/ppi-otw/articles/?aid=219054&issueID=29119> (Aug. 8, 2013).
"Thermal Image Athletic Apparel", Trendhunter Lifestyle, downloaded from the Internet at <http://www.trendhunter.com/trends/high-tech-athletic-apparel> (Mar. 16, 2013).
"Wearable Concept Phone is Not Nokia 888", Concept Phones, downloaded from the Internet at <http://www.concept-phones.com/tag/hyun-sung-lee/> (Jul. 18, 2008).
"What Will You Pop?", popSLATE, downloaded from the Internet at <http://www.popslate.com> (2012).
"Yuno Concept", TechPin, downloaded from the Internet at <http://www.techpin.com/yuno-concept/> (May 8, 2008).
Catacchio, "New OLED panel to bring bendable cell phones closer to reality?", TNW, downloaded from the Internet at <http://thenextweb.com/asia/2010/10/04/new-oled-panel-to-bring-bendable-cell-phones-closer-to-reality/> (Oct. 4, 2010).
Cochrane et al., "Flexible displays for smart clothing: Part I—Overview", Indian Journal of Fibre & Textile Research, 36:422-8 (Dec. 2011).
Cooper, "Hands-on with Polymer Vision's e-ink Readius", engadget, downloaded from the Internet at <http://www.engadget.com/2008/02/14/hands-on-with-polymer-visions-e-ink-readius/> (Feb. 14, 2008).
Crisp, "Rafael Nadal demonstrates Babolat Play & Connect interactive tennis racquet", gizmag, downloaded from the Internet at <http://www.gizmag.com/rafael-nadal-demonstrates-babolat-play-connect-interactive-tennis-racquet/22699/> (May 26, 2012).
Eaton, "Nokia Morph Cellphone Rolls Up, Stretches, Cleans Itself", GIZMODO, downloaded from the Internet at <http://gizmodo.com/360260/nokia-morph-cellphone-rolls-up-stretches-cleans-itself> (Feb. 25, 2008).
Fingas, "Tentative Samsung smartwatch design unearthed in Korean patents", engadget, downloaded from the Internet at <http://www.engadget.com/2013/08/03/tentative-samsung-smartwatch-designs-unearthed-in-korean-patents/> (Aug. 3, 2013).
Honig, "Pebble smartwatch review", engadget, downloaded from the Internet at <http://www.engadget.com/2013/01/25/pebble-smartwatch-review/> (Jan. 25, 2013).
Inofuentes, "Officially announced: LG G Flex and a healing factor", ars technica, downloaded from the Internet at <http://arstechnica.com/gadgets/2013/10/officially-announced-lg-g-flex-and-a-healing-factor/> (Oct. 28, 2013).
International Search Report and Written Opinion, International Application No. PCT/US14/72172, mailed Mar. 18, 2015.
International Search Report and Written Opinion, International Application No. PCT/US2014/072313, mailed Apr. 22, 2015.
International Search Report and Written Opinion, International Application No. PCT/US2014/072328, dated Apr. 22, 2015.
Johan, "ASUS Waveface Ultra", techfresh.net, downloaded from the Internet at <http://www.techfresh.net/asus-waveface-ultra/> (Jan. 19, 2010).
Kahn, "Is Apple's iWatch a slap wrist band with a flexible display?", 9to5Mac Apple Intelligence, downloaded from the Internet at <http://9to5mac.com/2013/02/21/is-apples-iwatch-a-slap-wrist-band-with-a-flexible-display/> (Feb. 21, 2013).
Kaki, "10 Beautiful Nokia Concept Phones for Future Generations", DreamsRain website, downloaded from the Internet at <http://www.dreamsrain.com/2011/09/18/10-beautiful-nokia-concept-phones-for-future-genrations/> (Sep. 18, 2011).
Kelvin, "Apple iBand Envisioned by T3: Health Features, Fitness and Watch Functions (Video)", Concept Phones, downloaded from the Internet at <http://www.concept-phones.com/apple/apple-iband-envisioned-t3-health-features-fitness-watch-functions-video/> (Feb. 18, 2014).
Kelvin, "Apple iWatch 2 Concept by Jermaine Smit Lets You Change the Watch Bracelet Easily (Video)", Concept Phones, downloaded from the Internet at <http://www.concept-phones.com/apple/apple-iwatch-2-concept-jermaine-smit-lets-change-watch-bracelet-easily-video/> (Mar. 5, 2014).
Kelvin, "Apple iWatch Concept Goes Back to Basics, Looks Like Nike Fuelband", Concept Phones, downloaded from the Internet at <http://www.concept-phones.com/apple/apple-iwatch-concept-basics-nike-fuelband/> (Oct. 22, 2013).
Kelvin, "Apple iWatch Glass Hologram is an Overpowered Smartwatch (Video)", Concept Phones, downloaded from the Internet at <http://www.concept-phones.com/apple/apple-iwatch-glass-hologram-overpowered-smartwatch-video/> (Apr. 19, 2014).
Kelvin, "Apple iWatch Goes Back to the Idea of an iPod Nano With a Belt", Concept Phones, downloaded from the Internet at <http://www.concept-phones.com/apple/apple-iwatch-idea-ipod-nano-belt> (Mar. 2, 2014).
Kelvin, "Finally, a HTC Smartwatch! We Needed Those!", Concept Phones, downloaded from the Internet at <http://www.concept-phones.com/htc/finally-htc-smartwatch-needed/> (Feb. 4, 2014).
Kelvin, "Flexible Screen X Phone Becomes a Bracelet", Concept Phones, downloaded from the Internet at <http://www.concept-phones.com/cool-concepts/flexible-screen-phone-bracelet/> (Oct. 28, 2013).
Kelvin, "HTC One Watch Render Seems Taken out of Tron", Concept Phones, downloaded from the Internet at <http://www.concept-phones.com/htc/htc-watch-render-tron/> (Oct. 14, 2013).
Kelvin, "iPhone 6 and iWatch Pro Get Designed by Dani Yako", Concept Phones, downloaded from the Internet at <http://www.concept-phones.com/apple/iphone-6-iwatch-pro-designed-dani-yako/> (Jun. 6, 2014).
Kelvin, "iWatch Concept is a Curved Bracelet, Runs Flappy Bird", Concept Phones, downloaded from the Internet at <http://www.concept-phones.com/apple/iwatch-concept-curved-bracelet-runs-flappy-bird/> ( Feb. 13, 2014).
Kelvin, "iWatch Goliath is a Giant on Your Wrist (Video)", Concept Phones, downloaded from the Internet at <http://www.concept-phones.com/apple/iwatch-goliath-giant-wrist-video/> (May 23, 2014).
Kelvin, "iWatch Render Goes the Way of the Nike FuelBand", Concept Phones, downloaded from the Internet at <http://www.concept-phones.com/apple/iwatch-render-nike-fuelband/> (Jan. 21, 2014).
Kelvin, "Meizu MWatch Render is Exactly What Smartwatches Need", Concept Phones, downloaded from the Internet at <http://www.concept-phones.com/cool-concepts/meizu-mwatch-render-smartwatches/> (Feb. 12, 2014).
Kelvin, "MWC 2014: Kyocera Showcases Flexible Phone That Turns Into Bracelet", Concept Phones, downloaded from the Internet at <http://www.concept-phones.com/kyocera/mwc-2014-kyocera-showcases-flexible-phone-turns-bracelet/> (Feb. 27, 2014).
Kelvin, "New Apple iWatch Render Shows us an Ultrathin Bracelet", Concept Phones, downloaded from the Internet at <http://www.concept-phones.com/apple/apple-iwatch-render-shows-ultrathin-bracelet/> (Oct. 16, 2013).
Kelvin, "New iWatch Design Brings Us Back the Basics of a Watch", Concept Phones, downloaded from the Internet at <http://www.concept-phones.com/apple/iwatch-design-brings-basics-watch/> (Apr. 29, 2014).
Kelvin, "Nokia Lumia 101 Smartwatch is a Nice Little, Elegant Bracelet", Concept Phones, downloaded from the Internet at <http://www.concept-phones.com/nokia/nokia-lumia-101-smartwatch-nice-elegant-bracelet/> (Dec. 3, 2013).

(56) References Cited

OTHER PUBLICATIONS

Kelvin, "Superb Google Smartwatch Render Created in Cinema 4D", Concept Phones, downloaded from the Internet at <http://www.concept-phones.com/google/superb-google-smartwatch-render-created-cinema-4d/> (Jan. 31, 2014).
Kim, "Analysis of iWatch-related Patents from RitFast", IHS Technology, downloaded from the Internet at <http://www.displaybank.com/letter/letter_contents.php?nm=&email-prakash%40polyera.com&mail_id=8995> (Jul. 19, 2013).
Lilienthal, "Book? Accordian? Nope. Lumino is a Gorgeous LED Lamp the Goes Wherever You Do," Digital Trends, 6 pp. (Apr. 27, 2014).
Rastogi, "Nokia Lumia 1080: The Concept Phone", 91 mobiles, downloaded from the Internet at <http://www.91mobiles.com/blog/nokia-lumia-1080-the-concept-phone.html> (Jun. 27, 2013).
Ridden, "Emopulse Smile SmartWatch goes up for pre-order", Gizmag, downloaded from the Internet at <http://www.gizmag.com/emopulse-smile-smartwatch/27984/> (Jun. 19, 2013).
Seth, "In 2020 We Can Wear Sony Computers on Our Wrist", Yanko Design Form Beyond Function, downloaded from the Internet at <http://www.yankodesign.com/2010/05/25/in-2020-we-can-wear-sony-computers-on-our-wrist/> (May 25, 2010).
Seth, "Love This iWatch!", Yanko Design Form Beyond Function, downloaded from the Internet at <http://www.yankodesign.com/2013/07/26/love-this-iwatch/> (Jul. 26, 2013).
Seth, "My Latest Fashion Accessory", Yanko Design Form Beyond Function, downloaded from the Internet at <http://www.yankodesign.com/2009/08/11/my-latest-fashion-accessory/> (Aug. 11, 2009).
Seth, "Super Sexy Roll", Yanko Design Form Beyond Function, downloaded from the Internet at <http://www.yankodesign.com/2011/03/21/super-sexy-roll/> (Mar. 21, 2011).
Smith, "Flexi E Ink screen finds home in curved world time watch", The Register, downloaded from the Internet at <http://www.theregister.co.uk/2010/10/11/phosphor_watches_world_time/> (Oct. 11, 2010).
Smith, "Samsung smartwatch concept shown in patent hints at flexible display use", Android Authority (Aug. 3, 2013).
Smith, "Samsung's curved smartphone is the Galaxy Round, launches in Korea tomorrow (video)", engadget, downloaded from the Internet at <http://www.engadget.com/2013/10/08/samsung-galaxy-round/> (Oct. 8, 2013).
Thrystan, "Apple iWatch 2 Design Appears, More Elegant Than Ever", Concept Phones, downloaded from the Internet at <http://www.concept-phones.com/apple/apple-iwatch-2-design-appears-elegant/> (Feb. 9, 2012).
Thrystan, "BenQ Siemens Snake Concept Phone is Yet Another Bracelet-Handset", Concept Phones, downloaded from the Internet at <http://www.concept-phones.com/benq-siemens/benq-siemens-snake-concept-phone-bracelethandset/> (Feb. 9, 2009).
Thrystan, "Bracelet Phone Concept Incorporates an MP3 Player, Shines Like a Diamond", Concept Phones, downloaded from the Internet at <http://www.concept-phones.com/fashion-phones/bracelet-phone-concept-incorporates-mp3-player-shines-diamond/> (Sep. 8, 2008).
Thrystan, "CEATEC 2010 Hosts TDK's Flexible OLED Displays; Hands-on Photos Here!", Concept Phones, downloaded from the Internet at <http://www.concept-phones.com/news/ceatec-2010-hosts-tdks-flexible-oled-displays-handson-photos/> (Oct. 5, 2010).
Thrystan, "Dyson Concept Phone Charger Turns Temperature Differences Into Electricity", Concept Phones, downloaded from the Internet at <http://www.concept-phones.com/cool-concepts/dyson-concept-phone-charger-turns-temperature-differences-electricity/> (Jul. 24, 2009).
Thrystan, "Email Beeper Watch is Hip, Restarts a Trend", Concept Phones, downloaded from the Internet <http://www.concept-phones.com/cool-concepts/email-beeper-watch-hip-restarts-trend/> (Mar. 3, 2009).
Thrystan, "Flux, Portable and Wearable PC Concept", Concept Phones, downloaded from the Internet at <http://www.concept-phones.com/eco-friendly/flux-portable-and-wearable-pc-concept/> (May 5, 2008).
Thrystan, "Fujitsu Concept Phones Part 2: Judge-Dredd-Like Curvy Handset", Concept Phones, downloaded from the Internet <http://www.concept-phones.com/fujitsu/fujitsu-concept-phones-part-2-judgedreddlike-curvy-handset/> (Oct. 10, 2009).
Thrystan, "iPhone 5 Bracelet Looks Out of this World", Concept Phones, downloaded from the Internet at <http://www.concept-phones.com/apple/iphone-5-bracelet-world/> (Jul. 6, 2012).
Thrystan, "iPhone Holographic Display Concept is Surreal, Could Work", Concept Phones, downloaded from the Internet at <http://www.concept-phones.com/apple/iphone-holographic-display-concept-surreal-work/> (Aug. 22, 2009).
Thrystan, "iWatch Design Created by James Ivaldi is All Metal", Concept Phones, downloaded from the Internet at <http://www.concept-phones.com/apple/iwatch-design-created-james-ivaldi-metal/> (Jul. 29, 2013).
Thrystan, "iWatch Render in the Vision of the Ciccarese Design Team: Simply Stunning (Video)", Concept Phones, downloaded from the Internet at <http://www.concept-phones.com/apple/iwatch-render-vision-ciccarese-design-team-simply-stunning-video/> (Aug. 21, 2013).
Thrystan, "Leaf Phone Features an Organic Structure, is Made of Eco-Friendly Plastic," Concept Phones, downloaded from the Internet at <http://www.concept-phones.com/eco-friendly/leaf-phone-features-organic-structure-ecofriendly-plastic/> (Nov. 4, 2009).
Thrystan, "LG Auki Bracelet Phone Is Colorful and Elegant", Concept Phones, downloaded from the Internet at <http://www.concept-phones.com/lg/lg-auki-bracelet-phone-colorful-elegant/> (Aug. 26, 2011).
Thrystan, "LG Helix Cellphone is Also a Slap Bracelet", Concept Phones, downloaded from the Internet at <http://www.concept-phones.com/lg/lg-helix-cellphone-slap-bracelet/> (Oct. 9, 2009).
Thrystan, "LG Oyster, a Bracelet-Like Mobile Phone Design", Concept Phones, downloaded from the Internet at <http://www.concept-phones.com/lg/lg-oyster-braceletlike-mobile-phone-design/> (Jul. 26, 2009).
Thrystan, "New iWatch Render by Tolga Tuncer is Fancy and Classy", Concept Phones, downloaded from the Internet at <http://www.concept-phones.com/apple/iwatch-render-tolga-tuncer-fancy-classy/> (Mar. 3, 2013).
Thrystan, "Nokia Mixed Reality Concept, Future Technology Demoed at Nokia World (Video)", Concept Phones, downloaded from the Internet at <http://www.concept-phones.com/nokia/nokia-mixed-reality-concept-future-technology-demoed-nokia-world-video/> (Sep. 9, 2009).
Thrystan, "Nokia Open Bracelet Shows Incoming Calls of the Ones You Love", Concept Phones, downloaded from the Internet at <http://www.concept-phones.com/nokia/nokia-open-bracelet-shows-incoming-calls-love/> (Dec. 13, 2008).
Thrystan, "Nokia Smart Watch Concept Looks Interesting", Concept Phones, downloaded from the Internet at <http://www.concept-phones.com/uncategorized/nokia-smart-watch-concept-interesting/> (Oct. 22, 2011).
Thrystan, "Purse Bracelet Fancy Concept Phone, Designed by Yw Li", Concept Phones, downloaded from the Internet at <http://www.concept-phones.com/fashion-phones/purse-bracelet-fancy-concept-phone-designed-yw-li/> (Oct. 19, 2008).
Thrystan, "Quartz Tele Concept Should be in a Final Fantasy Game, Because Its All About Crystals", Concept Phones, downloaded from the Internet at <http://www.concept-phones.com/fashion-phones/quartz-tele-concept-final-fantasy-game-crystals/> (Sep. 8, 2008).
Thrystan, "Samsung Finger Touching Cellphone Concept Comes in Handy", Concept Phones, downloaded from the Internet at <http://www.concept-phones.com/samsung/samsung-finger-touching-cellphone-concept-handy/> (Jan. 31, 2009).
Thrystan, "Samsung Futuristic Technology Relies on Health and Flexibility (Video)", Concept Phones, downloaded from the Internet at <http://www.concept-phones.com/samsung/samsung-futuristic-technology-relies-health-flexibility-video/> (Jul. 10, 2013).

(56) References Cited

OTHER PUBLICATIONS

Thrystan, "Samsung S-Health Bracelet Render is Based on Tizen OS", Concept Phones, downloaded from the Internet at <http://www.concept-phones.com/samsung/samsung-shealth-bracelet-render-based-tizen-os/> (Jun. 17, 2013).

Thrystan, "Sony Ericsson Bracelet Phone, a Design That Won't Make It Into Production", Concept Phones, downloaded from the Internet at <http://www.concept-phones.com/sony-ericsson/sony-ericsson-bracelet-phone-design-production/> (Jun. 19, 2009).

Thrystan, "Sony Ericsson Ring Phone Concept by Tao Ma Will Always Be a Winner", Concept Phones, downloaded from the Internet at <http://www.concept-phones.com/sony-ericsson/sony-ericsson-ring-phone-concept-tao-ma-winner/> (Sep. 15 2008).

Thrystan, "Speak to Me Concept Watch Phone is Hot, a Must-Have Fashion Accessory", Concept Phones, downloaded from the Internet at <http://www.concept-phones.com/fashion-phones/speak-concept-watch-phone-hot-musthave-fashion-accessory/> (Jan. 27, 2009).

Thrystan, "The Hook Bracelet Phone Concept Runs Windows Phone in a New Format", Concept Phones, downloaded from the Internet at <http://www.concept-phones.com/cool-concepts/hook-bracelet-phone-concept-runs-windows-phone-format/> (Jun. 21, 2013).

Thrystan, "The New iPod is iBangle . . . iLike iT", Concept Phones, downloaded from the Internet at <http://www.concept-phones.com/apple/ipod-ibangle-ilike/> (Oct. 23, 2008).

Thrystan, "Xbox 720 Concept is a Pyramid With Two Kinect "Eyes"", Concept Phones, downloaded from the Internet at <http://www.concept-phones.com/microsoft/xbox-720-concept-pyramid-kinect-eyes/> (Jul. 8, 2013).

Thrystan, "Yuxa is a Wearable Cellphone Made From Eco-Friendly Materials", Concept Phones, downloaded from the Internet at <http://www.concept-phones.com/eco-friendly/yuxa-wearable-cellphone-ecofriendly-materials/> (Jun. 24, 2010).

Thrystan, "ZTE Cube Phone, Another Mobile World Congress Concept", Concept Phones, downloaded from the Internet at <http://www.concept-phones.com/cool-concepts/zte-cube-phone-another-mobile-world-congress-concept/> (Feb. 14, 2008).

Vertegaal et al., "Organic User Interfaces have non-planar displays that may actively or passively change shape via analog physical inputs", Organic User Interfaces—Communications of the ACM (May 31, 2008).

Wei et al., Shape memory materials and hybrid composites for smart systems, Part II: Shape-memory hybrid composites, J. Mater. Sci., 33:3763-83 (1998).

\* cited by examiner

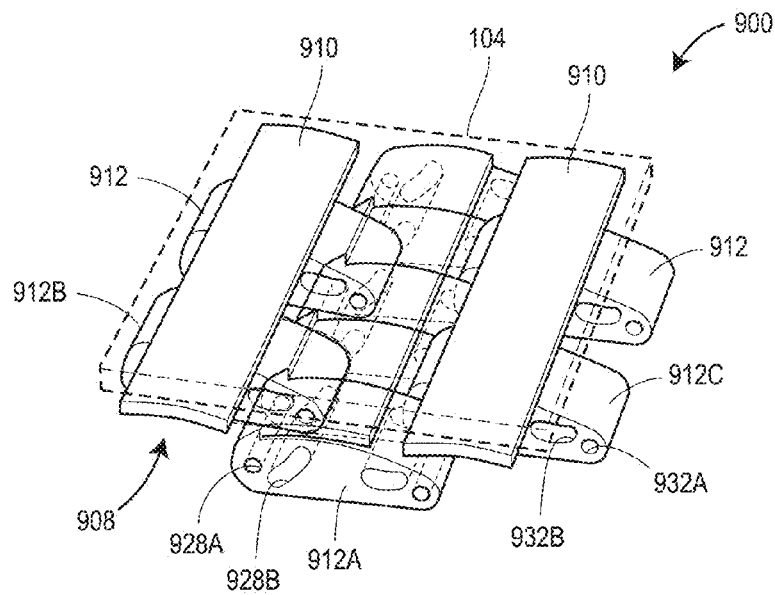
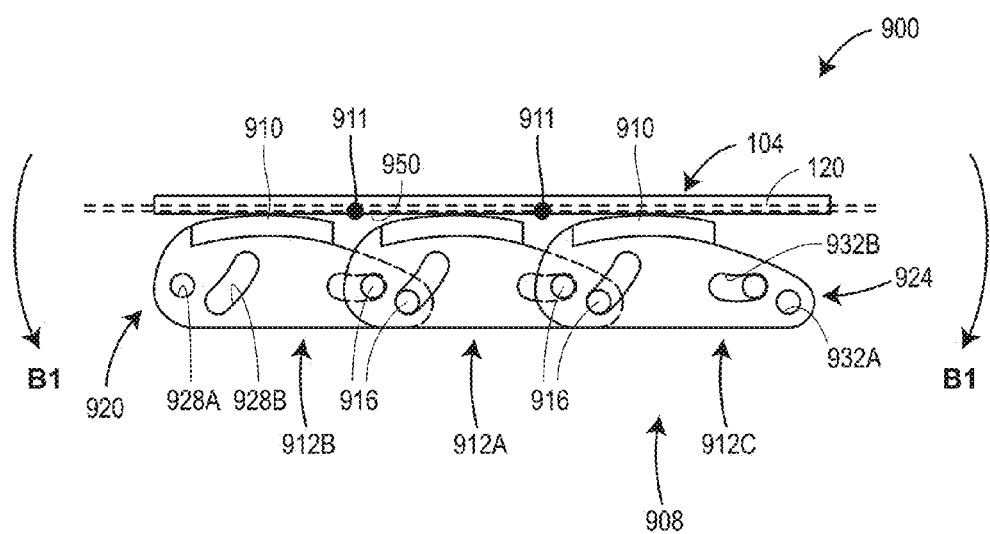
FIG. 8A
FIG. 8B

SUPPORT STRUCTURES FOR A FLEXIBLE ELECTRONIC COMPONENT

RELATED APPLICATIONS

This application is a continuation of International Patent No. PCT/US14/72328 filed Dec. 24, 2014, which claims priority to and the benefit of the filing dates of U.S. Provisional Patent Application Ser. No. 61/920,705, entitled "Dynamically Flexible, Attachable Device Having an Integral Flexible Display" and filed on Dec. 24, 2013 (Ref. No.: 32187-48118P); U.S. Provisional Patent Application Ser. No. 61/946,412, entitled "Support Structure for a Flexible Electronic Component" and filed Feb. 28, 2014; U.S. Patent Provisional Application Ser. No. 62/006,714, entitled "Attachable, Two-Dimensional Flexible Electronic Device," which was filed on Jun. 2, 2014 (Ref. No.: 32187-48483P); U.S. Provisional Patent Application Ser. No. 62/095,231, entitled "Support Structures for a Flexible Electronic Component," and filed Dec. 22, 2014 (Ref. No.: 32187-47980P1). The entire disclosure of each of these applications is hereby expressly incorporated by reference herein for all uses and purposes.

TECHNICAL FIELD

This patent application relates generally to flexible electronic components, and more particularly to a support structure for dynamically flexible electronic components, such as flexible OLED lighting, collapsible e-readers, roll-out screens, or displays incorporated into or disposed on articles that are easily attachable to other items, such as arms, mugs, shoes, belts, coffee cups, phones, computers, etc.

BACKGROUND

A flexible electronic component, such as a flexible electronic circuit, a sensor tag, a flexible OLED light or a display, is a multi-layered stack typically formed of both brittle and organic layers. In some cases, the flexible electronic component may include built-in strains that exist in one or more layers of the component due to the processing conditions of the component (e.g., temperature induced strain). In any case, as a flexible electronic component is typically produced on a flat surface, a curvature or bending of the flexible electronic component creates a certain strain profile in the layers of the component. The strain profile created by the curvature of bending of the component, as well as any built-in strains that may exist within the component, may, in turn, cause one or more of the layers of the flexible electronic component to buckle, crack, or otherwise become damaged. The organic layers in a flexible electronic component can typically withstand strains up to 8% before breaking or deforming in a non-elastic way. The brittle, inorganic layers in a flexible electronic component can, however, only typically withstand strains of approximately 1% before buckling or cracking, depending of course on the processing conditions of the component. As such, the brittle layers of the flexible electronic component generally buckle or crack first in response to excess strain.

When a flexible electronic component is bent or curved, the outer radius of the component will be under tension, while the inner radius will be under compression. At some point in the layer stack of the component, the neutral plane, where there is no tension or compression upon bending, can be found. The layer stacking, the layer thickness, and the layer properties, such as the Young's modulus, determine the position of the neutral plane; for a symmetrical stack of layers the neutral plane is generally located near a middle of the stack. Based on the exact location of the neutral plane and the maximum tolerable strain value (e.g., 1%), the minimum bending radius can be determined for each of the layers in the component. Because, as noted above, the brittle, inorganic layers in the component can typically withstand less strain than the organic layers, the brittle layers typically have a greater minimum bending radius than the organic layers. In turn, the greater minimum bending radius of these brittle layers governs or controls the amount of bending or curvature that the flexible electronic component can undergo before the component is damaged.

To provide support to the flexible electronic component and prevent a user of the flexible electronic component from bending or flexing the display beyond such a minimum bending radius, and, thus, prevent damage to the component, the component can be attached to a mechanical support structure. International Patent Application Publication No. WO 2006/085271, for example, describes attaching a metal leaf spring to a flexible display. The problem with attaching a flexible electronic component to a mechanical support structure, such as, for example, a metal leaf spring, is that the attachment of the mechanical support structure to the component causes the neutral plane to shift from its initial position (in the component) to a position within the mechanical support structure. Because of the relationship between the location of the neutral plane and the minimum bending radius, shifting the neutral plane in this way significantly increases the minimum bending radius of the layers in the component, particularly the brittle layers in the component. In doing so, the mechanical support structure can serve to significantly reduce, if not effectively destroy, the bending or flexing ability of the flexible electronic component.

SUMMARY

The present disclosure is generally directed to an article that includes a flexible electronic component and a flexible support coupled to the flexible electronic component. The flexible electronic component is movable between a first position and a second position. The flexible support is configured to support the flexible electronic component but also limit local bending of the flexible component. The flexible support defines a plurality of hinge points configured to facilitate movement of the article between the first position and the second position. The flexible support is configured to support the flexible electronic component between at least two consecutive pairs of adjacent hinge points. The plurality of hinge points are positioned such that the article has a desired bending range.

BRIEF DESCRIPTION OF THE DRAWINGS

FIGS. 8A and 8B illustrate an example attachable article having a flexible display and a fifth type of flexible support structure coupled to the flexible display.

DETAILED DESCRIPTION

Figure 1:
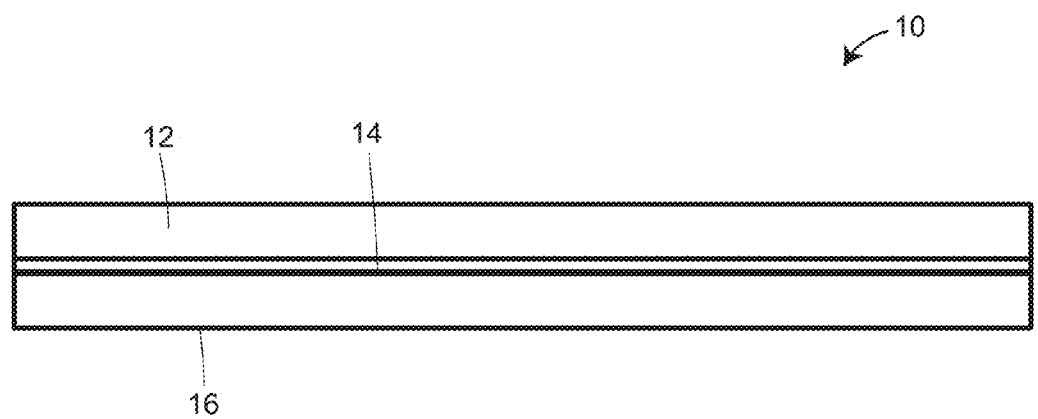
FIG. 1 is a side view of an article having a flexible electronic component, an interlayer coupled to the flexible electronic component, and a flexible support structure coupled to the flexible electronic component via the interlayer, the flexible support structure configured to limit local bending of the flexible electronic component and support the flexible electronic component while also causing the article to have a desired bending range.

FIG. 1 generally depicts a dynamically flexible article or device 10, such as, for example, a wristband, a shoe, a belt, a piece of jewelry, a strip, a lamp, a sticker, a reader, or other flexible electronic device. The article 10 includes a flexible electronic component 12, an interlayer 14, and a flexible support structure 16. The flexible electronic component 12, which can be, for example, a flexible display, a flexible OLED light or lamp, a collapsible e-reader, a roll out screen, a flexible sheet or screen, a sensor tag, an electronic circuit, or other flexible electronic component, is disposed on or coupled to the flexible support structure 16 (via, e.g., the interlayer 14) such that the flexible electronic component 12 is dynamically bendable or conformable to, for example, a user's wrist, arm, or other curved or even flat surface. When, for example, the flexible electronic component 12 is a flexible display, the flexible display is bendable or conformable such that various images can be displayed on the electronic display in a manner that is easily viewable to a user. The dynamically flexible article 10 can, in some cases, be attached to or worn on a user's body (e.g., a user's wrist, a user's arm, etc.), and can bend to fit the various contours or body surfaces on which the flexible electronic component 12 is located. The dynamically flexible article 10 can also be easily attached to other items, such as mugs, cups, computers, phone covers, bike handles, automobile dashboards, stands, etc., that enable the flexible electronic component 12 to be viewed when not being held in the user's hands or on one's body. The electronic flexible component 12 of the attachable article 10 is thus, in many cases, viewable to a user and is capable of being manipulated or actuated by the user without having to be held in one or both of the user's hands, making the flexible electronic component 12 useable while the user is engaged in or performing other activities, such as running, biking, etc. As will be described in greater detail below, the flexible support structure 16 is configured to limit local bending of the flexible electronic component 12 and support the flexible electronic component 12 while, at the same time, causing the article 10 to have a desired bending range (i.e., one that meets product requirements or specifications). As used herein, the phrase "desired bending range" may refer to or encompass a bending range for the entire article 10, a local bending range (i.e., a bending range for or at one or more portions of the article 10), and/or local variations in the bending range (e.g., the bending range can be larger around or near the defined hinge points of the article).

FIGS. 2A-2D illustrate a dynamically flexible, attachable article 100 in the form of a wristband. The article 100 includes a flexible electronic component 104, an interlayer 106, and a flexible support 108. The flexible electronic component 104 is a flexible electronic display that is dynamically bendable or conformable to a surface, object, or device, though in other embodiments the flexible electronic component can be a collapsible e-reader, roll-out screen, OLED light, or other electronic component. The flexible display 104 can be manufactured as any type of flexible display, such as an e-paper display, an organic light-emitting diode (OLED) display, etc., further details of which are described in commonly owned U.S. Provisional Patent Application 61/920,705, filed Dec. 24, 2013 and entitled "Dynamically Flexible, Attachable Device Having an Integral Flexible Display, the disclosure of which is hereby expressly incorporated by reference herein. Once manufactured, the flexible display 104 can be configured for flexing, curving, or bending in an inward direction (i.e., the flexible display 104 has a convex shape) and/or outward direction (i.e., the flexible display 104 has a concave shape). As is known in the art, the flexible display 104 has a minimum bending radius, which is based on the details surrounding the manufacture of the flexible display 104. When the flexible display 104 is flexed, curved, or bent beyond this minimum bending radius, one or more layers of the display 104 can delaminate, buckle, or crack, or otherwise be damaged causing damage to the display 104.

Figure 2A:
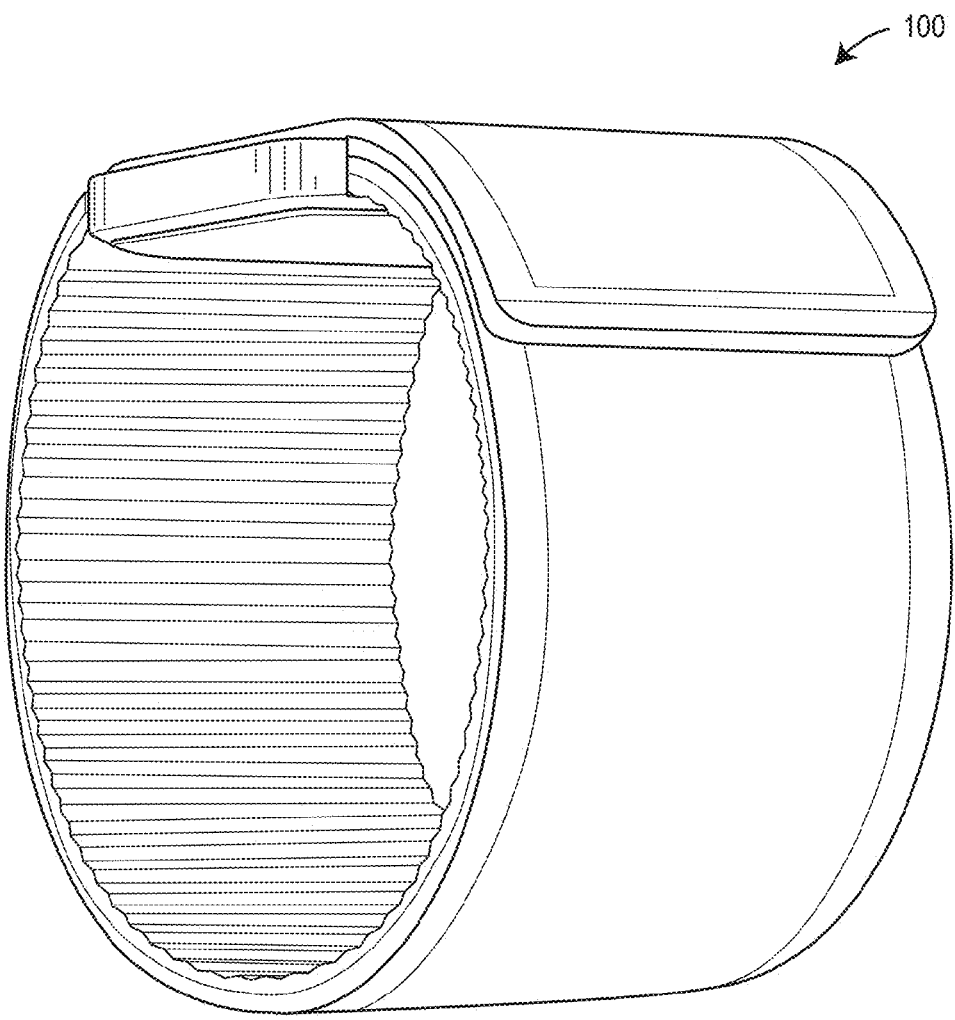
FIG. 2A is a perspective view of an example attachable article, in the form of a wristband, having a first type of flexible electronic component, an interlayer coupled to the flexible electronic component, and a flexible support structure coupled to the flexible electronic component via the interlayer, the flexible support structure is configured to limit local bending of the flexible electronic component and support the flexible electronic component while also causing the article to have a desired bending range.
Figure 2B:
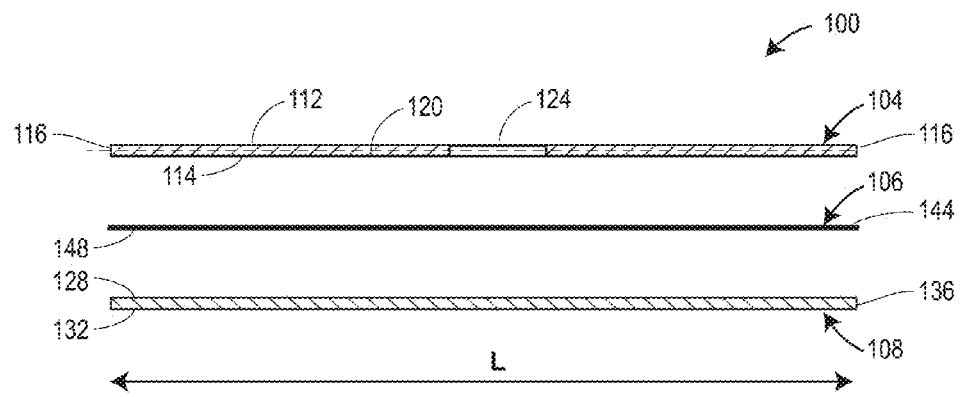
FIG. 2B is an exploded view of the components of the example attachable article generally depicted in FIG. 2A.

As shown in FIG. 2B, the flexible electronic display 104 has a top side 112, a bottom side 114, and a pair of opposing ends 116. The flexible display 104 also has a neutral plane 120, where there is no tension or compression upon bending. In this example, the neutral plane 120 of the display 104 is located approximately halfway between the top side 112 and the bottom side 114. Thus, when the flexible display 104 is flexed, curved, or bent, points above or below the neutral plane 120 will be subject to tension or compression, while points that lie in or along the neutral plane 120 will not experience any tension or compression. In other examples, the neutral plane 120 of the display 104 can be located elsewhere, e.g., closer to the top side 112, due to, for example, a top substrate that is much thicker than the other layers in the display 104.

The electronic display 104 also includes an electronics module 124 that is disposed between the ends 116 and holds electronics, such as processors, memories, sensors, batteries, display drivers, etc. that are used to power and drive the flexible display 104 and to provide other communication functionality for the device 100. It will be appreciated that the electronics module 124 can be positioned elsewhere in other examples, such as, for example, disposed on the flexible display 104. If desired, the components of the electronics module 124 can be sealed or otherwise protected from water, air, dirt, etc. to which the exterior of the device 100 is exposed. For example, any or all of these electronic components may be encapsulated in a hermetically sealed manner to prevent any direct exposure of these components to exterior forces and environmental hazards.

To prevent the flexible display 104 from being bent or curved beyond its minimum bending radius, the article 100 includes the flexible support 108, which is coupled to the flexible display 104. The flexible support 108 is configured to limit local bending of the flexible display 104 beyond its minimum bending radius. The flexible support 108 can limit local bending of the flexible display 104 in one direction (e.g., an inward or an outward direction) or in both directions (i.e., an inward and outward direction).

As shown in FIG. 2B, the flexible support 108 has a top side 128, a bottom side 132, a pair of opposing ends 136, and a length L measured from one end 136 to the other end 136. The stiffness of the flexible support 108 can vary, depending on the material(s) used to manufacture the flexible support 108 and/or the thickness of the flexible support 108. As one of ordinary skill in the art will appreciate, different materials have different Young's moduli. The flexible support 108 can, for example, be made of a bendable metal (e.g., brass, aluminum, copper, steel, tin, nickel), which tends to have a higher Young's modulus, or a plastic, rubber, foam, a visco-elastic material, or other suitably flexible material, which may have a lower Young's modulus than the bendable metal. Alternatively, the support 108 can be made of rigid parts (e.g. thicker plastic, metal) that can hinge with respect to each other.

As shown in FIG. 2B, the interlayer 106 has a top side 144 and a bottom side 148. The interlayer 106 can be or include one or more un-patterned and/or patterned layers, such as, for example, one or more layers of foam (e.g., PORON® urethane foam), rubber, visco-elastic, adhesive, other suitable material(s), or combinations thereof.

Figure 2C:
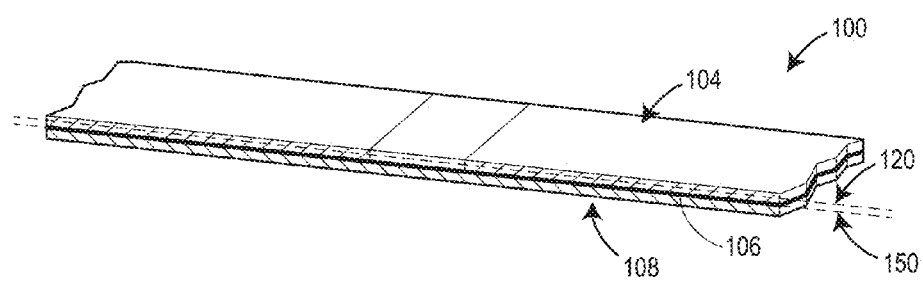
FIG. 2C is a perspective view of the components illustrated in FIG. 2B, as assembled to form the attachable article.
Figure 2D:
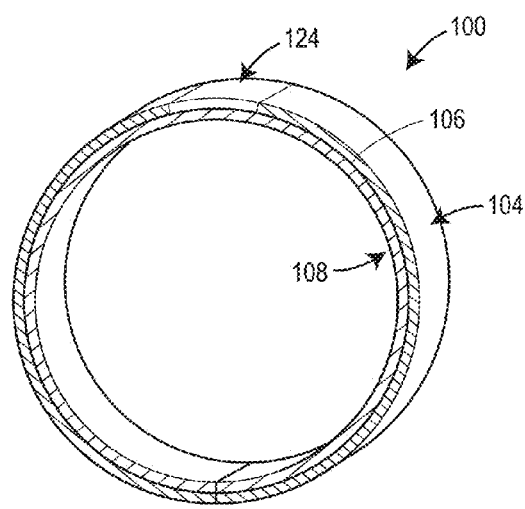
FIG. 2D illustrates the attachable article shown in FIGS. 2A-2C bent or curved in an outward direction.

The article 100 can also include a connection structure that functions to connect the ends 136 of the flexible support 108 together when the article 100 is bent, as illustrated in FIG. 2D, to form a circular or oval band. In some embodiments, the connection structure can be a magnetically-based connection structure, such as, for example, a connection structure in the form of magnets disposed within the flexible support 108 at or proximate to the ends 136, magnets disposed at the ends 136 so that the ends 136 connect end-to-end, or magnets disposed on the top or bottom sides 128, 132 at or proximate to the ends 136 so that the article 100 can be folded around on itself so as to create an article of variable length. One or more mechanical connectors (e.g., buckles, snap components, clasps, cooperating grooves and projections, cooperating tabs and recesses), any desired hook and loop connection material (e.g., Velcro), or some other connection means can be used instead of or in addition to the magnetically-based connection structure. These and other connection structures are described in further detail in commonly owned U.S. Provisional Patent Application 61/920,705, filed Dec. 24, 2013 and entitled "Dynamically Flexible, Attachable Device Having an Integral Flexible Display, the disclosure of which is hereby expressly incorporated by reference herein.

As shown in FIG. 2C, the interlayer 106 is disposed between the flexible display 104 and the flexible support 108. Specifically, the top side 144 of the inter layer 106 is coupled (e.g., attached, adhered) to the bottom side 114 of the display 104, and the top side 128 of the flexible support 108 is coupled (e.g., attached, adhered) to the bottom side 148 of the inter layer 106. In some cases, the interlayer 106 only serves to couple portions or segments of the display 104 to corresponding portions or segments of the flexible support 108.

In this example, the flexible display 104 is disposed over and spans the entire length of the inter layer 106 and the flexible support 108, such that the flexible display 104 extends between the ends of the article 100 and is viewable from the top of the article 100. In other examples, the flexible display 104 may only be disposed over and span a partial length of the flexible support 108 and/or may be disposed under the flexible support 108.

As such, the inter layer 106 not only mechanically couples the display 104 to the flexible support 108, but can reduce, or even eliminate, the local variations in the bending radius of the article 100. In other words, the inter layer 106 can serve to smoothen out any local variation in the bending of the article 100, particularly the local variation of any bending experienced by the flexible display 104, thereby providing a more continuous local bending radius when the article 100 is curved or bent. Advantageously, in some cases, the inter layer 106 can also provide visco-elastic cushioning to the display 104, thereby making the display 104 less sensitive (e.g., less prone to damage) to objects dropped thereon.

Although not depicted herein, the inter layer 106, can be disposed between the flexible display 104 and any of the other flexible supports depicted herein (e.g., the flexible supports 208, 308, 708, 808, 908, 1008, 1108, 1208, 1308). It will also be appreciated that the article 100, or any of the other articles described herein, need not include the inter layer 106, or any layer disposed between the flexible display 104 and the flexible support 108. Instead, the flexible display 104 and the flexible support 108, and/or any of the other flexible supports described herein, can be directly coupled (e.g., attached, adhered) to one another in any known manner.

With the article 100 assembled in this way, the flexible support 108 is configured to support the flexible display 104 and limit local bending of the flexible display 104 beyond its bending range when the article 100 is curved or bent (e.g., to the curved position shown in FIG. 2D). However, unlike known support structures, which, when coupled to the flexible display 104, would cause the article to have a neutral plane far from the display neutral plane 120 shown in FIG. 2B, and at an undesirable position in or outside of the display 104 (e.g., in the support structure) and, thus, significantly reduce or even destroy the bending ability (i.e., the bending range) of the display 104, the flexible support 108 disclosed herein does not significantly reduce or destroy the bending ability of the display 104, and may, in some instances, substantially maintain or even optimize the bending ability (i.e., the bending range) of the display 104, depending upon the desired bending range for the article 100 (i.e., the desired product specifications with respect to bending). In other words, the flexible support 108 disclosed herein is configured to cause the article 100 to have a bending range that substantially corresponds to the desired bending range for the article 100.

To this end, portions of the flexible support 108 disclosed herein can be configured to expand or compress (i.e., shrink) as the article 100, which initially has a first position (e.g., the position shown in FIG. 2C) is bent, curved, or flexed to a second, more bent or curved, position (e.g., the position shown in FIG. 2D). In some embodiments, such as the embodiment described in connection with FIGS. 3A-3E, portions of the flexible support 108, particularly those located below the defined hinge points described below, can shrink when the article 100 is curved or bent (e.g., to the curved position shown in FIG. 2D). In other embodiments, such as the embodiment described in connection with FIGS. 10A and 10B, portions of the flexible support 108, particularly those located below the defined hinge points described below, can expand when the article 100 is curved or bent (e.g., to the curved position shown in FIG. 2D).

The flexible support 108 (e.g., via movement of or between various components of the support 108) generally creates or defines hinge points such that the flexible support 108 causes the article 100 to have a desired bending range (i.e., the article 100 satisfies product requirements with respect to bending). More specifically, the flexible support 108 creates or defines hinge points, real and/or virtual, at a position such that the flexible support 108 does not significantly impair, and may even improve, the bending ability of the display 104. In some cases, such as, for example, when the bending range of the display 104 itself is sufficient (e.g., to satisfy product specifications), the flexible support 108 can be configured to effectively define or create real and/or virtual hinge points that lie in or very close to a plane of the display 104 itself, with the result that the support 108 causes the article 100 to have a bending plane (or one or more bending planes) positioned substantially coincident with or close to (i.e., that substantially overlaps with) the position of the neutral plane 120 of the display itself, such that the bending range of the article 100 is sufficient (e.g., complies with product specifications). In some cases, e.g., when the flexible display 104 is locally coupled to the flexible support 108, the hinge points can be movable, relative to the flexible support 108, when the flexible display 104 is moved between different positions, such that the bending range of the article 100 is sufficient. When, for example, the flexible display 104 is locally coupled to the flexible support 108 at a plurality of points, the flexible display 104 can be freely movable, relative to the flexible support 108, between those points at which the flexible display 104 is locally coupled to the flexible support 108, when the flexible display 104 is moved between different positions.

The bending plane(s) is (are) generally defined by the hinge points (e.g., the hinge points lie in the bending plane(s), the bending plane(s) is (are) formed or defined by a virtual connection between the hinge points). In some instances, the bending plane(s) can be the same as the neutral plane of the article 100. In one example, the flexible support 108 can effectively define or create real and/or virtual hinge points that substantially lie in the neutral plane 120 of the display 104, with the result that the support 108 causes the article 100 to have a bending plane (or bending planes), which is (are) defined by the hinge points, that is positioned substantially coincident with the position of the neutral plane 120 of the display. In other cases, such as, for example, when the bending range of the display 104 is less than desired (e.g., due to built-in strains or due to the use of a relatively thick top substrate), the disclosed flexible support 108 can effectively define or create real and/or virtual hinge points a pre-determined or calculated distance away from the position of the neutral plane 120, with the result that the flexible support 108 can intentionally create a bending plane (or bending planes) of the article 100, defined as described above, having a different position than the position of the neutral plane 120 of the display, such that it increases, even optimizes, the bending range of the article 100 beyond the bending range of the flexible display 104 itself. In further cases, such as, for example, when the bending range of the display 104 is greater than desired (for purposes of satisfying the product requirements), the disclosed flexible support 108 can effectively define or create real and/or virtual hinge points a pre-determined or calculated distance away from the position of the neutral plane 120, with the result that the flexible support 108 can intentionally create a bending plane (or bending planes) of the article 100, defined as described above, having a different position than the position of the neutral plane 120 of the display, such that the bending range of the article 100 is less than the bending range of the flexible display 104 itself but is still sufficient (i.e., satisfies product requirements with respect to bending). The pre-determined or calculated distance, can, but need not, correspond to the optimal position for the real and/or virtual hinge points, which is the position at which the smallest relative difference between the maximum strain (that the layer of the display 104 can tolerate) and the actual strain in any layer of the display 104 is maximized under the most extreme bending conditions for the article 100. In the event that the pre-determined or calculated distance does correspond to the optimal position, the flexible support 108 can intentionally create a bending plane (or bending planes) of the article 100, defined as described above, that has a position that differs from the position of the neutral plane 120 of the display 120, such that it optimizes the bending range of the article 100. In any of these cases, the real and/or virtual hinge points can be defined or created differently, such as in a different position and/or via different components of the article 100, with the result that the bending range of the 100 can be altered.

At the same time, the flexible support 108 is configured to provide support to the flexible display 104 regardless of which position the article 100 is in. For example, the flexible support 108 is configured to provide support to the flexible display when the article 100 is in the flat position shown in FIG. 2C or the curved position shown in FIG. 2D. More specifically, the flexible support 108 is configured to support the flexible display 104 between some (e.g., two consecutive pairs of adjacent hinge points), if not all, of the plurality of real or virtual hinge points defined or created by the flexible support 108. As such, the flexible support 108 supports the display 104 in the regions of bending, such that the display 104 is not easily damaged when, for example, a user of the article 100 touches the display 104.

Figure 3A:
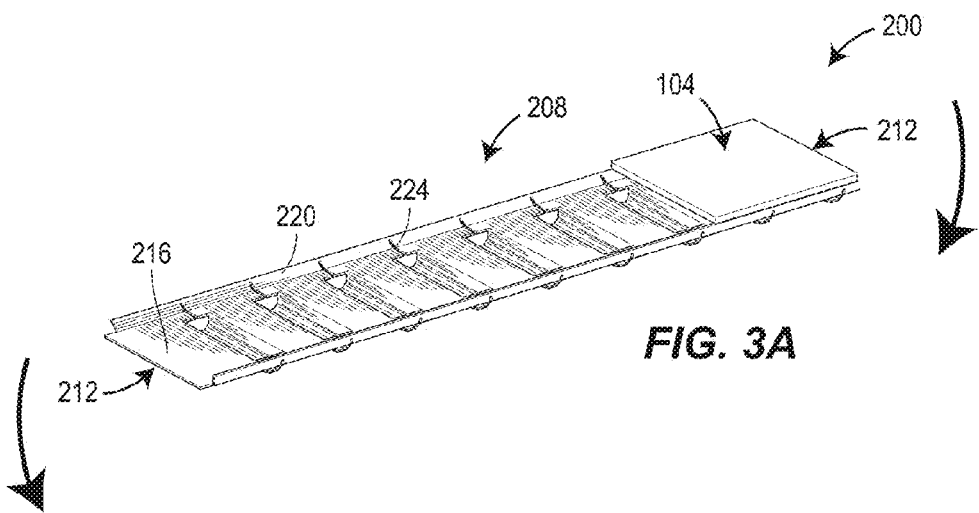
FIG. 3A illustrates an example attachable article having a flexible display and a first type of flexible support structure coupled to the flexible display.
Figure 3B:
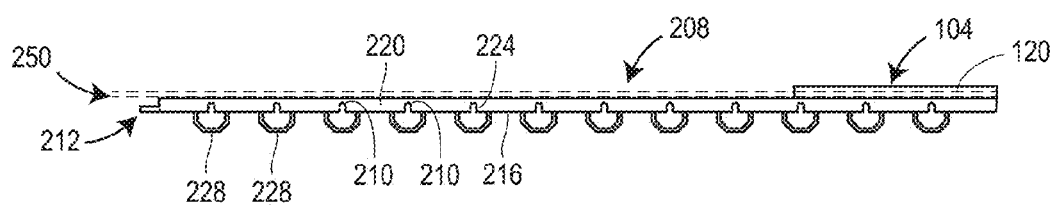
FIG. 3B is a side view of the attachable article depicted in FIG. 3A.
Figure 3C:
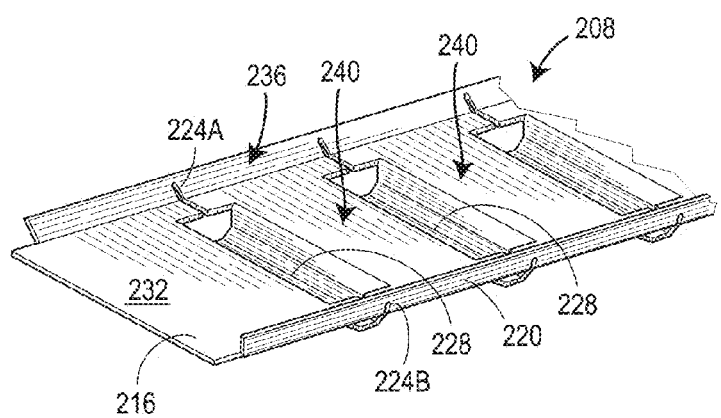
FIG. 3C is a close-up perspective view of a portion of the first type of flexible support.

FIGS. 3A-3E depict one example of a dynamically flexible, attachable article 200 constructed and assembled in accordance with the teachings of the present invention. The article 200 includes the flexible display 104 (only shown in FIG. 3A) and a flexible support 208 coupled to the flexible display 104. The article 200 in this example is configured for bending, flexing, or curving in an outward direction (i.e., the display 104 has a concave shape), which is indicated by the arrows in FIG. 3A. The flexible support 208 is generally configured to support but also limit local bending of the display 104 beyond its limits (e.g., the minimum bending radius of the display 104) in this outward direction. The flexible support 208 can also, but need not, be configured to limit local bending of the display 104 in the other direction. A portion of the flexible support 208 is also configured to shrink or compress when the article 200, which initially has the position shown in FIGS. 3A-3C, is curved or bent in this outward direction to a second, more curved or bent position (e.g., the position shown in FIGS. 3D and 3E). The flexible support 208 creates or defines a plurality of hinge points 210 (see FIG. 3B). The hinge points 210 in this example are very close to the neutral plane 120 of the display 104, with the result that the support 208 causes the article 200 to have a bending plane (or bending planes) 250, defined by the hinge points 210, positioned very close to the position of the neutral plane 120 of the display 104 itself. Thus, the flexible support 208 fully supports the display 104 while substantially maintaining or increasing the bending ability (e.g., the bending range) of the display 104.

The flexible support 208 has a generally rectangular-shape and is generally defined by a pair of opposing ends 212, a bottom wall 216 extending between the ends 212, and a pair of sidewalls 220 that extend upward and outward from the bottom wall 216 and extend longitudinally between the opposing ends 212. With the sidewalls 220 oriented at an acute angle relative to the bottom wall 216, the flexible display 104 can be seated or disposed within or between the sidewalls 220 (see FIG. 3A).

With reference to FIGS. 3A-3C, the flexible support 208 includes a plurality of notches 224 and a plurality of support features 228. The plurality of notches 224 are generally formed (e.g., molded) in a top side of the flexible support 208 across the entire length L of the support 208. The plurality of notches 224 includes notches 224A formed in or along one side of the support 208 and notches 224B formed in or along the other side of the support 208 across from or opposite the notches 224A. The notches 224A are evenly spaced apart from one another across the length L of the support 208, and the notches 224B are evenly spaced apart from one another across the length L. As shown in FIG. 3B, a first portion of each notch 224 is formed in a portion of a top side 232 of one of the sidewalls 220 and a second portion of each notch 224 is formed in a portion of a top side 236 of the bottom wall 216. The notches 224 generally define or correspond to the most extreme bending that will be permitted when the article 200 is bent in the outward direction.

The support features 228 are each generally formed between one notch 224A and a notch 224B disposed directly across from the notch 224B. As shown in FIGS. 3B and 3C, each support feature 228 is formed by a surface that is recessed downward relative to the bottom wall 216. In this example, each support feature 228 is formed by a surface that has a generally U-shaped cross-section and is recessed relative to the bottom wall 216. In other examples, each support feature 228 can be formed by one or more different surfaces (e.g., a surface having a differently-shaped cross-section). The flexible support 208 also includes a plurality of support sections 240 generally defined by the notches 224 and the support features 228. As shown in FIG. 3C, each support section 240 is defined between adjacent respective notches 224A, adjacent respective notches 224B disposed across from those notches 224A, and adjacent support features 228.

Figure 3D:
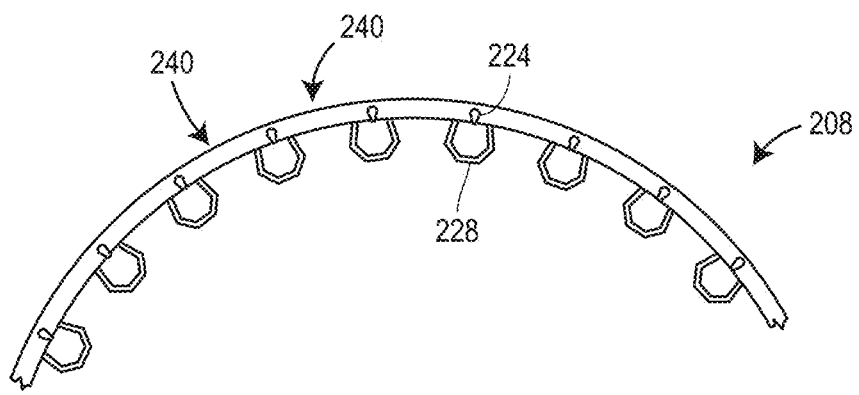
FIGS. 3D and 3E illustrate a portion of the attachable article shown in FIGS. 3A-3C bent or curved in an outward direction.
Figure 3E:
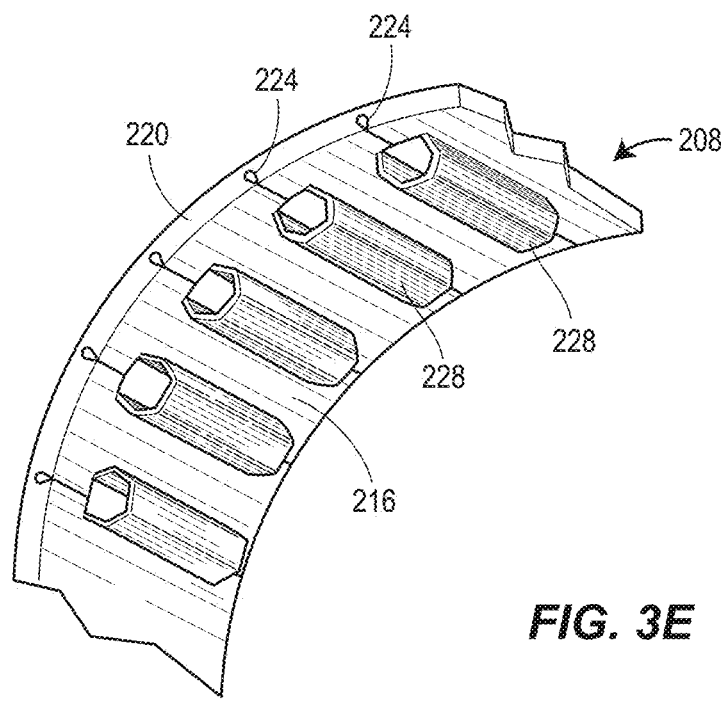

As briefly noted above, the flexible support 208 operates to limit bending of the flexible display 104 beyond its bending limit (e.g., beyond its minimum bending radius) in the outward direction. The support features 228 can, by virtue of their shape, provide some resistance to bending when the article 200 is being bent or curved from its first or initial position (e.g., the flat position shown in FIG. 3C) to a second, more bent, position (e.g., the bent position shown in FIGS. 3D and 3E). In addition, the notches 224 can, when the article 200 is being bent from the first position to the second position, operate to limit the amount of bending between adjacent sections 240, and, in turn, limit the bending of the flexible display 104. When the article 200 is being bent or curved in this way, the applied bending force causes adjacent support sections 240 to move toward one another, which, in turn, closes the respective notches 224A, 224B. At some point, the article 200 will be bent to such a degree (i.e., the maximum bending amount) that portions of the adjacent support sections 240 are in contact with one another, thereby substantially closing the notches 224A, 224B, as depicted in FIGS. 3D and 3E. With the notches 224A, 224B substantially closed, any further local bending of the flexible display 104 is prevented.

At the same time, portions of the flexible support 208, particularly the notches 224, the support features 228, and the adjacent support sections 240, define or form the hinge points 210. As shown in FIG. 3B, the hinge points 210 are formed or defined above the bottom wall 216 and at a position very close to the flexible display 104. As a result, the flexible support 208 causes the bending plane(s) 250 of the article 200 to be positioned substantially close to (e.g., overlapping with) the position of the neutral plane 120. The flexible support 208 thus causes the article 200 to have a bending range that substantially corresponds to the bending range for the display 104 (i.e., the flexible support 208 does not significantly, if at all, limit the bending range of the display 104). Advantageously, the flexible support 208 also supports the flexible display 104 between each of the defined hinge points 210, such that the flexible support 208 supports the display 104 in all of the regions of bending.

In other examples, the size, number, shape, curvature, and/or spacing of the notches 224 may be varied to define different bending limits for the article 200. For example, the curvature of one or more second notch portions can be varied to permit more or less bending. As another example, one or more of the notches 224 can be spaced at different distances from one another across the support 208, with the effect that different portions of the article 200 (e.g., the sides) can be bent or flexed more than other portions of the article 200 (e.g., the top and the bottom). Moreover, the width of the notches 224 can be varied to provide more or less flexing in the band at particular locations. Further yet, the size, shape, and/or curvature of the support sections 240 can be varied. For example, the support sections 240 can have a curved or arched shape.

FIGS. 4A-4I depict a portion of another example of a dynamically flexible, attachable article 300 constructed and assembled in accordance with the teachings of the present invention. The article 300 includes the flexible display 104 and a flexible support 308 coupled to the flexible display 104 via an interlayer (not shown), such as, for example, the interlayer 106. The flexible support 308 is configured to support but also limit local bending of the display 104 beyond its limits (e.g., the minimum bending radius of the display 104) in the outward direction (i.e., the display 104 has a concave shape), which is indicated by the arrows B1 in FIG. 4A. The flexible support 308 also, but need not, limits local bending in the other direction, the inward direction (i.e., the flexible display 104 has a convex shape), which is indicated by the arrows B2 in FIG. 4A. A portion of the flexible support 308 is configured to shrink when the article 300 is bent or curved in the outward direction from position shown in FIGS. 4A-4E to a second, more curved or bent, position (e.g., the position shown in FIGS. 4F and 4H). The flexible support 308 creates or defines a plurality of real hinge points 310. The hinge points 310 in this example are very close to the neutral plane 120 of the display 104, with the result that the support 308 causes the article 300 to have a bending plane (or bending planes) 350, defined by the hinge points 310, positioned very close to the position of the neutral plane 120 of the display 104 itself. Thus, the flexible support 308 fully supports the display 104 while substantially maintaining or increasing the bending ability of the display 104.

Figure 4A:
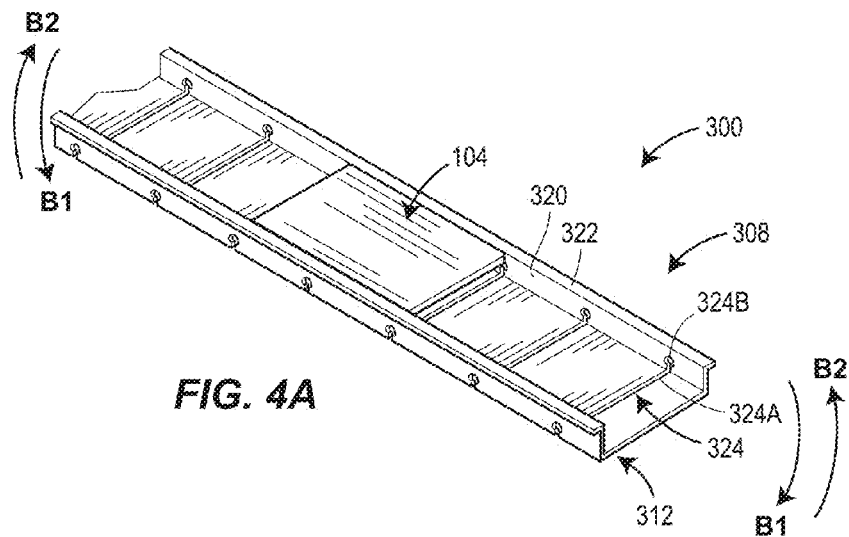
FIG. 4A-illustrates an example attachable article having a flexible display and a second type of flexible support structure coupled to the flexible display.

The flexible support 308 has a generally rectangular-shape and is generally defined by a pair of opposing ends 312, a bottom wall 316 extending between the ends 312, and a pair of sidewalls 320 that extend upward from the bottom wall 316 and extend longitudinally between the opposing ends 312. The flexible support 308 also includes a wall portion 322 coupled to and extending laterally outward from a top portion of each of the sidewalls 320. As shown in FIG. 4A, the flexible display 104 can be seated or disposed between the sidewalls 320.

With reference to FIGS. 4A-4E, the flexible support 308 includes a plurality of grooves 324. The grooves 324 are generally formed in the sidewalls 320 and an underside 326 of the bottom wall 316 between the sidewalls 320 (i.e., the grooves 324 are oriented transversely). More specifically, each groove 324 includes a first groove portion 324A formed (e.g., molded) in an outward facing surface 326 of each of the sidewalls 320 and a second groove portion 324B formed (e.g., molded) in the underside 326 of the bottom wall 316 and extending therebetween. The grooves 324 generally define or correspond to the most extreme bending that will be permitted when the article 300 is bent in the outward direction.

Figure 4B:
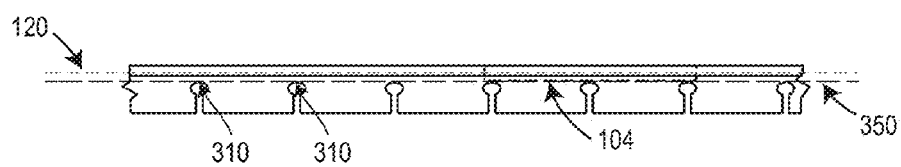
FIG. 4B is a side view of a portion of the attachable article depicted in FIG. 4A.
Figure 4C:
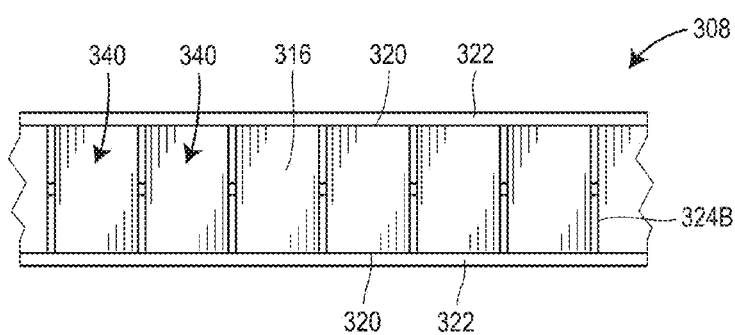
FIG. 4C is a top view of a portion of the second type of flexible support structure.
Figure 4D:
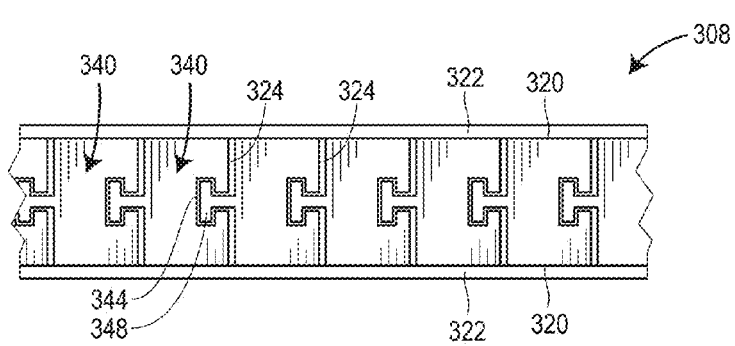
FIG. 4D is a bottom view of the portion of the second type of flexible support structure shown in FIG. 4C.
Figure 4E:
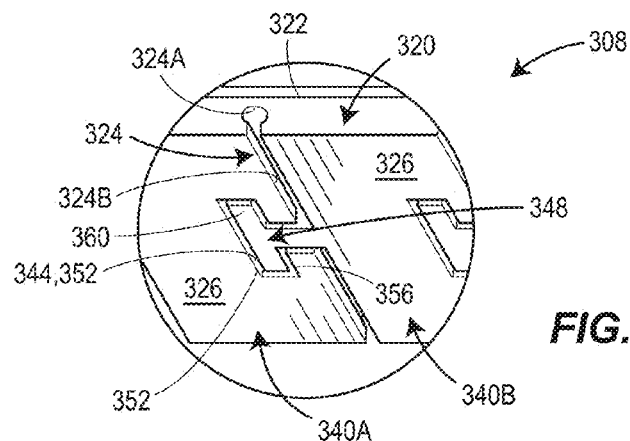
FIG. 4E is a close-up, bottom perspective view of a portion of the second type of flexible support structure.

The flexible support 308 further includes a plurality of support sections 340 generally defined by the grooves 324. As shown in FIG. 4D, each groove 324 defines two adjacent support sections 340. Adjacent support sections 340 are generally movable toward or away from one another, as will be described in greater detail below. As shown in FIGS. 4D and 4E, each pair of adjacent support sections 340 (e.g., support sections 340A, 340B) also includes a T-shaped slot 344 formed in the underside 326 of the bottom wall 316 of a first of the adjacent support sections 340 (e.g., support section 340A) and a corresponding T-shaped stop tab 348 that extends outward from the bottom wall 316 of a second of the adjacent support sections 340 (e.g., support section 340B) and toward the first of the adjacent support sections 340 (e.g., support section 340A).

As shown in FIGS. 4D and 4E, each stop tab 348 is disposed within a respective slot 344. As shown in FIG. 4E, each slot 344 has or defines a first stop surface 352 and a second stop surface 356 opposite the first stop surface 352. The first stop surface 352 generally defines or corresponds to the most extreme bending that will be permitted when the article 300 is bent in the outward direction, while the second stop surface generally defines or corresponds to the most extreme bending that will be permitted when the article 300 is bent in the inward direction. A head portion 360 of the stop tab 348 is movably disposed between the first stop surface 352 and the second stop surface 356 within each slot 344.

Figure 4F:
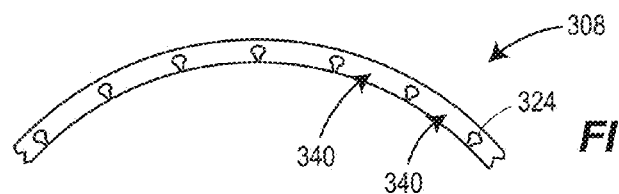
FIGS. 4F and 4G illustrate a portion of the attachable article shown in FIGS. 4A-4E bent or curved in an outward direction.
Figure 4G:
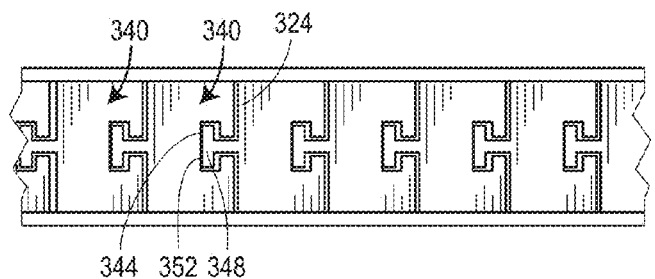

As briefly noted above, the flexible support 308 can limit bending of the flexible display 104 beyond its bending limit (e.g., beyond its minimum bending radius) when the article 300 is bent or curved in the outward direction (indicated by the arrows B1 in FIG. 4A). When this happens, the grooves 324 can, by virtue of their width and curvature, limit the amount of bending between adjacent support sections 340, and, in turn, limit the bending of the flexible display 104. Moreover, the interaction between corresponding slots 344 and stop tabs 348 can limit the amount of bending between adjacent support sections 340, which can, in turn, limit the bending of the flexible display 104. When the article 300 is being bent or curved in the outward direction from the first position (e.g., the position shown in FIG. 4E) to the second, more bent, position (e.g., the position shown in FIGS. 4F and 4G), the applied bending force causes adjacent support sections 340 (e.g., the sections 340A, 340B) to move toward one another. In turn, each stop tab 348 moves toward the first stop surface 352 within the respective slot 344. More particularly, the head portion 360 of each stop tab 348 moves away from the second stop surface 356 and toward the first stop surface 352 within the respective slot 344. At some point, the article 300 will be bent to such a degree (i.e., corresponding to the maximum bending amount) that the second groove portions 324B are substantially closed and a leading surface 364 of each stop tab 348 contacts the first stop surface 352 within the respective slot 344, as depicted in FIGS. 4F and 4G. When this happens, any further local bending of the article 300, particularly the flexible display 104, in the outward direction is prevented.

At the same time, the grooves 324 and the adjacent support sections 340 form or define the virtual hinge points 310. As shown in FIG. 4B, the hinge points 310 are formed or defined in the sidewalls 320 and at a position very close to the flexible display 104. As a result, the flexible support 308 causes the bending plane(s) 350 of the article 300 to be positioned substantially close or similar to the position of the neutral plane 120. The flexible support 308 thus causes the article 300 to have a bending range that substantially corresponds to the bending range of the display 104 (i.e., the flexible support 308 does not significantly, if at all, limit the bending range of the display 104). Advantageously, the flexible support 308 also supports the flexible display 104 between each of these defined hinge points 310, such that the flexible support 308 supports the display 104 in all of the regions of bending.

Figure 4H:
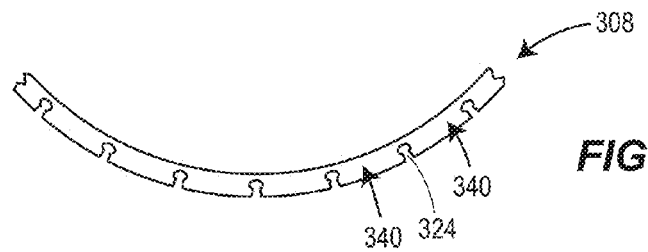
FIGS. 4H and 4I illustrate a portion of the attachable article shown in FIGS. 4A-4E bent or curved in an inward direction.
Figure 4I:
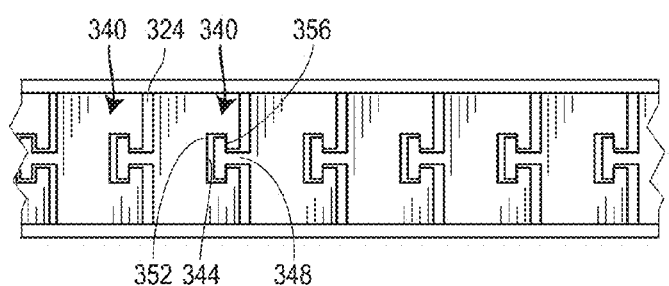

Though the flexible support 308 is principally configured to limit bending of the flexible display 104 beyond its bending limit in the outward direction, the flexible support 308 can also limit the bending of the flexible display 104 when the article 300 is bent or curved in the inward direction (indicated by the arrows B2 in FIG. 4A). Much like above, the interaction between corresponding slots 344 and stop tabs 348 can limit the amount of bending between adjacent support sections 340, which can, in turn, limit the bending of the flexible display 104. When the article 300 is being bent or curved in the inward direction from a first position (e.g., the position shown in FIG. 4D) to a second, more bent, position (e.g., the position shown in FIGS. 4H and 4I), the applied bending force causes adjacent support sections 340 (e.g., the sections 340A, 340B) to move apart from one another. In turn, each stop tab 348 moves toward the second stop surface 356 within the respective slot 344. More particularly, the head portion 360 of each stop tab 348 moves away from the first stop surface 352 and toward the second stop surface 356 within the respective slot 344. At some point, the adjacent support sections 340 will be moved to such a degree (i.e., corresponding to the maximum bending amount) that the second groove portions 324B are substantially widened and a leading surface 364 of each stop tab 348 contacts the second stop surface 356 within the respective slot 344, as depicted in FIGS. 4H and 4I. When this happens, any further local bending of the article 300, particularly the flexible display 104, in the inward direction is prevented.

In other examples, the size, number, curvature, width, and/or spacing of the grooves 324 can be varied to define different bending limits for the article 300. For example, the width of the grooves 324 (i.e., the space between adjacent support sections 340) can be increased or decreased. As another example, although the grooves 324 are evenly spaced apart from one another across the length L of the support 308, one or more of the grooves can be spaced at different distances from one another across the support 308, with the effect that different portions of the article 300 (e.g., the sides) can be bent or flexed more than other portions of the article 300 (e.g., the top and the bottom). As yet another example, the grooves 324 can extend to a portion of the wall sections 322. Further yet, the size and/or shape of the support sections 340 can be varied. For example, the support sections 340 can have a curved or arched shape.

Alternatively or additionally, the size, number, and/or shape of the slots 344 and/or the tabs 348 can be varied to define different bending limits for the article 300. For example, the position of the first and/or second stop surfaces 352, 356 can be adjusted to define different bending limits for the article 300. As another example, the shape of the slots 344 and the tabs 348 can vary (see FIGS. 5A-5C). In some examples, the slots 344 can include a rib portion (e.g., an inwardly extending rib portion) configured to retain the corresponding tab 348 in the desired position (e.g., adjacent the first stop surface 352). Likewise, the tabs 348 can include a projection (e.g., an inwardly extending projection) configured to catch a portion of a corresponding slot 344 to retain the respective tab 348 in the desired position.

Figure 5A:
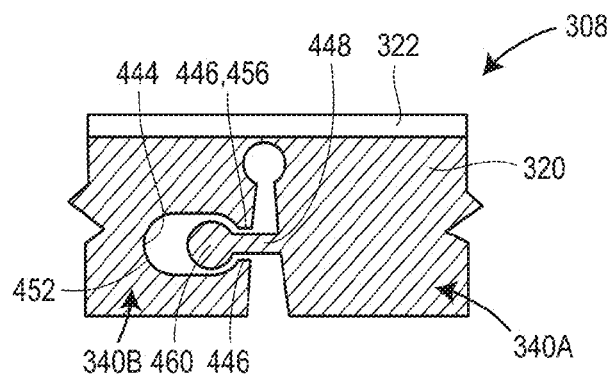
FIGS. 5A-5C illustrate different examples of the second type of flexible support structure shown in FIGS. 4A-4E.
Figure 5B:
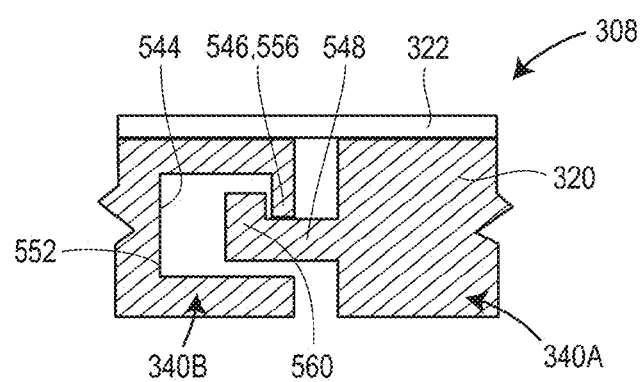
Figure 5C:
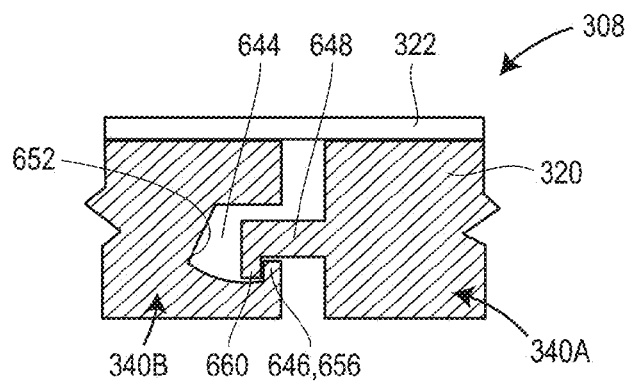

As shown in each of FIGS. 5A-5C, the flexible support 308 can include structurally different slot and tab arrangements than the slot 344 and tab 348 arrangements described in FIGS. 4A-4H. Although structurally different, the slot and tab arrangements depicted in FIGS. 5A-5C operate to limit local bending of the article 300 in a similar manner as the arrangements described above.

As shown in FIG. 5A, each pair of adjacent support sections 340 (e.g., support sections 340A, 340B) can include a pair of slots 444 (only one is visible in FIG. 5A) and a corresponding pair of stop tabs 448 (only one is visible in FIG. 5A) disposed in a respective one of the slots 444. The slots 444 are formed in the opposing sidewalls 320, respectively, of a first of each pair of adjacent support sections (e.g., support section 340A). Each slot 444 has a substantially oval shape as shown in FIG. 5A. Unlike the slots 344, each slot 444 includes a pair of projecting ribs 446 configured to engage and retain a respective tab 448 therein. The tabs 448 extend outward from the opposing sidewalls 320, respectively, of a second of each pair of adjacent support sections (e.g., support section 340B). Like each slot 344, each slot 444 has or defines a first stop surface 452 and a second stop surface 456 opposite the first stop surface 452. In this example, each second stop surface 456 is defined by a respective pair of inwardly projecting ribs 446. A head portion 460 of each stop tab 448 has a circular cross-section and is movably disposed between the first stop surface 452 and the second stop surface 456 within each slot 444.

As shown in FIG. 5B, each pair of adjacent support sections 340 (e.g., support sections 340A, 340B) can include a pair of slots 544 (only one is visible in FIG. 5B) and a corresponding pair of stop tabs 548 (only one is visible in FIG. 5B) disposed in a respective one of the slots 544. Like the slots 444, the slots 544 are formed in the opposing sidewalls 320, respectively, of a first of each pair of adjacent support sections (e.g., support section 340A). Each slot 544, however, has a substantially rectangular shape as shown in FIG. 5B. Each slot 544 also includes a downwardly projecting rib 546 configured to engage and retain a respective tab 548 therein. The tabs 548 extend outward from the opposing sidewalls 320, respectively, of a second of each pair of adjacent support sections (e.g., support section 340B). Like each slot 444, each slot 544 has or defines a first stop surface 552 and a second stop surface 556 opposite the first stop surface 452. In this example, each second stop surface 556 is defined by a respective one of the ribs 546. Each stop tab 548 includes an upwardly projecting head portion 560, which has a rectangular cross-section and is movably disposed between the first stop surface 552 and the second stop surface 556 within each slot 544.

As shown in FIG. 5C, each pair of adjacent support sections 340 (e.g., support sections 340A, 340B) can include a pair of slots 644 (only one is visible in FIG. 5C) and a corresponding pair of stop tabs 648 (only one is visible in FIG. 5C) disposed in a respective one of the slots 644. Like the slots 444, 544, the slots 644 are formed in the opposing sidewalls 320, respectively, of a first of each pair of adjacent support sections (e.g., support section 340A). Each slot 644, however, has an irregular shape as shown in FIG. 5C. Each slot 644 also includes an upwardly projecting rib 646 configured to engage and retain a respective tab 648 therein. The tabs 648 extend outward from the opposing sidewalls 320, respectively, of a second of each pair of adjacent support sections (e.g., support section 340B). Like each slot 444, 544, each slot 644 has or defines a first stop surface 652 and a second stop surface 656 opposite the first stop surface 452. In this example, each second stop surface 656 is defined by a respective one of the ribs 646. Each stop tab 648 includes a downwardly projecting head portion 660, which has a rectangular cross-section and is movably disposed between the first stop surface 652 and the second stop surface 656 within each slot 644.

FIGS. 6A-6F depict another example of a dynamically flexible, attachable article 700 constructed and assembled in accordance with the teachings of the present invention. The article 700 includes the flexible display 104 (only visible in FIG. 6A) and a flexible support 708 coupled to the flexible display 104 via an interlayer (not shown), such as, for example, the interlayer 106. The flexible support 708 is generally configured to support but also limit local bending of the display 104 beyond its limits (e.g., the minimum bending radius of the display 104) in the inward direction (i.e., the flexible display 104 has a convex shape), which is indicated by the arrows in FIG. 6A. The flexible support 708 can, in other examples, also be configured to limit local bending of the display 104 in the outward direction. A portion of the flexible support 708 is also configured to expand when the article 700 is bent in the inward direction from the position shown in FIGS. 6A-6D to a second, more curved or bent, position (e.g., the position shown in FIG. 6E). The flexible support 708 also creates or defines a plurality of real hinge points 710 (see FIG. 6B). The hinge points 710 in this example are substantially coincident with the neutral plane 120 of the display 104, with the result that the support 708 causes the article 700 to have a bending plane (or bending planes) 750, defined by the hinge points 710, positioned substantially coincident (e.g., substantially overlaps) with the neutral plane 120 of the display 104 itself. Thus, the flexible support 708 fully supports the display 104 while substantially maintaining the bending ability of the display 104 (i.e., the flexible support 708 does not significantly further limit the bending ability of the flexible display 104).

Figure 6A:
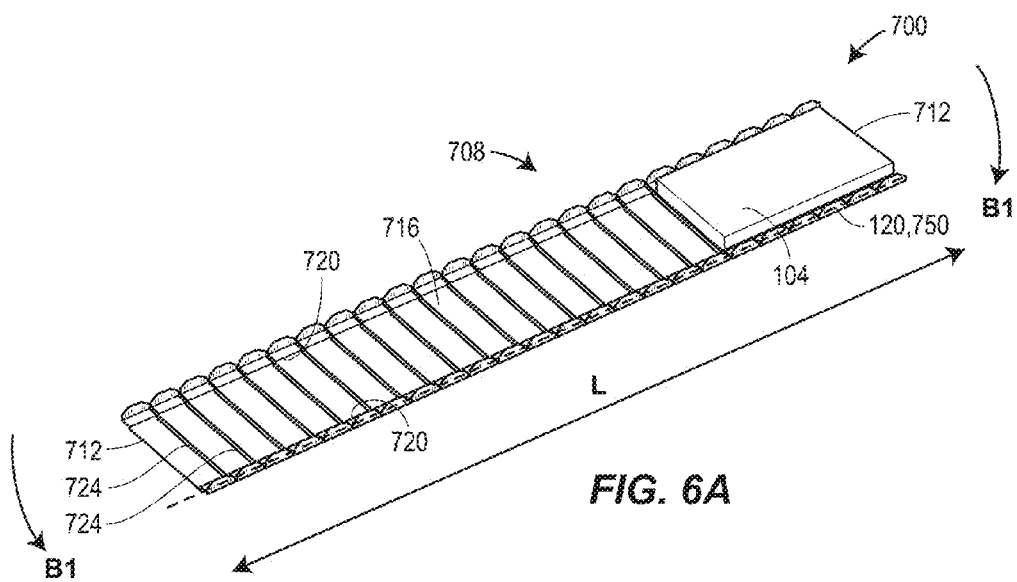
FIG. 6A illustrates an example attachable article having a flexible display and a third type of flexible support structure coupled to the flexible display.
Figure 6B:
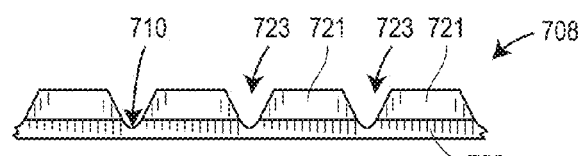
FIG. 6B is a side view of a portion of the third type of flexible support structure.
Figure 6C:
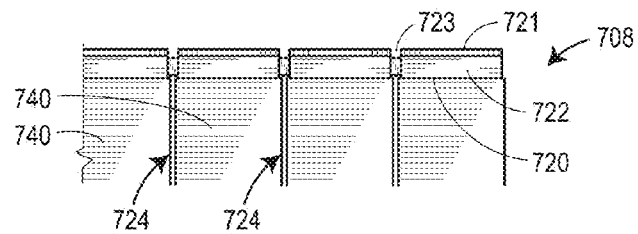
FIG. 6C is a top view of the portion of the third type of flexible support structure shown in FIG. 6B.

The flexible support 708 has a generally rectangular-shape and is generally defined by a pair of opposing ends 712, a bottom wall 716 extending between the ends 712, and a pair of sidewalls 720 that extend upward from the bottom wall 716 and extend longitudinally between the opposing ends 712. The flexible support 708 also includes a wall portion 722 coupled to and extending laterally outward from a top portion of each of the sidewalls 720, a plurality of projections 721 that extend upward from each of the wall portions 722, and an opening 723 defined between each adjacent pair of projections 721. As shown in FIG. 6B, each projection 721 has a trapezoidal shape in cross-section. The openings 723 generally define or correspond to the angle of the most extreme bending that will be permitted when the article 700 is bent in the inward direction. As shown in FIG. 6A, the flexible display 104 can be seated or disposed between opposing wall portions 722.

Figure 6D:
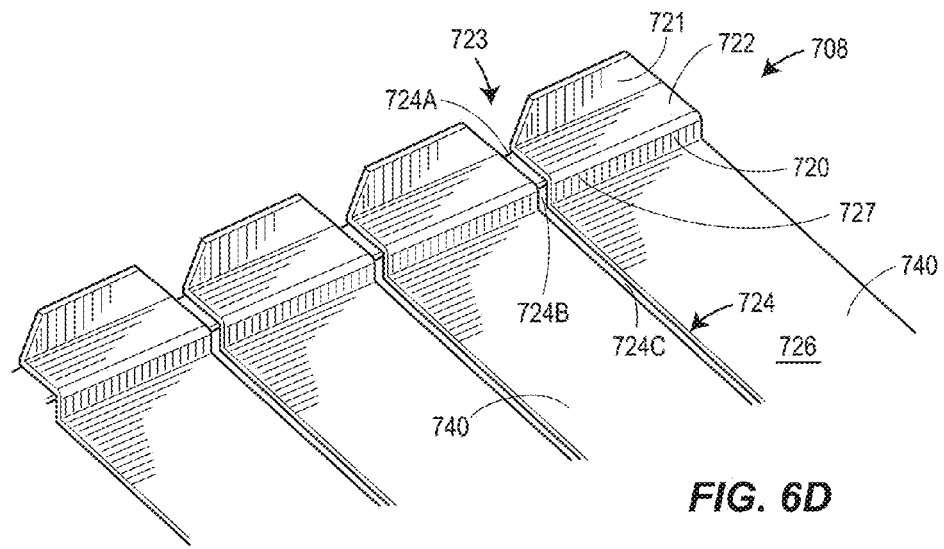
FIG. 6D is a top perspective view of the portion of the third type of flexible support structure shown in FIG. 6B.

With reference to FIGS. 6A-6D, the flexible support 708 includes a plurality of grooves 724. The grooves 724 are generally formed in the wall portions 722, the sidewalls 720, and a top side 726 of the bottom wall 716 between the sidewalls 720 (i.e., the grooves 724 are oriented transversely). More specifically, each groove 724 includes a pair of first groove portions 724A formed (e.g., molded) in a top side of the wall portions 722, a pair of second groove portions 724B formed (e.g., molded) in an inward facing surface 727 of each of the sidewalls 720, and a third groove portion 724C formed (e.g., molded) in the top side 726 of the bottom wall 716 and extending therebetween. The grooves 724 generally define or correspond to the most extreme bending that will be permitted when the article 700 is bent in the outward direction. The flexible support 708 further includes a plurality of support sections 740 generally defined by the grooves 724. As shown in FIG. 6D, each groove 724 defines two adjacent support sections 740. Adjacent support sections 740 are generally movable toward or away from one another, as will be described in greater detail below.

Figure 6E:
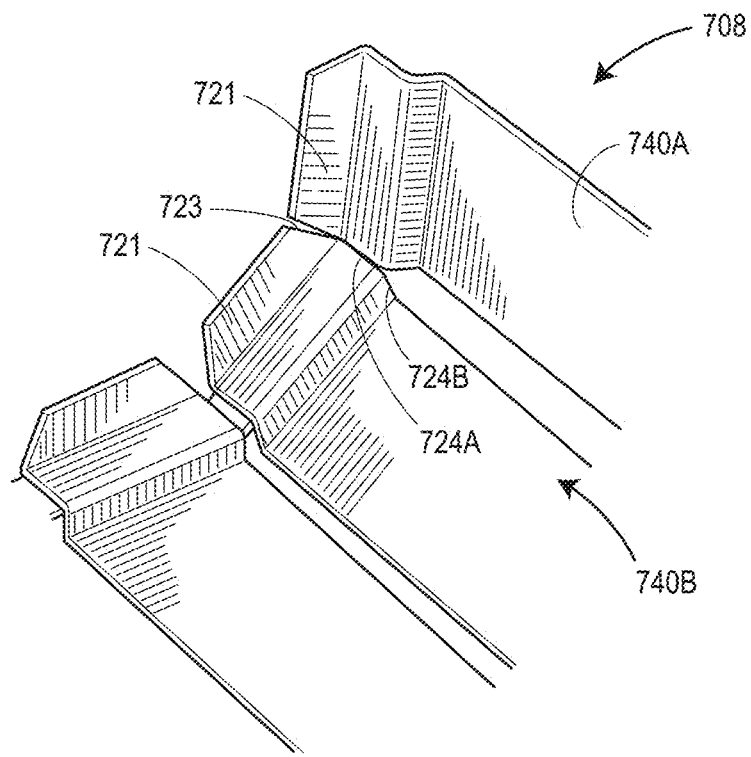
FIGS. 6E and 6F illustrate a portion of the attachable article shown in FIGS. 6A-6D bent or curved in an outward direction.

As briefly noted above, the flexible support 708 can limit bending of the flexible display 104 beyond its bending limit (e.g., beyond its minimum bending radius) when the article 700 is bent or curved in the inward direction (indicated by the arrows B1 in FIG. 6A). When the article 700 is being bent or curved in the inward direction from the position shown in FIG. 6D to a second, more bent, position (e.g., the position shown in FIG. 6E), the applied bending force causes adjacent support sections 740 (e.g., the sections 740A, 740B) to rotate toward one another. In turn, adjacent projections 723 also move toward one another. At some point, the adjacent support sections 740 will be moved to such a degree (i.e., corresponding to the maximum amount of bending) that the first groove portions 724B are substantially closed and portions of adjacent projections 721 contact one another, as depicted in FIG. 6E. When this happens, any further local bending of the article 700, particularly the flexible display 104, in the inward direction is prevented.

At the same time, the grooves 724 generally define or form the hinge points 710. With reference to FIGS. 6A-6D, the hinge points 710 are formed or defined by the groove portions 724A at a position substantially coincident with the neutral plane 120 of the flexible display 104. As a result, the flexible support 708 causes the bending plane(s) 750 of the article 700 to be positioned substantially coincident (i.e., substantially overlap) with the position of the neutral plane 120 of the display 104. The flexible support 708 thus causes the article 700 to have a bending range that substantially corresponds to the bending range for the display 104 (i.e., the flexible support 708 does not significantly, if at all, limit the bending range of the display 104). Advantageously, the flexible support 708 also supports the flexible display 104 between each of these defined virtual hinge points 710, such that the flexible support 708 supports the display 104 in all of the regions of bending.

Figure 6F:
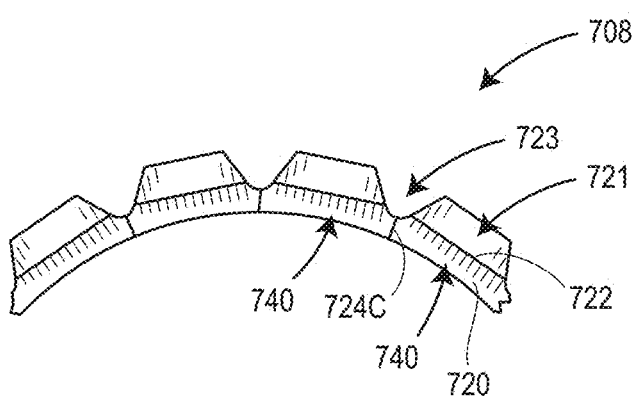

Though the flexible support 708 is principally configured to limit bending of the flexible display 104 beyond its bending limit in the inward direction, the flexible support 708 can also limit the bending of the flexible display 104 when the article 700 is bent or curved in the outward direction (indicated by the arrows B2 in FIG. 6A). The grooves 724, particularly the third groove portions 724C, can, when the article 700 is being bent from the position shown in FIGS. 6A-6D to the second, more bent, position (e.g., the position shown in FIG. 6F), operate to limit the amount of bending between adjacent sections 740, and, in turn, limit the bending of the flexible display 104. When the article 700 is being bent or curved in this way, the applied bending force causes adjacent support sections 740 to rotate away from one another, which, in turn, closes the third groove portions 724C. At some point, the adjacent support sections 740 will be rotated to such a degree that the opposing surfaces of adjacent support sections 740 are in contact with one another, and, in turn, the third groove portions 724C are substantially closed, as depicted in FIG. 6F. With the third groove portions 724C substantially closed, any further local bending of the flexible display 104 is prevented.

In other examples, the size, number, shape, curvature, and/or spacing of the projections 721, the openings 723, and/or the grooves 724 can be varied to define different bending limits for the article 700. For example, the size of the openings 723 can be increased or decreased to permit more or less bending, respectively. As another example, the curvature of one or more of the grooves 724 can be varied to permit more or less bending. Further yet, one or more of the grooves 724 can be spaced at different distances from one another across the support 708, with the effect that different portions of the article 700 (e.g., the sides) can be bent or flexed more than other portions of the article 700 (e.g., the top and the bottom). Moreover, the width of the notches 724 can be varied to provide more or less flexing in the article 700 at particular locations. Additionally, the grooves 724, particularly the groove portions 724A, 724B, and 724C can be formed or defined differently. For example, the groove portions 724C can be formed or defined by an aperture between adjacent support sections 740 and a support strip disposed underneath the wall portions 722. Further, the groove portions 724A can also be omitted, thereby creating continuous sidewall portions 722 with the hinge points located in portions 722 between the projections 721. Further yet, the size and/or shape of the support sections 740 can be varied. For example, the support sections 740 can have a curved or arched shape.

FIGS. 7A-7G depict another example of a dynamically flexible, attachable article 800 constructed and assembled in accordance with the teachings of the present invention. The article 800 includes the flexible display 104 and a flexible support 808 coupled to the flexible display 104 via an interlayer (not shown), such as, for example, the interlayer 106. The flexible display 104 in this example is configured for bending in one direction, the outward direction (i.e., the display 104 has a concave shape) indicated by the arrows B1 in FIG. 7A. The flexible support 808 is configured to support but also limit local bending of the display 104 beyond its limits (e.g., the minimum bending radius of the display 104) in this outward direction. A portion of the flexible support 808 is configured to shrink when the article 800 is bent or curved in the outward direction from a first position to a second, more curved or bent, position. The flexible support 808 also creates or defines a plurality of virtual hinge points 810 (see FIG. 7B). The hinge points 810 in this example are substantially coincident with the neutral plane 120 of the display 104, with the result that the support 808 causes the article 800 to have a bending plane (or bending planes) 850, defined by the hinge points 810, that substantially overlaps with the neutral plane 120 of the display 104 itself. Thus, the flexible support 808 fully supports the display 104 while substantially maintaining the bending ability of the display 104 (i.e., the flexible support 808 does not significantly limit the bending ability of the flexible display 104).

Figure 7A:
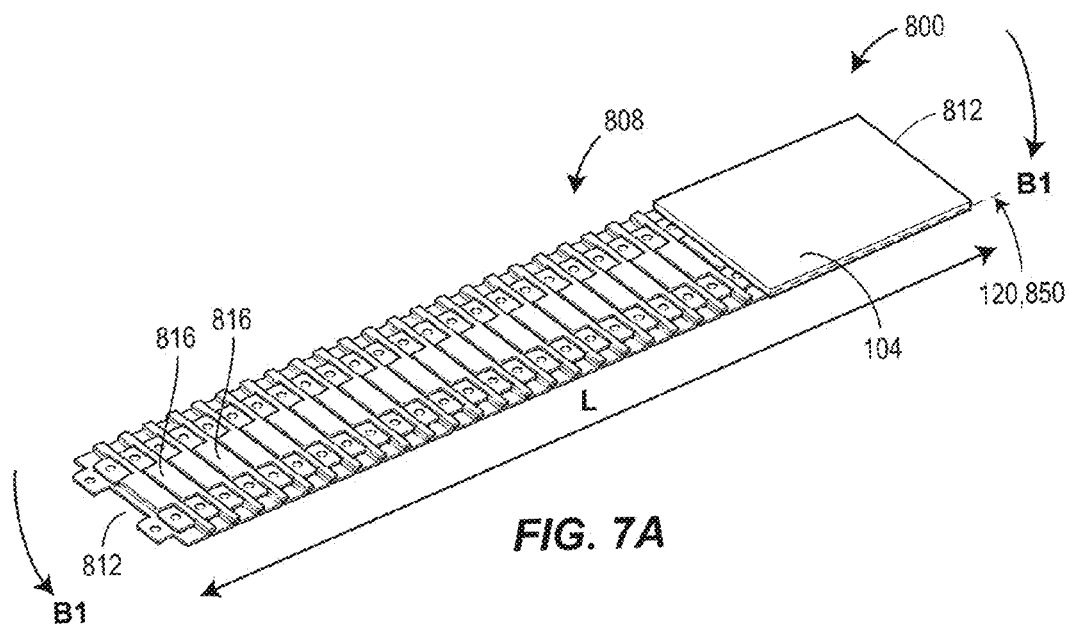
FIG. 7A illustrates an example attachable article having a flexible display and a fourth type of flexible support structure coupled to the flexible display.

As shown in FIG. 7A, the flexible support 808 has a generally rectangular-shape, a pair of opposing ends 812, and a length L measured from one end 812 to the other end 812. The flexible support 808 includes a plurality of links or support sections 816 slidably connected to one another. When the flexible support 808 is manipulated in the outward direction from the first position to the second, more curved or bent, position, portions of adjacent links 816 are configured to slide toward one another, such that the length L of the flexible support 808 decreases.

Figure 7B:
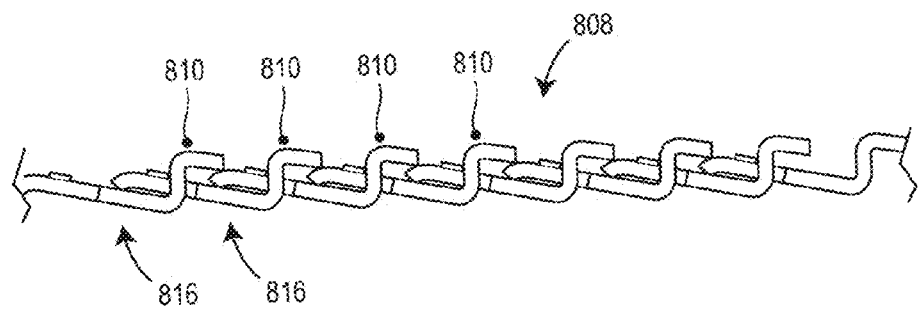
FIG. 7B illustrates a portion of the fourth type of flexible support structure including a plurality of links.
Figure 7C:
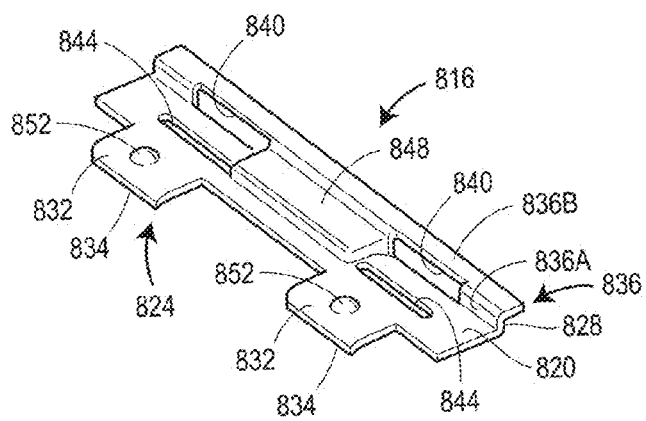
FIG. 7C is a perspective view of one of the links of the fourth type of flexible support structure.

As shown in FIG. 7C, each link or support section 816 includes a base 820. The base 820 has a first or proximal end 824 and a second or distal end 828 opposite the first end 824. First and second tabs 832 extend outward from a proximal end 828 of the base 820. Each tab 832 includes a downwardly extending catch 834 generally configured to be disposed in a portion of a respective link 816 disposed adjacent to the first end 824 to connect adjacent links 816 together. A mounting structure 836 extends upward from the distal end 828 of the base 820. The mounting structure 836 includes a generally vertical wall portion 836A and a generally horizontal wall portion 836B that extends outward from the vertical wall portion 836A and the base 820. With reference back to FIG. 7A, the display 104 in this example is disposed on the horizontal wall portion 836B of each link 816.

As shown in FIG. 7C, each link 816 includes first and second openings 840 defined in the generally vertical wall portion 836A of the mounting structure 836. Each opening 840 has a rectangular shape in cross-section. Each link 816 also includes first and second slits 844 defined in the base 820 and a raised surface 848 disposed between the slits 844. The surface 848 is slightly recessed relative to the generally horizontal wall portion 836B of the mounting structure 836. Each link 816 further includes first and second projections 852 disposed on and extending upward from the first and second tabs 832, respectively. The projections 852 are generally configured to interferingly contact portions, respectively, of a respective link 816 disposed adjacent to the first end 824 to limit bending between adjacent links 816.

Figure 7D:
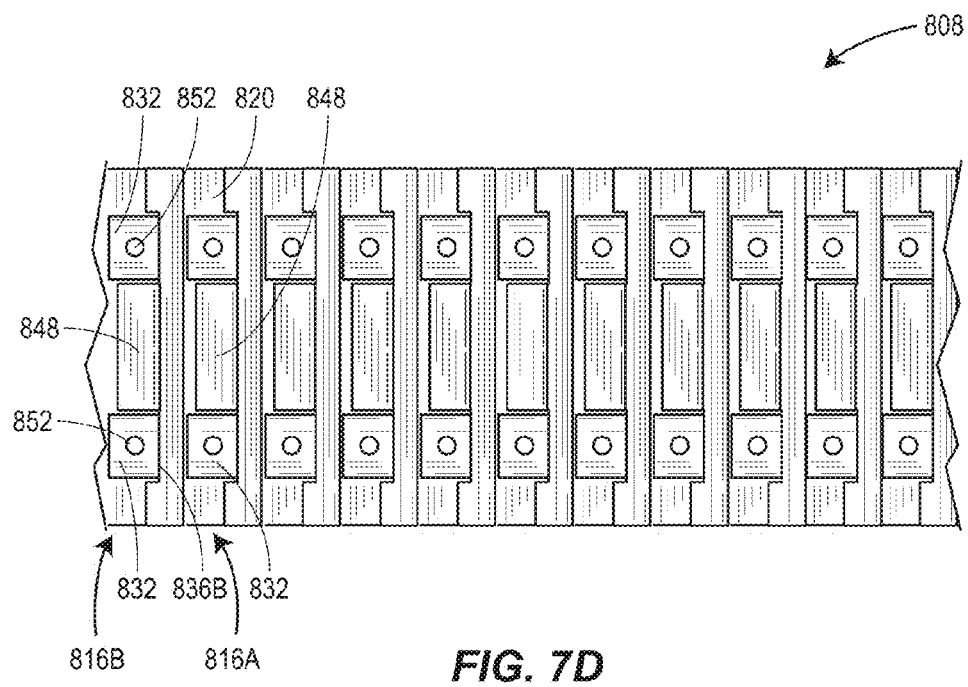
FIGS. 7D and 7E are top and perspective views, respectively, of a portion of the fourth type of flexible support structure.
Figure 7E:
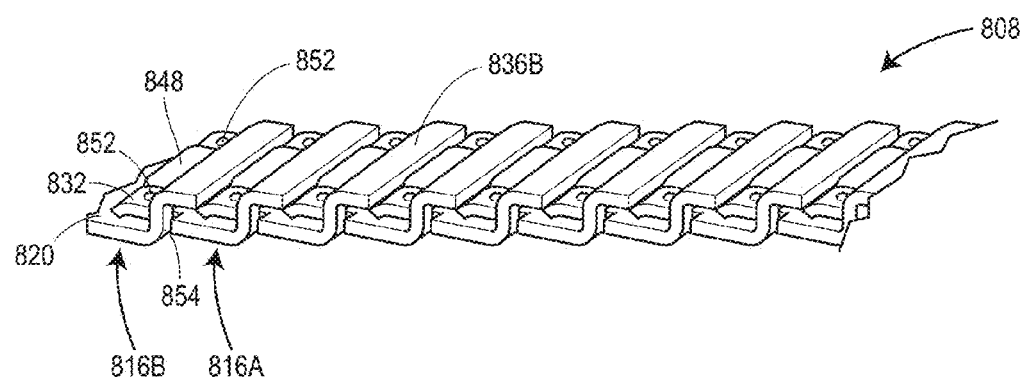
Figure 7F:
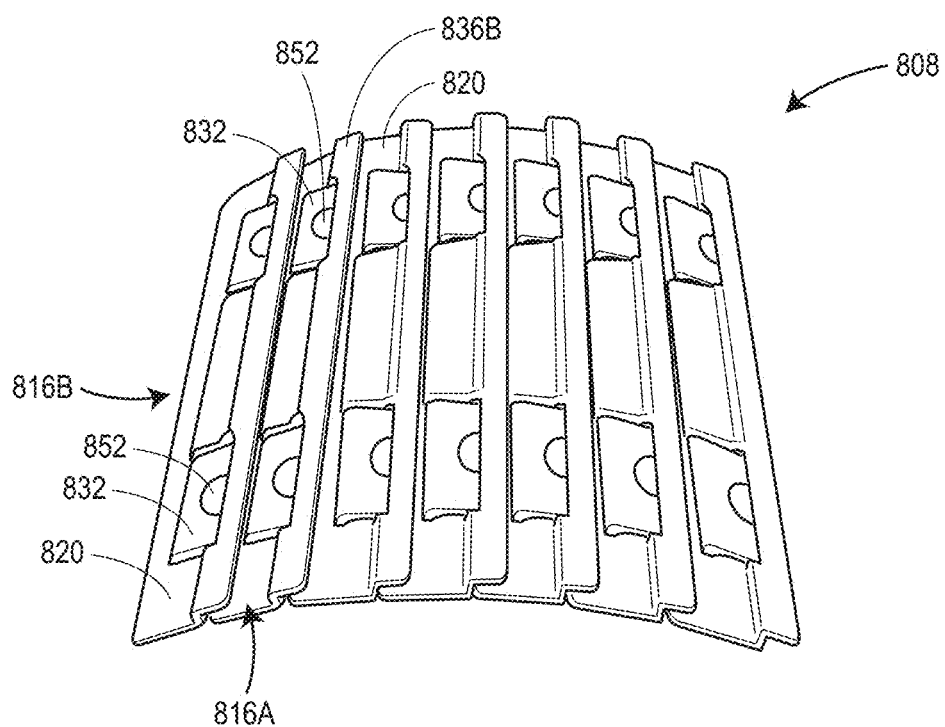
FIGS. 7F and 7G illustrate the attachable article shown in FIGS. 7A-7E bent or curved in an outward direction.
Figure 7G:
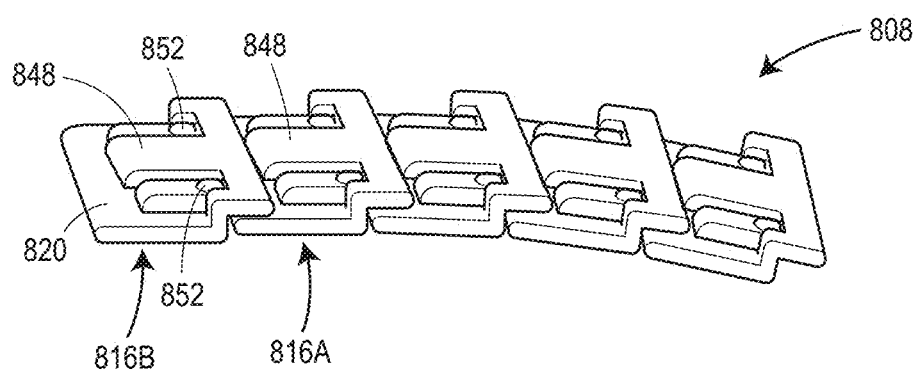

FIGS. 7D and 7E illustrate how adjacent links 816 are slidably connected to one another. To connect adjacent links 816 (e.g., the link 816A and the link 816B) to one another, the first and second tabs 832 of a first link 816 (e.g., the link 816A) are inserted into and through the first and second openings 840 of a second link 816 disposed adjacent the first link 816, such that the downwardly extending catch 834 of each tab 832 of the first link 816 is at least partially disposed or seated in a respective one of the slits 844 of the second link 816. So disposed, the projections 852 of the first link 816 are also inserted into and through the openings 840 of the second link 816 and disposed between the openings 840 and the slits 844 of the second link 816, as shown in FIG. 7D. When adjacent links 816 are connected in this way, there exists a small gap or space 854 between the proximal end 824 of each first link 816 and the generally vertical wall portion 836A of each second link 816. The gap or space 854 helps to define the amount of bending that will be permitted between adjacent links 816.

As briefly noted above, the flexible support 808 can limit bending of the flexible display 104 beyond its bending limit (e.g., beyond its minimum bending radius) when the article 800 is bent or curved in the outward direction (indicated by the arrows B1 in FIG. 7A). When the article 800 is being bent or curved in the outward direction from the position shown in FIGS. 7D and 7E to a second, more bent, position (e.g., the position shown in FIGS. 7F and 7G), the applied bending force causes each pair of adjacent links 816 (e.g., the links 816A, 816B) to slide toward one another. More specifically, the applied bending force causes each base 820 to rotate in a counter-clockwise direction, which (i) causes the projections 852 of each first link 816 to slide upward toward the generally horizontal wall portion 836A of the mounting structure 836 of each second link 816, and (ii) pushes the proximal end 824 of each first link 816 and the generally vertical wall portion 836A of each second link 816 toward one another, thereby shrinking the gap 854. At some point, the adjacent links 816 will be moved to such a degree (i.e., corresponding to a maximum bending amount) that the projections 852 of each first link 816 interferingly contact inwardly facing surfaces 856 of the generally horizontal wall portion 836B of the mounting structure 836 of each second link 816. This interference prevents any further bending between adjacent links 816, such that any further local bending of the article 800, particularly the flexible display 104, in the outward direction is prevented.

At the same time, the flexible support 808, so constructed, defines the virtual hinge points 810. With reference to FIG. 7B, the hinge points 810 are formed or defined above the base 820 of the links 816 and are substantially coincident with the neutral plane 120 of the flexible display 104. As a result, the flexible support 808 causes the bending plane(s) 850 of the article 800 to be positioned substantially close to (i.e., substantially overlap with) the position of the neutral plane 120. The flexible support 808 thus causes the article 800 to have a bending range that substantially corresponds to the bending range for the display 104 (i.e., the flexible support 808 does not significantly, if at all, limit the bending range of the display 104). Advantageously, the flexible support 808 also supports the flexible display 104 between each of these defined virtual hinge points 810, such that the flexible support 808 supports the display 104 in all of the regions of bending.

In other examples, the size, number, shape, curvature, and/or features of links 816 can be varied to define different bending limits for the article 800. For example, the size, shape, and/or curvature of the tabs 832 can be varied to define different bending limits for the article 800. As another example, the size, shape, and/or curvature of the openings 840, the slits 844, and/or the projections 852 can be varied to define different bending limits for the article 800. In yet another example, the gap 854 can be increased or decreased to adjust the amount of permissible bending between adjacent links 816.

FIGS. 8A-8F depict a portion of another example of a dynamically flexible, attachable article 900 constructed and assembled in accordance with the teachings of the present invention. The article 900 includes the flexible display 104 and a flexible support 908. The flexible display 104 is coupled to the flexible support 908 via a plurality of wings 910 disposed on (e.g., attached to) the flexible support 908. The flexible display 104 in this example is configured for bending in one direction, the outward direction (i.e., the display 104 has a concave shape), which is indicated by the arrows B1 in FIG. 8B. The flexible support 908 is configured to support but also limit local bending of the display 104 beyond its limits (e.g., the minimum bending radius of the display 104) in this outward direction. A portion of the flexible support 908 is configured to shrink when the article 900 is bent in the outward direction from the position shown in FIGS. 8A and 8B to a second, more curved or bent, position (e.g., the position shown in FIGS. 8C and 8D or the position shown in FIGS. 8E and 8F). The flexible support 908 creates or defines a plurality of virtual hinge points 911 (see FIG. 8B) that facilitate rotation and translation of portions of the flexible support 908. The hinge points 911 in this example are very close to the neutral plane 120 of the display 104, with the result that the support 908 causes the article 900 to have a bending plane (or bending planes) 950, defined by the hinge points 911, that is very close to the neutral plane 120 of the display 104 itself. Thus, the flexible support 908 fully supports the display 104 while substantially maintaining the bending ability of the display 104 (i.e., the flexible support 908 does not significantly further limit the bending ability of the flexible display 104).

Although FIGS. 8A and 8B only depict a portion of the entire flexible support 908, the flexible support 908 has a first end, a second end, and a length L measured from the first end to the second end, much like the other flexible supports described above. The flexible support 908 includes a plurality of links or support sections 912 pivotally and slidably connected to one another via a plurality of pins 916. When the flexible support 908 is bent in the outward direction from the first position to the second, more curved or bent, position, the links 912 slide and pivot in such a way that the length L of the flexible support 908 below the hinge points 911 decreases. At the same time, the links 912 slide and pivot in such a way that the length L of the flexible support 908 along a center line defined by the hinge points 911 remains substantially the same (e.g., the same), with the result that there is no path length difference along the center line when the flexible support 908 is bent over a range of different curvatures. This serves to prevent compressive or tensile loads from being imparted to the flexible display 104 as the article 900 is bent, which would damage the flexible display 104.

As shown in FIGS. 8A and 8B, each link or support section 912 has an arched or curved shape and defines a first end 920 and a second end 924 opposite the first end 920. Each link 912 also includes first and second slots 928A, 928B formed or defined therein proximate to the first end 920 and third and fourth slots 932A, 932B formed or defined therein proximate to the second end 924. As shown in FIG. 8B, the second slot 928B and the fourth slot 932B are angled relative to one another. The slots 928B and 932B are generally configured to limit bending between adjacent links 912, as will be described in greater detail below.

The first slot 928A has a circular shape in cross-section and guides a respective one of the pins 916 fixedly disposed therein. The second slot 928B has a substantially elliptical shape in cross-section. The second slot 928B defines a guide path for a respective one of the pins 916 to be disposed therein, with the ends of the second slot 928B defining the most extreme bending positions of the article 900. In this case, the ends of the second slot 928B define the positions shown in FIG. 8A and FIG. 8E, respectively, as the most extreme bending positions of the article 900. The first slot 932A has a circular shape in cross section and guides a respective one of the pins 916 fixedly disposed therein. Like the second slot 928B, the second slot 932B has a substantially elliptical shape in cross-section and defines a guide path for a respective one of the pins 916 disposed therein, with the ends of the second slot 932B also defining the most extreme bending positions of the article 900, these bending positions corresponding to the same bending positions defined by the second slot 928B.

Figure 8C:
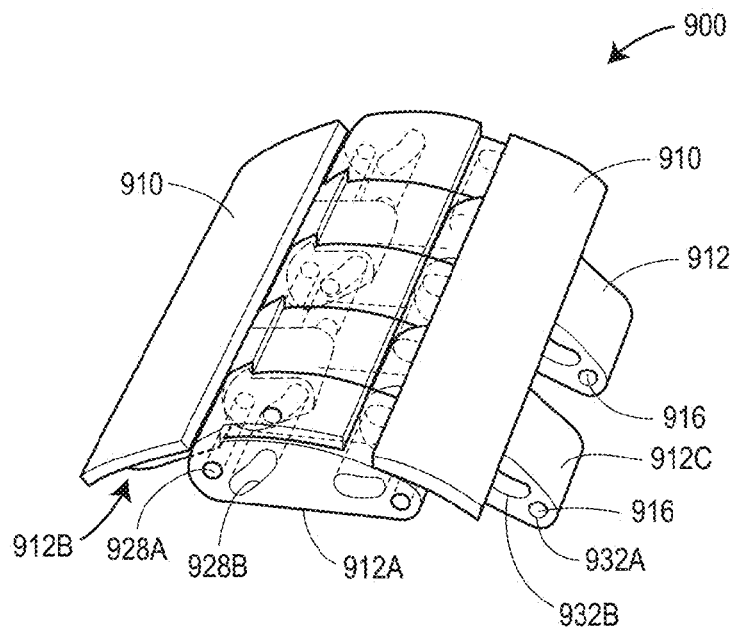
FIGS. 8C and 8D illustrate the attachable article shown in FIGS. 8A and 8B bent or curved in an outward direction.
Figure 8D:
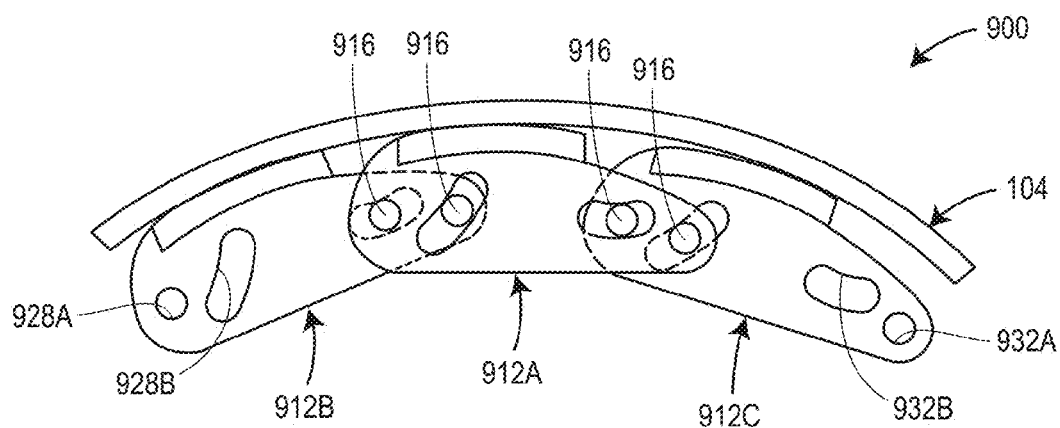

Adjacent links 912 in the flexible support 908, such as the links 912A, 912B, and 912C, are slidably and pivotally connected to one another in the offset manner illustrated in FIGS. 8A and 8B. More specifically, the first and second slots 928A, 928B of a first link 912A are offset from but aligned with the third and fourth slots 932A, 932B of a second link 912B disposed adjacent to the first end 920 of that first link 912A, and the third and fourth slots 932A, 932B of the first link 912A are offset from but aligned with the first and second slots 928A, 928B of a third link 912C disposed adjacent to the second end 924 of that first link 912A. In turn, (i) the pin 916 fixedly disposed in the first slot 928A of the first link 912A is slidably disposed within the fourth slot 932B of the second link 912B, (ii) the pin 916 fixedly disposed in the third slot 932A of the second link 912B is slidably disposed within the second slot 928B of the first link 912A, (iii) the pin 916 fixedly disposed in the third slot 932A of the first link 912A is slidably disposed within the second slot 928B of the third link 912C, and (iv) the pin 916 fixedly disposed in the first slot 928A of the third link 912C is slidably disposed within the fourth slot 932B of the first link 912A. Although FIGS. 8A-8F only depict the connection between links 912A, 912B, 912C, it will be appreciated that other adjacent links 912 in the flexible support 900 are slidably connected to one another in a similar manner.

Figure 8E:
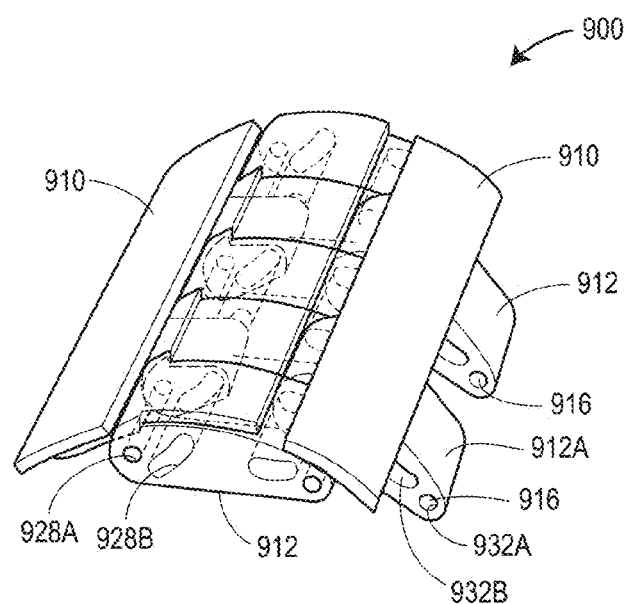
FIGS. 8E and 8F illustrate the attachable article shown in FIGS. 8A and 8B further bent or curved in the outward direction.
Figure 8F:
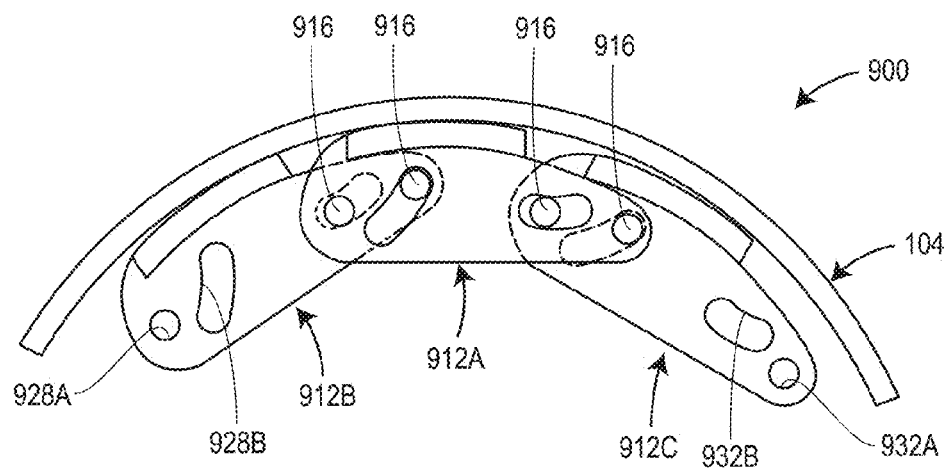

The flexible support 908, defined as detailed above, can limit bending of the flexible display 104 beyond its bending limit (e.g., beyond its minimum bending radius) when the article 900 is bent or curved in the outward direction (indicated by the arrows B1 in FIG. 8B). When the article 900 is bent or curved in the outward direction from its initial position, the substantially flat position shown in FIGS. 8A and 8B, to a second, more bent, position, such as the intermediate position shown in FIGS. 8C and 8D, the applied bending force causes the pins 916 to slide within the respective slots 928B, 932B from the positions shown in FIG. 8A to the positions shown in FIG. 8C. Beneficially, because the slots 928B and 932B are angled relative to one another, this prevents the article 900 from being stretched or compressed when the article 900 is being bent or curved in the outward direction. As, however, the pins 916 are disposed between the ends of the respective slots 928B, 932B when the article 900 is in the position shown in FIGS. 8C and 8D, further bending of the article 900 in the outward direction is possible. When the article 900 is further bent or curved in the outward direction from the position shown in FIGS. 8C and 8D to a third, more bent, position, such as the position shown in FIGS. 8E and 8F, the applied bending force causes the pins 916 to slide from the positions shown in FIG. 8C to the positions shown in FIG. 8E. When the pins 916 are positioned as shown in FIG. 8E, the pins 916 are in contact with the ends of the slots 928B, 932B and no further slidable movement is possible, such that any further bending of the article 900 in the outward direction is prevented.

At the same time, the flexible support 908, so constructed, defines or creates the virtual hinge points 911. With reference to FIG. 8B, the hinge points 911 are formed or defined at a position substantially above the links 912 and very close to the neutral plane 120 of the display 104. As a result, the flexible support 908 causes the bending plane(s) 950 of the article 900 to be very close to the position of the neutral plane 120 of the display 104. The flexible support 908 thus allows the article 900 to have a bending range that substantially corresponds to the bending range for the display 104 (i.e., the flexible support 908 does not significantly, if at all, limit the bending range of the display 104). Advantageously, the flexible support 908 also supports the flexible display 104 between each of these defined virtual hinge points 911, such that the flexible support 908 supports the display 104 in all of the regions of bending.

In other examples, the links 912 can vary from the links 912 illustrated herein and/or the links 912 can be slidably connected to one another in a different manner. In some examples, the size, number, shape, curvature, and/or features of the links 912 can be varied to define different bending limits for the article 900. For example, the size, shape, and/or curvature of the slots 928A, 928B, 932A, 932B can be varied to define different bending limits for the article 900. In other embodiments, the plurality of hinges 911 can be defined or formed in a different position (e.g., closer to the neutral plane 120). For example, the hinges 911 can be defined or formed such that the hinges 911 substantially overlap with (e.g., lie in) the neutral plane 120 of the display 104.

Figure 9A:
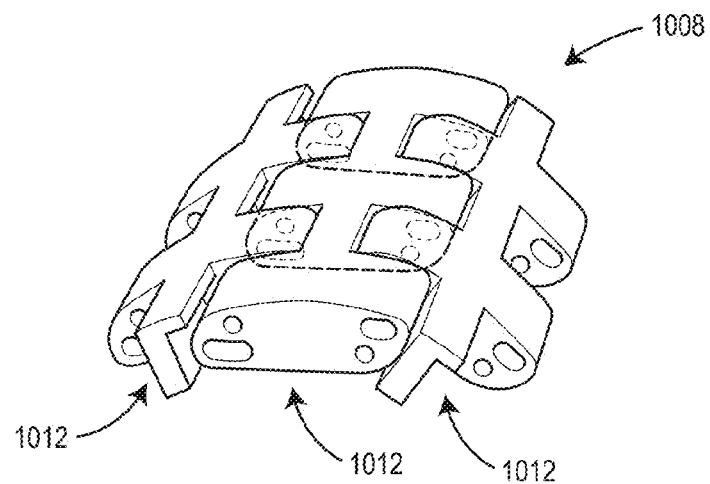
FIGS. 9A and 9B illustrate another example of the fifth type of flexible support structure shown in FIGS. 8A and 8B.
Figure 9B:
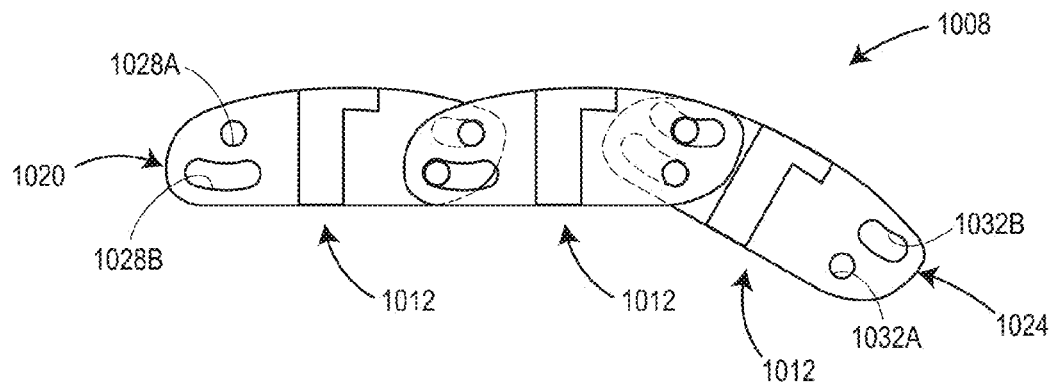

FIGS. 9A and 9B, for example, depict a portion of a flexible support 1008 that can be coupled to the display 104 via an interlayer (not shown), such as, for example, the interlayer 106. The flexible support 1008 is similar to but has a different geometry than the flexible support 908. The flexible support 1008 includes a plurality of links or support sections 1012 that are structurally different than the links or support sections 912. Like the links 912, each link 1012 has an arched or curved shape and defines a first end 1020 and a second end 1024 opposite the first end. Each link 1012 also includes first and second slots 1028A, 1028B formed or defined therein proximate to the first end 1020 and third and fourth slots 1032A, 1032B formed or defined therein proximate to the second end 1024. The slots 1028A, 1028B, 1032A, 1032B are generally formed in different portions, respectively, of each link 1008 than the slots 928A, 928B, and define different guide paths for the pins 916, with the ends of the slots 1028B and 1032B defining the most extreme bending positions of the article. Though structurally different than the links 912, the links 1012 are pivotally and slidably connected to one another in a similar manner. Thus, the flexible support 1008 can limit local bending of the display 104 beyond its limits (e.g., the minimum bending radius of the display 104) in the outward direction. At the same time, the links 1012 can, like the links 912, slide and pivot in a way that the length of the flexible support 1008 below the defined hinge points decreases upon bending in the outward direction. Accordingly, for the reasons noted above, the flexible support 1008 can fully support the display 104 while substantially maintaining the bending ability of the display 104 (i.e., the flexible support 1008 does not significantly further limit the bending ability of the display 104).

Figure 10A:
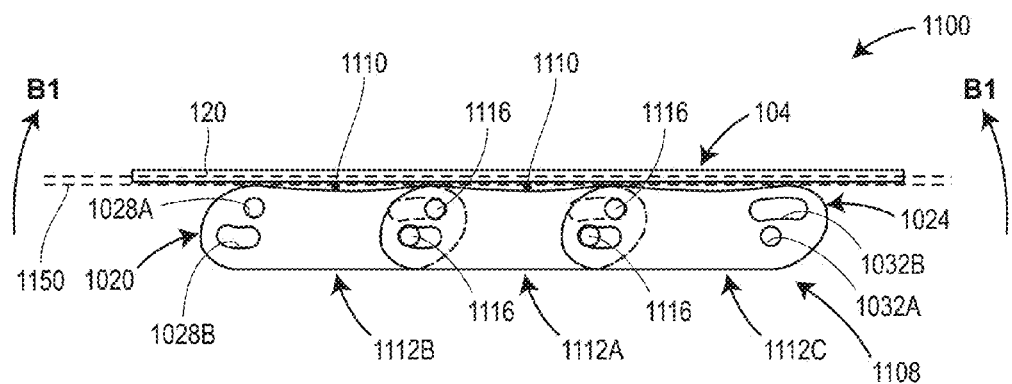
FIG. 10A illustrates an example attachable article having a flexible display and a sixth type of flexible support structure coupled to the flexible display.
Figure 10B:
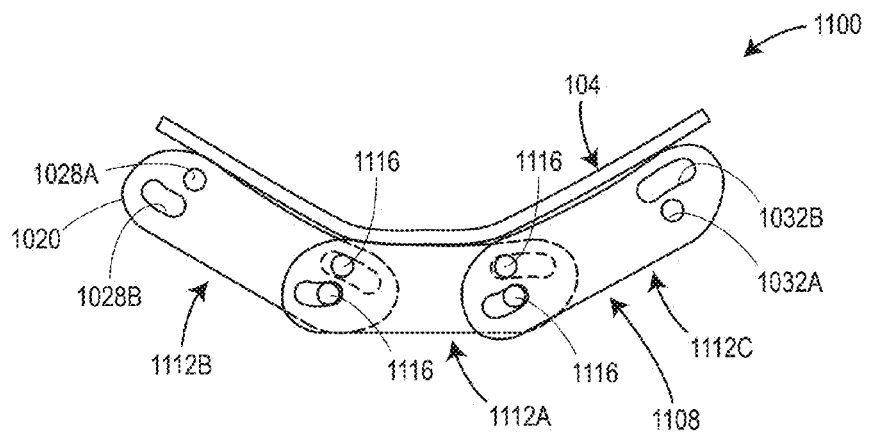
FIG. 10B illustrates the attachable article shown in FIG. 10A bent or curved in an inward direction.

FIGS. 10A and 10B depict a portion of another example of a dynamically flexible, attachable article 1100 constructed and assembled in accordance with the teachings of the present invention. The article 1100 includes the flexible display 104 and a flexible support 1108 coupled to the flexible display 104 via an interlayer (not shown), such as, for example, the interlayer 106. The flexible display 104 in this example is configured for bending in one direction, the outward direction (i.e., the display 104 has a concave shape), which is indicated by the arrows B1 in FIG. 10A. The flexible support 1108 is similar to the flexible support 908, but is configured to support but also limit local bending of the display 104 beyond its limits (e.g., the minimum bending radius of the display 104) in the inward, rather than outward, direction. A portion of the flexible support 1108 is configured to expand when the article 1100 is bent in the inward direction from the position shown in FIG. 10A to a second, more curved or bent, position (e.g., the position shown in FIG. 10B). The flexible support 1108 creates or defines a plurality of virtual hinge points 1110 (see FIG. 10A). The hinge points 1110 in this example are very close to the neutral plane 120 of the display 104, with the result that the support 908 causes the article 1100 to have a bending plane (or bending planes) 1150, defined by the hinge points 1110, that is very close to the neutral plane 120 of the display 104 itself. Thus, the flexible support 1108 fully supports the display 104 while substantially maintaining the bending ability of the display 104 (i.e., the flexible support 1108 does not significantly further limit the bending ability of the flexible display 104).

Although FIGS. 10A and 10B only depict a portion of the entire flexible support 1108, the flexible support 1108 has a first end, a second end, and a length L measured from the first end to the second end, much like the other flexible supports described above. The flexible support 1108 includes a plurality of links or support sections 1112 pivotally and slidably connected to one another via a plurality of pins 1116. When the flexible support 1108 is bent in the outward direction from the first position to the second, more curved or bent, position, the links 1112 slide and pivot in such a way that the length L of the flexible support 1108 below the hinge points 1110 increases. At the same time, the links 1112 slide and pivot in such a way that the length L of the flexible support 1108 along a center line defined by the hinge points 1110 remains substantially the same (e.g., the same), with the result that there is no path length difference along the center line when the flexible support 1108 is bent over a range of different curvatures. This serves to prevent compressive or tensile loads from being imparted to the flexible display 104 as the article 1100 is bent, which would damage the flexible display 104.

As shown in FIGS. 10A and 10B, each link or support section 1112 has an arched or curved shape and defines a first end 1120 and a second end 1124 opposite the first end 1120. Each link 1112 also includes first and second slots 1128A, 1128B formed or defined therein proximate to the first end 1120 and third and fourth slots 1132A, 1132B formed or defined therein proximate to the second end 1124. As shown in FIG. 10B, the second slot 1128B and the fourth slot 1132B are angled relative to one another. The first slots 1128A, 1128B, 1132A, and 1132B are generally configured to limit bending between adjacent links 1112, as will be described in greater detail below.

The first slot 1128A has a circular shape in cross-section and guides a respective one of the pins 1116 fixedly disposed therein. The second slot 1128B has a substantially elliptical shape in cross-section. The second slot 1128B defines a guide path for a respective one of the pins 1116 to be disposed therein, with the ends of the second slot 1128B defining the most extreme bending positions of the article 1100. In this case, the ends of the second slot 1128B define the positions shown in FIG. 10A and FIG. 10B, respectively, as the most extreme bending positions of the article 1100. The first slot 1132A has a circular shape in cross section and guides a respective one of the pins 1116 fixedly disposed therein. Like the second slot 1128B, the second slot 1132B has a substantially elliptical shape in cross-section and defines a guide path for a respective one of the pins 1116 disposed therein, with the ends of the second slot 1132B also defining the most extreme bending positions of the article 1100, these bending positions corresponding to the same bending positions defined by the second slot 1128B.

Adjacent links 1112 in the flexible support 1108, such as the links 1112A, 1112B, and 1112C, are slidably and pivotally connected to one another in the offset manner illustrated in FIGS. 10A and 10B. More specifically, the first and second slots 1128A, 1128B of a first link 1112A are offset from but aligned with the third and fourth slots 1132A, 1132B of a second link 1112B disposed adjacent to the first end 1120 of that first link 1112A, and the third and fourth slots 1132A, 1132B of the first link 1112A are offset from but aligned with the first and second slots 1128A, 1128B of a third link 1112C disposed adjacent to the second end 1124 of that first link 1112A. In turn, (i) the pin 1116 fixedly disposed in the first slot 1128A of the first link 1112A is slidably disposed within the fourth slot 1132B of the second link 1112B, (ii) the pin 1116 fixedly disposed in the third slot 1132A of the second link 1112B is slidably disposed within the second slot 1128B of the first link 1112A, (iii) the pin 1116 fixedly disposed in the third slot 1132A of the first link 1112A is slidably disposed within the second slot 1128B of the third link 1112C, and (iv) the pin 1116 fixedly disposed in the first slot 1128B of the third link 1112C is slidably disposed within the fourth slot 1132B of the first link 1112A. Although FIGS. 10A and 10B only depict the connection between links 1112A, 1112B, 1112C, it will be appreciated that other adjacent links 1112 in the flexible support 1100 are slidably connected to one another in a similar manner.

The flexible support 1108, defined as detailed above, can limit bending of the flexible display 104 beyond its bending limit (e.g., beyond its minimum bending radius) when the article 1100 is bent or curved in the outward direction (indicated by the arrows B1 in FIG. 10A). When the article 1100 is bent or curved in the outward direction from its initial position, the substantially flat position shown in FIG. 10A, to a second, more bent, position, such as the position shown in FIG. 10B, the applied bending force causes the pins 1116 to slide within the respective slots 1128B, 1132B from the positions shown in FIG. 10A to the positions shown in FIG. 10C. Beneficially, because the slots 1128B and 1132B are angled relative to one another, this prevents the article 1100 from being stretched or compressed when the article 1100 is being bent or curved in the inward direction. When the pins 1116 are positioned as shown in FIG. 10B, the pins 1116 are in contact with the ends of the slots 1128B, 1132B and no further slidable movement is possible, such that any further bending of the article 1100 in the inward direction is prevented.

At the same time, the flexible support 1108, so constructed, defines or creates the virtual hinge points 1110. With reference to FIG. 10A, the hinge points 1110 are formed or defined at a position substantially above the links 1112 and very close to the neutral plane 120 of the display 104. As a result, the flexible support 1108 causes the bending plane(s) 1150 of the article 1100 to be very close to the position of the neutral plane 120 of the display 104. The flexible support 1108 thus allows the article 1100 to have a bending range that substantially corresponds to the bending range for the display 104 (i.e., the flexible support 1108 does not significantly, if at all, limit the bending range of the display 104). Advantageously, the flexible support 1108 also supports the flexible display 104 between each of these defined virtual hinge points 1110, such that the flexible support 1108 supports the display 104 in all of the regions of bending.

Figure 11A:
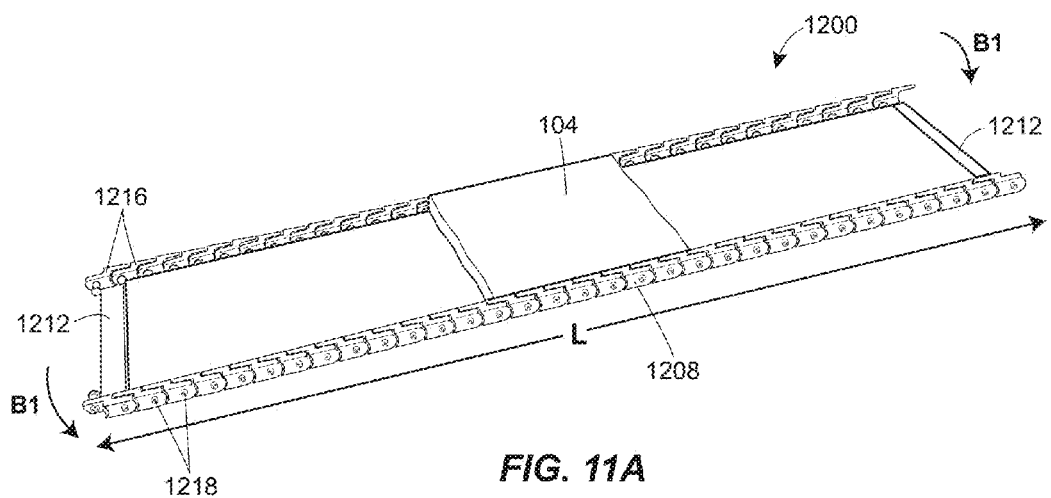
FIG. 11A illustrates an example attachable article having a flexible display and a seventh type of flexible support structure coupled to the flexible display, the seventh type of flexible support structure including a plurality of links pivotally connected to one another.
Figure 11B:
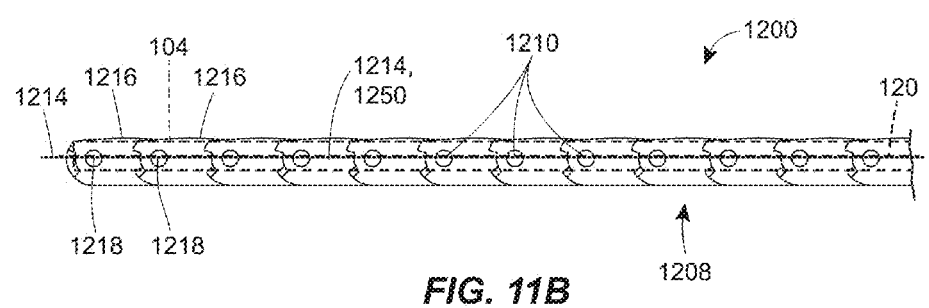
FIG. 11B is a side view of the article of FIG. 11A.

FIGS. 11A-11I depict another example of a dynamically flexible, attachable article 1200 constructed and assembled in accordance with the teachings of the present invention. The article 1200 includes the flexible display 104 and a flexible support 1208 coupled to the flexible display 104. The flexible display 104 in this example is configured for bending in one direction, the outward direction (i.e., such that the display 104 has a concave shape) indicated by the arrows B1 in FIG. 11A. The flexible support 1208 is configured to support the flexible display 104 but also limit local bending of the display 104 beyond its limit (e.g., the minimum bending radius of the display 104) in this outward direction. The flexible support 1208 is also configured to substantially limit local bending of the display 104 in the other direction (i.e., the inward direction). As illustrated in FIG. 11B, the flexible support 1208 creates or defines a plurality of hinge points 1210 that facilitate movement of the flexible support 1208 and, thus, the article 1200. The hinge points 1210 in this example are very close to, if not coincident with, the neutral plane 120 of the display 104, with the result that the support 1208 causes the article 1200 to have a bending plane (or bending planes) 1250, defined by the hinge points 1210, positioned co-planar with or very close to the position of the neutral plane 120 of the display 104 itself (see FIG. 11B). The flexible support 1208 thus causes the article 1200 to have a bending range that substantially corresponds to the bending range for the display 104 (i.e., the flexible support 1208 does not significantly, if at all, limit the bending range of the display 104). Advantageously, the flexible support 1208 also supports the flexible display 104 between each of these defined hinge points 1210, such that the flexible support 1208 supports the display 104 in all of the regions of bending. Thus, the flexible support 1208 fully supports the display 104 while substantially maintaining the bending ability (e.g., the bending range) of the display 104.

As illustrated in FIGS. 11A and 11B, the flexible support 1208 has a generally rectangular shape, a pair of opposing ends 1212, and a length L measured from one end 1212 to the other end 1212. The flexible support 1208 includes a plurality of links or support segments 1216 pivotally connected to one another via a plurality of pins 1218. When the flexible support 1208 is bent in the outward direction from the substantially flat position shown in FIG. 11A to a second, more curved or bent, position (e.g., the position shown in FIG. 11G), the links 1216 pivot in such a way that the length L of the flexible support 1208 below the hinge points 1210 decreases. At the same time, the links 1216 pivot in such a way that the length L of the flexible support 1208 along a continuous center line 1214 defined by the hinge points 1210 increases very slightly, with the result that there is an insignificant path length difference along the center line 1214 when the flexible support 1208 is bent over a range of different curvatures. This serves to prevent significant compressive or tensile loads from being imparted to the flexible display 104 as the article 1200 is bent, which would damage the flexible display 104.

Figure 11C:
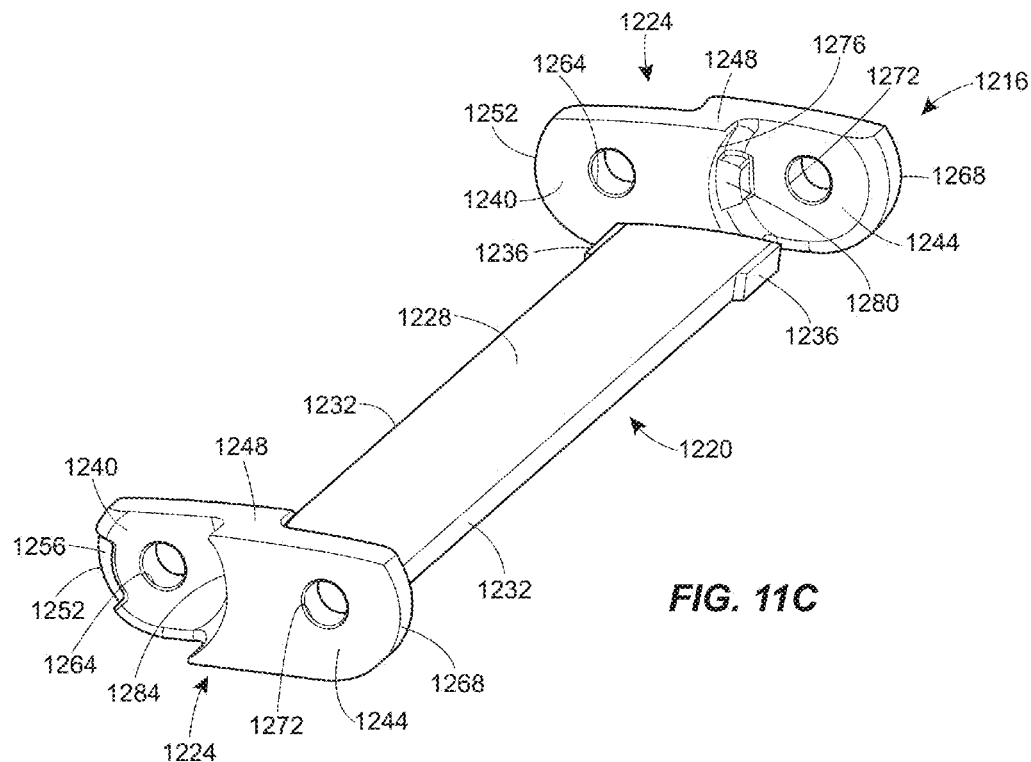
FIG. 11C illustrates one of the links of the seventh type of flexible support structure.

As shown in FIG. 11C, each link or support segment 1216 includes a base 1220 and a pair of sidewalls 1224 that extend upward from the base 1220 and extend longitudinally between the ends 1212 of the flexible support 1208. The base 1220 in this example has a substantially rectangular shape and includes a top surface 1228, a bottom surface (not shown), and a pair of side surfaces 1232. A pair of projections 1236 are coupled to and extend outward from each of the side surfaces 1232 (only two projections 1236 are visible in FIG. 11C). Each projection 1236 has a substantially rectangular shape and is positioned proximate or adjacent to one of the sidewalls 1224. Each sidewall 1224 has a step like configuration, with a first portion 1240, a second portion 1244 positioned outward of the first portion 1240, and a shoulder or transition portion 1248 connecting the first portion 1240 and the second portion 1244.

Figure 11D:
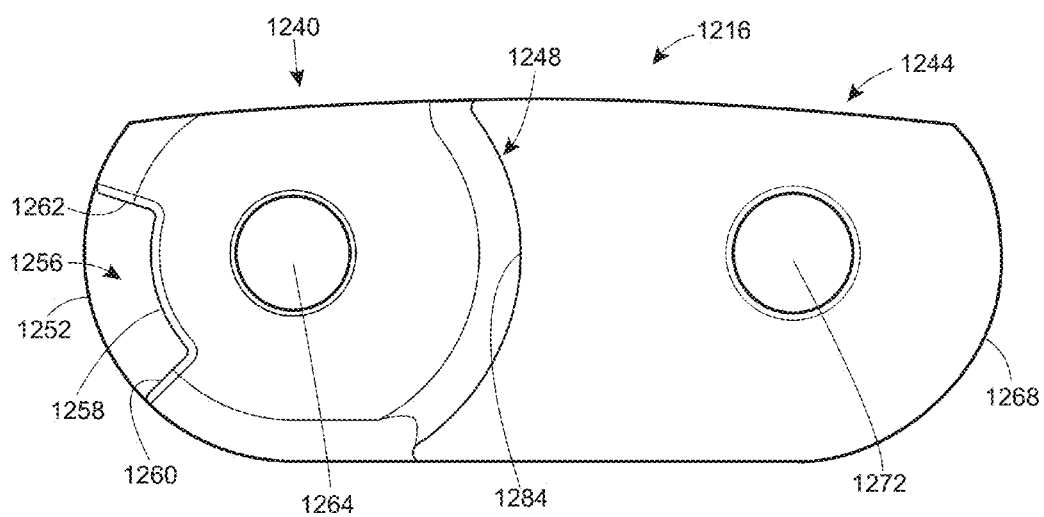
FIG. 11D is a close-up, end view of the link illustrated in FIG. 11C.

As illustrated in FIGS. 11C and 11D, each first portion 1240 has a curved end 1252 and a slot 1256 formed through the first portion 1240. As best illustrated in FIG. 11D, the slot 1256 is formed in one face of the first portion 1240 and has a curved trapezoidal shape defined by a curved inner surface 1258, a first or lower stop surface 1260, a second or upper stop surface 1262, and the curved end 1252. So constructed, each slot 1256 is generally configured to limit bending between adjacent links 1216. In this case, the first stop surface 1260 generally defines or corresponds to the most extreme bending that will be permitted when the article 1200 is bent in the outward direction, while the second stop surface 1262 generally defines or corresponds to the most extreme bending that will be permitted when the article 1200 is bent in the inward direction. As also illustrated in FIG. 11C, an aperture 1264 is formed in the first portion 1240. The aperture 1264 has a circular shape when viewed in cross-section. As depicted in FIG. 11C, the apertures 1264 of oppositely disposed first portions 1240 of each link 1216 are co-axially aligned with one another.

As also illustrated in FIGS. 11C and 11D, each second portion 1244 has a curved end 1268 and an aperture 1272 formed through the second portion 1244. Each aperture 1272 has an identical shape and size as the apertures 1264. Moreover, as with the apertures 1264, the apertures 1272 of oppositely disposed second portions 1244 of each link 1216 are co-axially aligned with one another.

As further illustrated in FIGS. 11C and 11D, the inward facing side of each shoulder or transition portion 1248 has a curved surface 1276 that faces away from the respective first portion 1240 and toward the respective second portion 1244. A tab 1280 is coupled to and projects outward from the curved surface 1276 of each shoulder 1248 (though only one tab 1280 is visible in FIG. 11C). The tab 1280 has a shape that matches the shape of the slot 1256 but is smaller in size than the slot 1256. As such, the tab 1280 is configured to be movably disposed within a corresponding slot 1256 and between the first and second stop surfaces 1260, 1262 of an adjacent link 1216, as will be described in greater detail below. The outward facing side of each shoulder 1248 has a curved surface 1284 that faces away from the respective second portion 1244 and toward the respective first portion 1240.

Figure 11E:
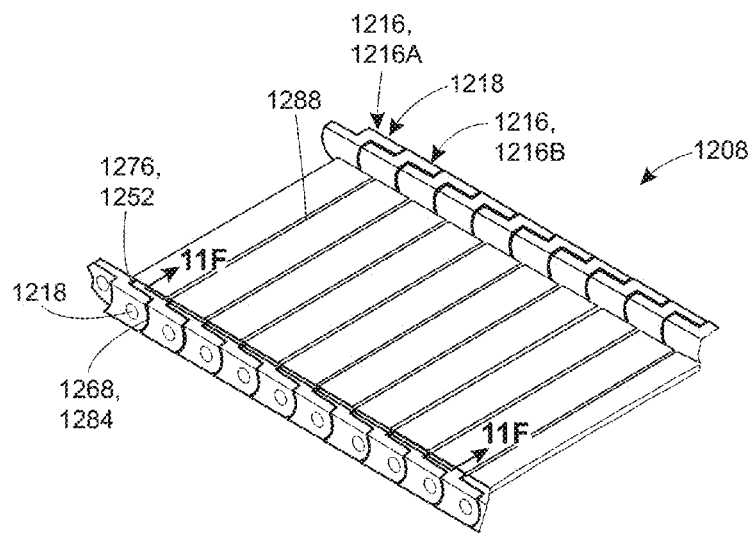
FIG. 11E illustrates a portion of the seventh type of flexible support structure.

Adjacent links 1216 are pivotally connected to one another as illustrated in FIG. 11E. To connect adjacent links 1216 (e.g., link 1216A and link 1216B) to one another, the two second portions 1244 of a first link 1216 (e.g., the link 1216A) are aligned with the two first portions 1240, respectively, of a second link 1216 (e.g., the link 1216B) that is adjacent to the first link 1216. More specifically, the two first portions 1240 of the second link 1216 (e.g., the link 1216B) are seated or disposed on or adjacent to the two second portions 1244, respectively, of the first link 1216 (e.g., the link 1216A), such that the apertures 1272 of the first link 1216 are co-axially aligned with the apertures 1264, respectively, of the second link 1216. As a result, (i) the two curved surfaces 1276 of the first link 1216 are in close proximity to the two curved ends 1252, respectively, of the second link 1216, with the two tabs 1280 of the first link 1216 movably disposed in the two slots 1256, respectively, of the second link 1216 (not visible in FIG. 11E), and (ii) the curved ends 1268 of the first link 1216 are in contact with or close proximity to the curved surfaces 1284, respectively, of the second link 1216. In turn, one pin 1218 is fixedly disposed within each of the two pairs of co-axially aligned apertures 1272, 1264. Accordingly, the first and second links 1216 are pivotally connected to one another via two pins 1218. Though this process is only explicitly described for two adjacent links 1216, it will be appreciated that other adjacent links 1216 in the flexible support 1208 are pivotally connected to one another in a similar manner. In this manner, the flexible support 1208 defines or creates the hinge points 1210, which serve to facilitate movement of the flexible support 1208 between various positions.

Figure 11F:
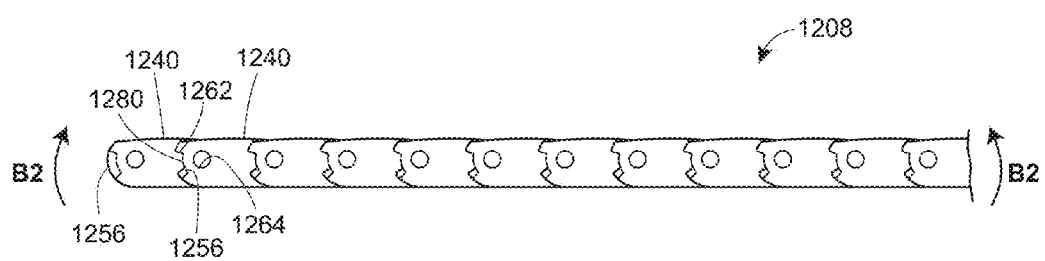
FIG. 11F is a cross-sectional view, taken along line 11F-11F in FIG. 11E, showing a portion of the seventh type of flexible support structure in a substantially flat position.
Figure 11G:
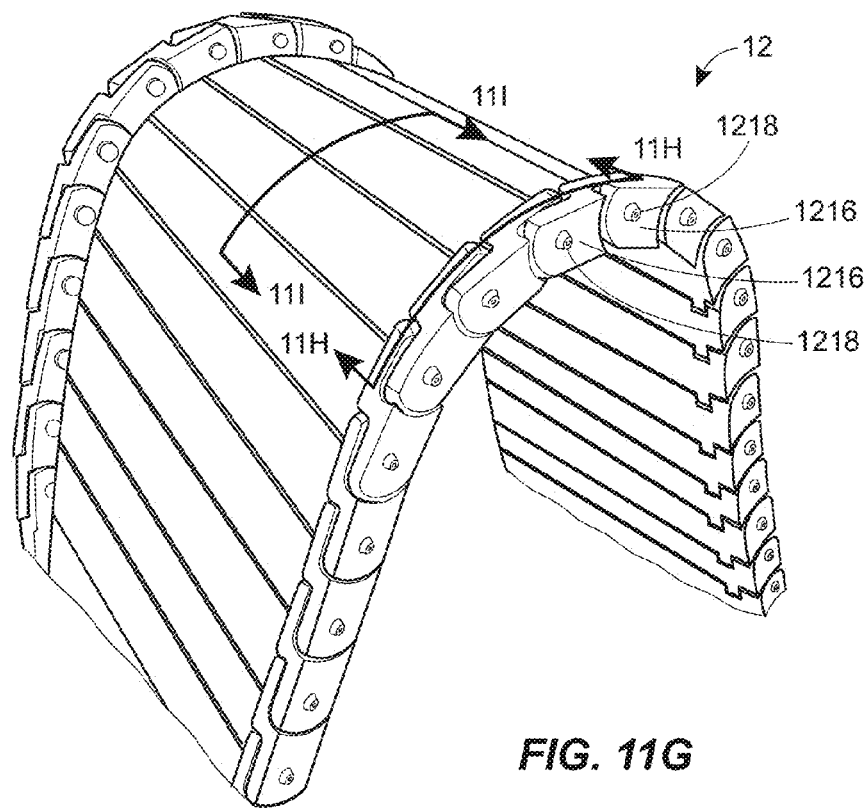
FIG. 11G illustrates the seventh type of flexible support structure bent or curved in an outward direction.

When the links 1216 are connected in the above-described manner and the support 1208 is in its initial position, the substantially flat position illustrated in FIG. 11A, there exists a small gap or space 1288 between adjacent links 1216, as illustrated in FIG. 11E. Each gap 1288 is defined by or between the side surfaces 1232 and projections 1236 of adjacent links 1216. In some cases, this gap 1288 may be used to help define the amount of bending that will be permitted between the respective adjacent links 1216, and, more generally, by the support 1208. Moreover, when the support 1208 is in its initial position, each tab 1280 is, at least in this case, in contact with the second stop surface 1262 of its corresponding slot 1216, as depicted in FIG. 11F. As such, the second stop surfaces 1262 prevent upward movement of the tabs 1280, respectively, such that the support 1208 cannot be bent in the inward direction (see the arrows B2 in FIG. 11F) beyond this substantially flat position.

Figure 11H:
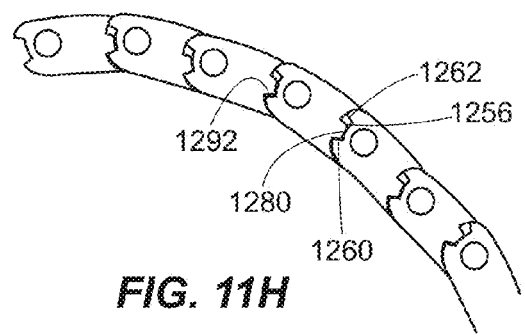
FIGS. 11H and 11I are cross-sectional views, taken along lines 11H-11H and 11I-11I in FIG. 11G, of a portion of the seventh type of flexible support structure.
Figure 11I:
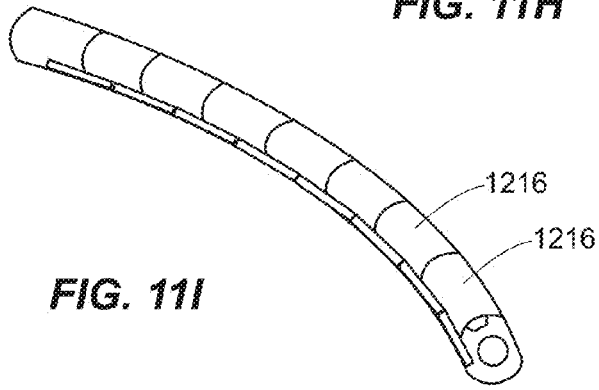

So constructed, the flexible support 1208 can be coupled to the flexible display 104. In this example, the flexible display 104 is seated or disposed between or within the sidewalls 1224 of the links 1216 of the flexible support 1208. In turn, the flexible support 1208 is configured to limit bending of the flexible display 104 beyond its bending limit (e.g., beyond its minimum bending radius) when the article 1200 is bent or curved in the outward direction (indicated by the arrows B1 in FIG. 11A). When the article 1200 is bent or curved in the outward direction from the substantially flat initial position illustrated in FIG. 11A to a second, more bent position (e.g., the bent position shown in FIG. 11G), the gaps or spaces 1288 between the adjacent links 1216 can, by virtue of their size (e.g., width), limit the amount of bending between the adjacent links 1216, and, in turn, limit the bending of the flexible display 104. Moreover, the interaction between corresponding slots 1256 and tabs 1280 can also limit the amount of bending between the adjacent links 1216, which can, in turn, limit the bending of the flexible display 104. More specifically, when the article 1200 is bent or curved in the outward direction from the substantially flat initial position illustrated in FIG. 11A to the second, more bent position (e.g., the bent position shown in FIG. 11G), the applied bending force causes adjacent links 1216 to pivot relative to one another about the hinge points 1210. In turn, adjacent links 1216 move closer to one another, thereby shrinking the gap or space 1288 between each pair of adjacent links 1216, and each tab 1280 moves away from the second stop surface 1262 and toward the first stop surface 1260 within its corresponding slot 1256. At some point, the article 1200 will be bent to such a degree (i.e., corresponding to the maximum bending amount) that the projections 1236 of adjacent links 1216 contact one another and the gap or spaces 1288 are substantially closed, as depicted in FIG. 11I, and a leading surface 1292 of each tab 1280 contacts the first stop surface 1260 within the corresponding respective slot 1256, as depicted in FIG. 11H. When this happens, any further local bending of the article 1200, particularly the flexible display 104, in the outward direction is prevented. Of course, it will be appreciated that further bending can be limited in a different manner. More specifically, the three ways of limiting further local bending described in this paragraph need not utilized in combination to limit further local bending. For example, further bending can be limited using only the projections 1236 (which, when in contact with another, can adequately prevent further local bending), only the gaps or spaces 1288 (which, when substantially closed, can adequately prevent further local bending), only the first stop surfaces 1260 (which, when contacted by the leading surface 1292 of a respective tab 1280, can adequately prevent further local bending), or using two or more of these ways. Stated another way, the projections 1236 can be omitted, the gaps or spaces 1288 can be omitted, and/or the first stop surfaces 1260 can be omitted.

The flexible support 1208 can also limit the bending of the flexible display 104 in the inward direction. More specifically, the flexible support 1208 prevents bending of the flexible display 104 in the inward direction beyond the substantially flat position illustrated in FIG. 11A. This is accomplished via the interaction between corresponding slots 1256 and slots 1280, much like above. When the article 1200 is in a bent position as a result of bending in the outward direction (e.g., the bent position shown in FIG. 11G) and is bent or curved in the inward direction, the applied bending force causes adjacent links 1216 to pivot relative to one another about the hinge points 1210. In turn, adjacent links 1216 move apart from one another, thereby increasing the gap or space 1288 between each pair of adjacent links 1216, and each tab 1280 moves away from the first stop surface 1260 and toward the second stop surface 1262 within its corresponding slot 1256. Eventually, the leading surface 1292 of each tab 1280 will contact the second stop surface 1262 within the corresponding respective slot 1256, as depicted in FIG. 11F, at which time the article 1200 has been bent back inward to the substantially flat position shown in FIG. 11A. When this happens, any further local bending of the article 1200, particularly the flexible display 104, in the inward direction is prevented.

In other examples, the size, number, shape, curvature, and/or features of the links 1216 can be varied to define different bending limits for the article 1200. More specifically, the size, number, shape, curvature, and/or features of the base 1220 and/or the sidewalls 1224 of one or more of the links 1216 can be varied to define different bending limits for the article 1200. In some cases, it may be desirable to alter the flexible support 1208 to eliminate, or at least reduce, the change in length L along the neutral plane 120 of the display 104 when it is moved between the substantially flat position shown in FIG. 11A and a second, more curved position (e.g., the position shown in FIG. 11G). To this end, the apertures 1264 and 1272 can be formed in the links 1216 at a higher position (i.e., further away from the base 1220) or a lower position (i.e., closer to the base 1220), thereby varying the position of the hinge points 1210 relative to the neutral plane 120 of the display 104. In some cases, the hinge points 1210 can be moved above the neutral plane 120, while in other cases, the hinge points 1210 can be moved below the neutral plane 120. In some examples, the size, shape, and/or curvature of the tabs 1280 can be varied to define different bending limits for the article 1200. Moreover, when the flexible display 104 is coupled to the flexible support 1208 via an interlayer (e.g., the interlayer 106), the thickness of the interlayer can be entirely or locally increased or decreased to vary the position of the hinge points 1210 relative to the neutral plane 120 of the display 104.

In other examples, the size, shape, and/or curvature of the slots 1256 can be varied to define different bending limits for the article 1200. For example, the position of the first stop surfaces 1260 can be adjusted to permit more or less bending in the outward direction. As another example, the position of the second stop surfaces 1262 can be adjusted to permit more or less bending in the inward direction (e.g., bending in the inward direction beyond the substantially flat position shown in FIG. 11A). In yet other examples, the width of the gap 1288 can be increased or decreased to adjust the amount of permissible bending between adjacent links 1216.

FIGS. 12A-12I depict yet another example of a dynamically flexible, attachable article 1300 constructed and assembled in accordance with the teachings of the present invention. The article 1300 includes the flexible display 104 and a flexible support 1308 that can be coupled to the flexible display 104 via an interlayer, such as, for example, the interlayer 106 (see FIG. 12B). The flexible display 104 in this example is configured for bending in one direction, the outward direction (i.e., such that the display 104 has a concave shape) indicated by the arrows B1 in FIG. 12A. The flexible support 1308 is configured to support the flexible display 104 but also limit local bending of the display 104 beyond its limit (e.g., the minimum bending radius of the display 104) in this outward direction. The flexible support 1308 is also configured to substantially limit local bending of the display 104 in the other direction (i.e., the inward direction). A portion of the flexible support 1308 is configured to shrink when the article 1300 is bent in the outward direction from the position shown in FIG. 12A to a second, more curved or bent, position (e.g., the position shown in FIG. 12G, FIG. 12H, FIG. 12I, FIG. 12J). The flexible support 1308 creates or defines a plurality of virtual hinge points 1310 that facilitate rotation and translation of portions of the flexible support 1308. The hinge points 1310 are very close to the neutral plane 120 of the display 104, with the result that the support 1308 causes the article 1300 to have a bending plane (or bending planes) 1350, defined by the hinge points 1310, that is very close to the neutral plane 120 of the display 104 itself. Thus, the flexible support 1308 fully supports the display 104 while substantially maintaining the bending ability of the display 104 (i.e., the support 1308 does not significantly further limit the bending ability of the display 104).

Figure 12A:
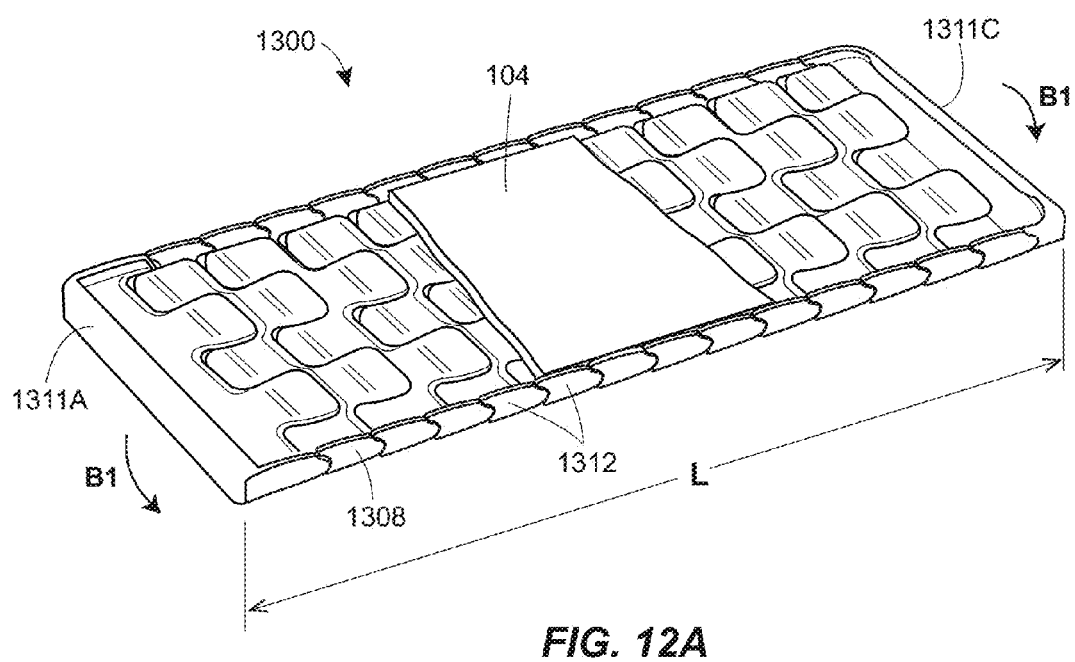
FIG. 12A illustrates an example attachable article having a flexible display and an eighth type of flexible support structure coupled to the flexible display via an interlayer, the eighth type of flexible support structure including a plurality of links pivotally and slidably connected to one another.

The flexible support 1308 is functionally similar to, but has a different geometry than, the flexible support 908 described above. As illustrated in FIG. 12A, the flexible support 1308 has a first end 1311A, a second end 1311C opposite the first end 1311A, and a length L measured from the first end 1311A to the second end 1311C. The flexible support 1308 includes a plurality of links or support sections 1312 pivotally and slidably connected to one another via a plurality of pins 1316. When the flexible support 1308 is bent in the outward direction from the first position to the second, more curved or bent, position, the links 1312 slide and pivot in such a way that the length L of the flexible support 1308 below the hinge points 1310 decreases. At the same time, the links 1312 slide and pivot in such a way that the length L of the flexible support 1308 along a center line defined by the hinge points 1310 remains substantially the same if not exactly the same, with the result that there is an insignificant, if not no, path length difference along the center line when the flexible support 1308 is bent over a range of different curvatures. This serves to prevent any additional compressive or tensile loads from being imparted to the flexible display 104 (beyond what the display 104 would experience without the support 1308) as the article 1300 is bent, which would damage the display 104.

Figure 12B:
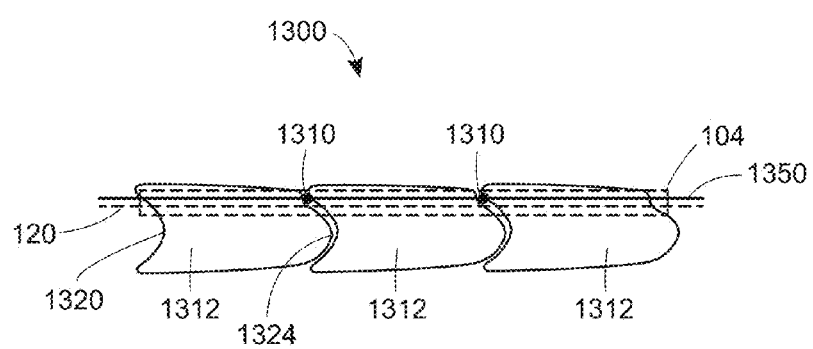
FIG. 12B is a side view of a portion of the article of FIG. 12A.
Figure 12C:
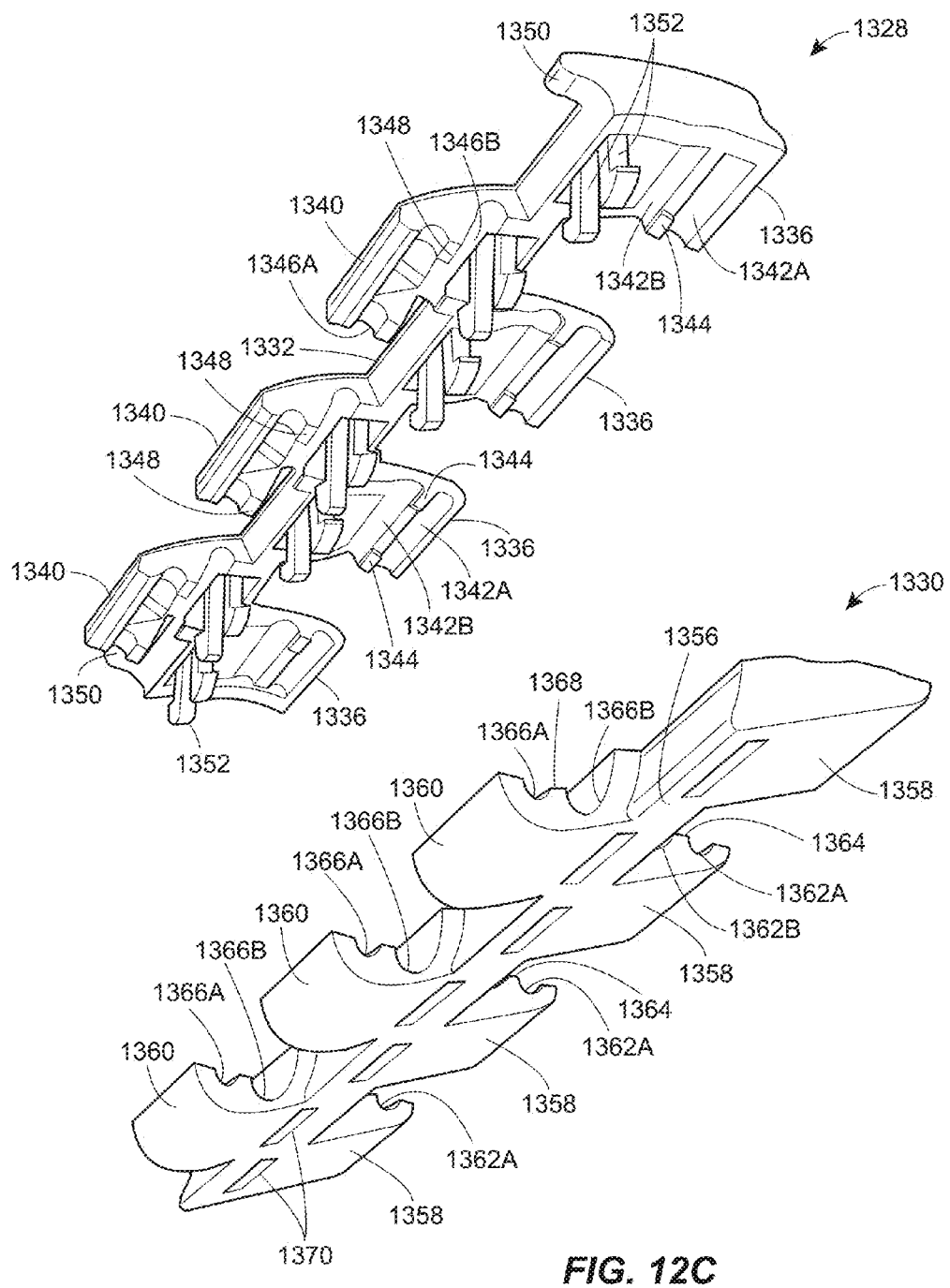
FIG. 12C is an exploded view of one of the links of the eighth type of flexible support structure, the link having a first housing portion and a second housing portion coupled to the first housing portion.

As generally illustrated in FIGS. 12B and 12C, each link or support section 1312 has a somewhat arched or curved shape and defines a first end 1320 and a second end 1324 opposite the first end 1320. As illustrated in FIG. 12C, which is a close-up view of one of the links 1312, each link or support section 1312 includes or is defined by a first housing 1328 and a second housing 1330 coupled to the first housing 1328. Each first housing 1328 includes a transversely extending base 1332, a plurality of projections 1336 that extend outward from the base 1332 in a first direction, and a plurality of projections 1340 that are offset from the projections 1336 and extend outward from the base 1332 in second direction opposite the first direction. Each of the projections 1336 includes two openings 1342A, 1342B defined and separated by a pair of protuberances 1344 that extend downward and are aligned with one another. The opening 1342A has a semi-circular shape (when viewed in cross-section), while the opening 1342B has a substantially semi-oval shape (when viewed in cross-section). Each of the projections 1340 includes openings 1346A, 1346B defined and separated by a pair of protuberances 1348 that extend downward and are aligned with one another. The opening 1346A, like the opening 1342A, has a semi-circular shape (when viewed in cross-section), while the opening 1346B, like the opening 1342B, has a substantially semi-oval shape (when viewed in cross-section). Each housing 1328 also includes a pair of curved end portions 1350 that extend outward from the base 1332 at or proximate to the ends of the base 1332. The end portions 1350 extend outward from the base 1332 in the same direction as the projections 1340 and are substantially aligned with the openings 1346B of each of the projections 1340. Each of the projections 1336 and 1340 further includes a pair of tabs 1352 that are formed at or proximate to, and extend downward from, the base 1332. Each of the tabs 1352 has a hook-like shape, with each pair of tabs 1352 being symmetrically arranged about a longitudinal axis oriented perpendicular to the length of the base 1332 (the length extending in the transverse direction).

With reference still to FIG. 12C, each second housing 1330 includes a transversely extending base 1356, a plurality of projections 1358 that extend outward from the base 1356 in a first direction, and a plurality of projections 1360 that are offset from the projections 1358 and extend outward from the base 1356 in a second direction opposite the first direction. The projections 1358 have a size and shape that generally corresponds to the size and shape of the projections 1336, while the projections 1360 have a size and shape that generally corresponds to the size and shape of the projections 1340. More specifically, each of the projections 1358 includes two openings 1362A, 1362B defined and separated by a pair of protuberances 1364 (only one of each pair is visible in FIG. 12C) that extend upward and are aligned with one another. The opening 1362A has a semi-circular shape (when viewed in cross-section), while the opening 1362B has a substantially semi-oval shape (when viewed in cross-section). Each of the projections 1360 includes two openings 1366A, 1366B defined and separated by a pair of protuberances 1368 (only one of each pair is visible in FIG. 12C) that extend upward and are aligned with one another. The opening 1366A, like the opening 1362A, has a semi-circular shape (when viewed in cross-section), while the opening 1366B, like the opening 1362B, has a substantially semi-oval shape (when viewed in cross-section). Each of the projections 1358, 1360 also includes a groove 1370 that is formed in a bottom surface therein. The grooves 1370 are sized to receive a respective pair of tabs 1352 therein when the first and second housings 1328, 1330 are coupled to one another.

Figure 12D:
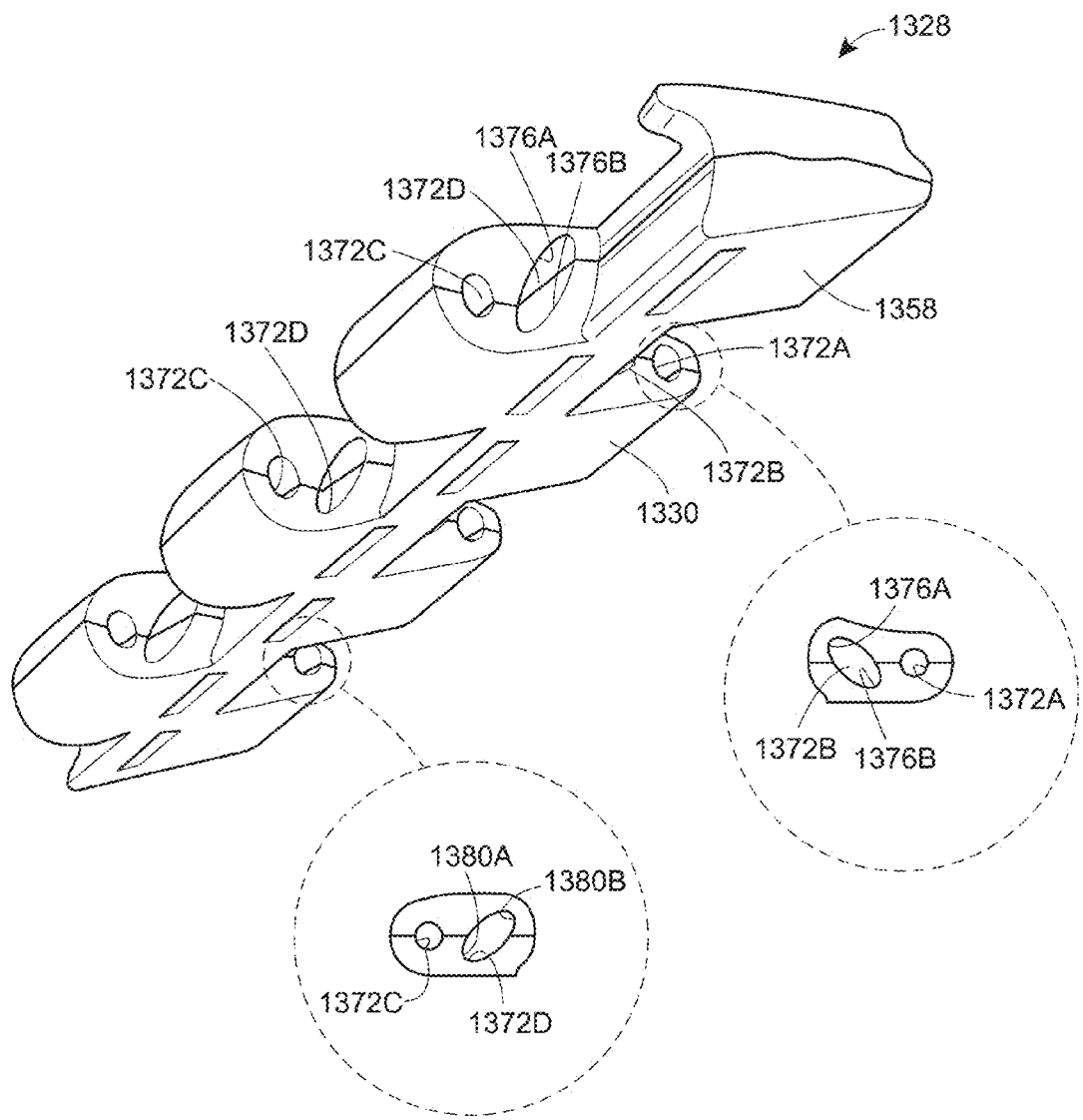
FIG. 12D illustrates the link of FIG. 12C when the first and second housing portions are coupled together.

FIG. 12D depicts the first and second housings 1328, 1330 when coupled together by aligning the projections 1336 with the projections 1358 and the projections 1340 with the projections 1360 and inserting each pair of tabs 1352 into a corresponding groove 1370 until the tabs 1352 are snapped into place within the groove 1370. In turn, the above-described openings of the first and second housings 1328, 1330 define a plurality of different slots. Specifically, the openings 1342A formed in the first housing 1328 cooperate with the openings 1362A formed in the second housing 1330 to form a first slot 1372A proximate to the second end 1324, the openings 1342B formed in the first housing 1328 cooperate with the openings 1362B formed in the second housing 1330 to form a second slot 1372B proximate to the second end 1324, the openings 1346A formed in the first housing 1328 cooperate with the openings 1366A formed in the second housing 1330 to form a third slot 1372C proximate to the first end 1320, and the openings 1346B formed in the first housing 1328 cooperate with the openings 1366B formed in the second housing 1330 to form a fourth slot 1372D proximate to the first end 1320. The first and third slots 1372A, 1372C, respectively, each have a substantially circular shape (when viewed in cross-section). The second and fourth slots 1372B, 1372D, respectively, each have a substantially oval shape (when viewed in cross-section). As illustrated in FIG. 12D, the second slot 1372B and the fourth slot 1372D are angled relative to one another.

The slots 1372A-1372D are generally configured to limit bending between adjacent links 1312. The first slot 1372A, which has a substantially circular shape in cross-section, guides a respective pin 1316 fixedly disposed therein. The second slot 1372B, which has a substantially oval shape in cross-section, defines a guide path for a respective one of the pins 1316 to be movably disposed therein, with ends 1376A, 1376B of the second slot 1372B serving as stop surfaces that define the most extreme bending positions of the article 1300. The third slot 1372C, which has a substantially circular shape in cross-section, guides a respective pin 1316 fixedly disposed therein. The fourth slot 1372D, which has a substantially oval shape in cross-section, defines a guide path for a respective one of the pins 1316 to be movably disposed therein, with ends 1380A, 1380B of the fourth slot 1372D serving as stop surfaces that define the most extreme bending positions of the article 1300. It will be appreciated that the ends 1376A and 1380B correspond to the same extreme bending position, while the ends 1376B and 1380A correspond to the same extreme bending position.

Figure 12E:
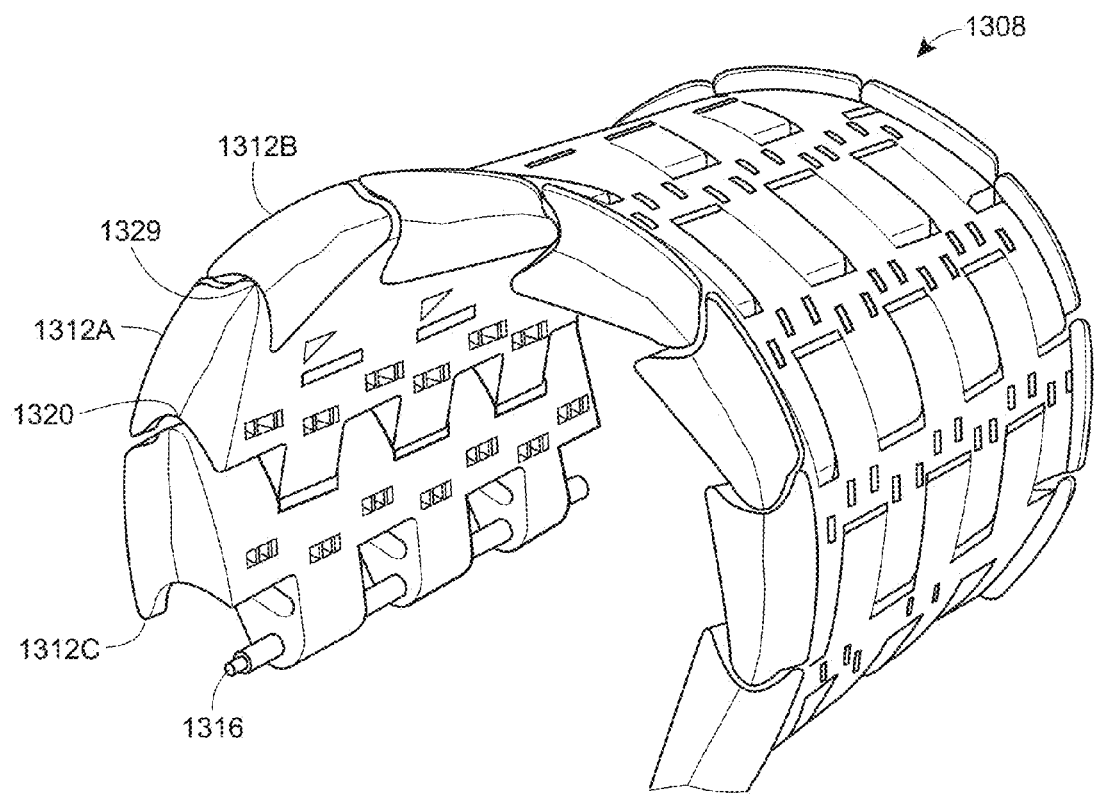
FIG. 12E depicts a plurality of links pivotally and slidably connected to one another via a plurality of pins to form the eighth type of flexible support structure.
Figure 12F:
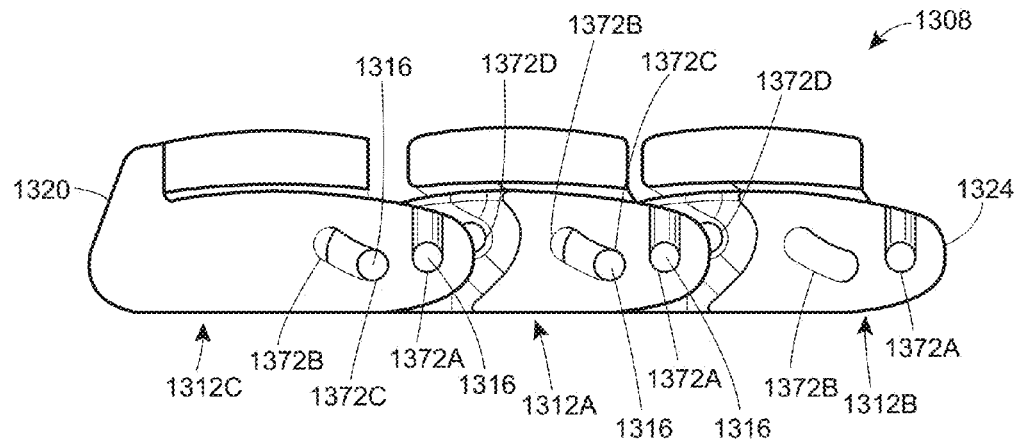
FIG. 12F illustrates a portion of the eighth type of flexible support structure when the support structure is in a substantially flat position.
Figure 12G:
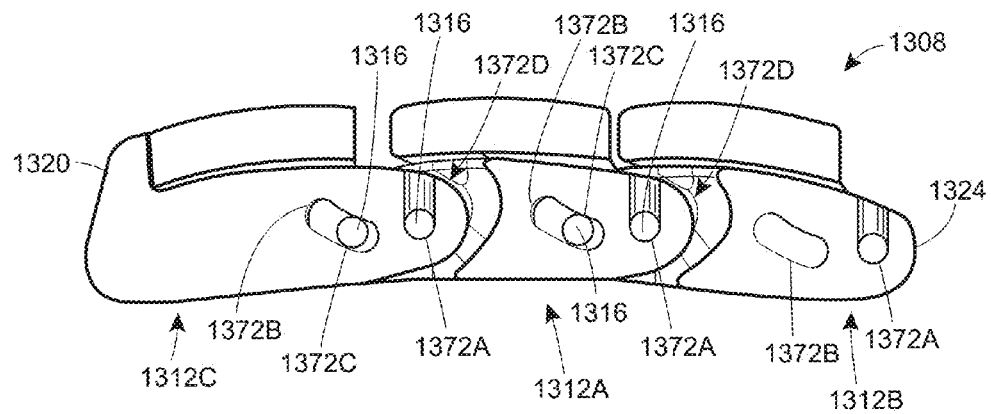
FIG. 12G illustrates the portion of the flexible support structure depicted in FIG. 12F bent or curved in an outward direction.
Figure 12H:
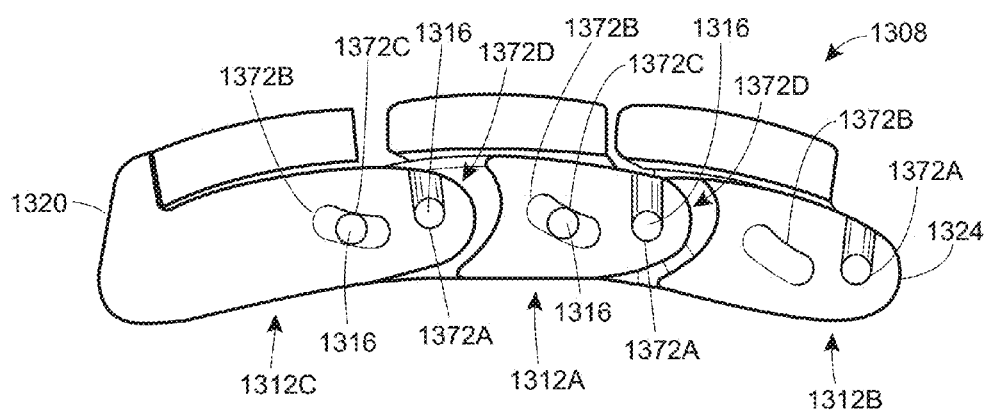
FIG. 12H illustrates the portion of the flexible support structure depicted in FIG. 12G further bent or curved in the outward direction.
Figure 12I:
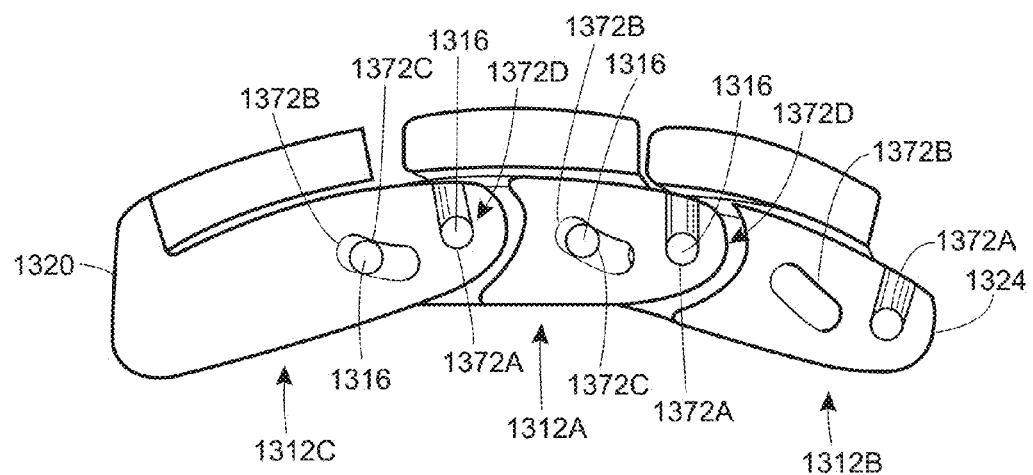
FIG. 12I illustrates the portion of the flexible support structure depicted in FIG. 12H further bent or curved in the outward direction.

Adjacent links 1312 in the flexible support 1308, such as links 1312A, 1312B, and 1312C, are slidably and pivotally connected to one another via the plurality of pins 1316 in the offset manner illustrated in FIG. 12E. More specifically, the first and second slots 1372A, 1372B of the first link 1312A are offset from but aligned with the third and fourth slots 1372C, 1372D of the second link 1312B disposed adjacent to the second end 1324 of that first link 1312A, and the third and fourth slots 1372C, 1372D of the first link 1312A are offset from but aligned with the first and second slots 1372A, 1372B of the third link 1312C disposed adjacent to the first end 1320 of the first link 1312A. In turn, (i) the pin 1316 fixedly disposed in the first slot 1372A of the first link 1312A is slidably disposed within the fourth slot 1372D of the second link 1312B, (ii) the pin 1316 fixedly disposed in the third slot 1372C of the second link 1312B is slidably disposed within the second slot 1372B of the first link 1312A, (iii) the pin 1316 fixedly disposed in the third slot 1372C of the first link 1312A is slidably disposed within the second slot 1372B of the third link 1312C, and (iv) the pin 1316 fixedly disposed in the first slot 1372A of the third link 1312C is slidably disposed within the fourth slot 1372D of the first link 1312A. It will be appreciated that other adjacent links 1312 in the flexible support 1308 are slidably connected to one another in a similar manner.

Figure 12J:
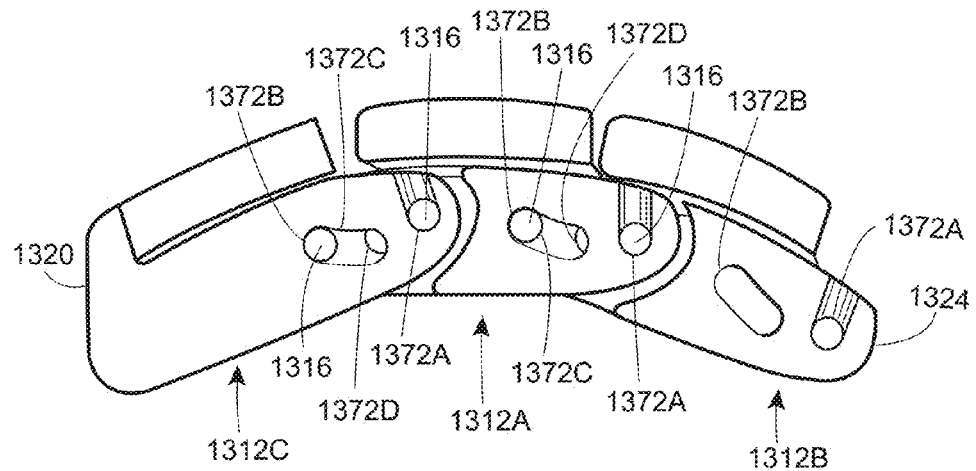
FIG. 12J illustrates the portion of the flexible support structure depicted in FIG. 12I further bent or curved in the outward direction.

The flexible support 1308, defined as detailed above, can limit bending of the flexible display 104 beyond its bending limit (e.g., beyond its minimum bending radius) when the article 1300 is bent or curved in the outward direction (indicated by the arrows B1 in FIG. 12A). When the article 1300 is bent or curved in the outward direction from its initial position, the substantially flat position shown in FIGS. 12A and 12F, to a second, more bent, position, such as the first intermediate position shown in FIG. 12G, the applied bending force causes the pins 1316 to slide within the respective slots 1372B, 1372D from the positions shown in FIG. 12F to the positions shown in FIG. 12G. Beneficially, because the slots 1372B and 1372D are angled relative to one another, this prevents the article 1300 from being stretched or compressed when the article 1300 is being bent or curved in the outward direction. As, however, the pins 1316 are disposed between the ends 1376A, 1376B and 1380A, 1380B of the respective slots 1372B, 1372D when the article 1300 is in the position shown in FIG. 12G, further bending of the article 1300 in the outward direction is possible. When the article 1300 is bent or curved in the outward direction from the first intermediate position shown in FIG. 12G, to a third, more bent, position, such as the second intermediate position shown in FIG. 12H, the applied bending force causes the pins 1316 to slide within the respective slots 1372B, 1372D from the positions shown in FIG. 12G to the positions shown in FIG. 12H. As the pins 1316 are disposed between the ends 1376A, 1376B and 1380A, 1380B of the respective slots 1372B, 1372D when the article 1300 is in the position shown in FIG. 12H, further bending of the article 1300 in the outward direction is possible. When the article 1300 is bent or curved in the outward direction from the second intermediate position shown in FIG. 12H, to a fourth, more bent, position, such as the third intermediate position shown in FIG. 12I, the applied bending force causes the pins 1316 to slide within the respective slots 1372B, 1372D from the positions shown in FIG. 12H to the positions shown in FIG. 12I. As the pins 1316 are disposed between the ends 1376A, 1376B and 1380A, 1380B of the respective slots 1372B, 1372D when the article 1300 is in the position shown in FIG. 12I, further bending of the article 1300 in the outward direction is possible. When the article 1300 is further bent or curved in the outward direction from the position shown in FIG. 12I to a fourth, more bent, position, such as the position shown in FIG. 12J, the applied bending force causes the pins 1316 to slide from the positions shown in FIG. 12I to the positions shown in FIG. 12J. When the pins 1316 are positioned as shown in FIG. 12J, the pins 1316 are in contact with the ends 1376A, 1380B of the slots 1372B, 1372D, respectively, and no further slidable movement is possible, such that any further bending of the article 1300 in the outward direction is prevented.

At the same time, the flexible support 1308, so constructed, defines or creates the virtual hinge points 1310. With reference to FIG. 12B, the hinge points 1310 are formed or defined at a position substantially above the links 1312 and very close to the neutral plane 120 of the display 104, which in this example is seated or disposed between opposing wall or ends formed by the projections disposed at the end of each link 1312 (the projections at the end have a greater height, or extend further upward and downward, than the projections therebetween) (see FIG. 12E). As a result, the flexible support 1308 causes the bending plane(s) 1350 of the article 1300 to be very close to the position of the neutral plane 120 of the display 104. The flexible support 1308 thus allows the article 1300 to have a bending range that substantially corresponds to the bending range for the display 104 (i.e., the flexible support 1308 does not significantly, if at all, limit the bending range of the display 104). Advantageously, the flexible support 1308 also supports the flexible display 104 between each of these defined virtual hinge points 1310, such that the flexible support 1308 supports the display 104 in all of the regions of bending.

In other examples, the links 1312 can vary from the links 1312 illustrated herein and/or the links 1312 can be connected to one another in a different manner. In some examples, the size, number, shape, curvature, and/or features of the links 1312 can be varied to define different bending limits for the article 1300. For example, the size, shape, and/or curvature of the slots 1372A, 1372B, 1372C, 1372D can be varied to define different bending limits for the article 900. In other examples, the plurality of hinge points 1310 can be defined or formed in a different position (e.g., closer to the neutral plane 120). For example, the hinge points 1310 can be defined or formed such that the hinges 1310 substantially overlap with (e.g., lie in) the neutral plane 120 of the display 104.

Figure 13:
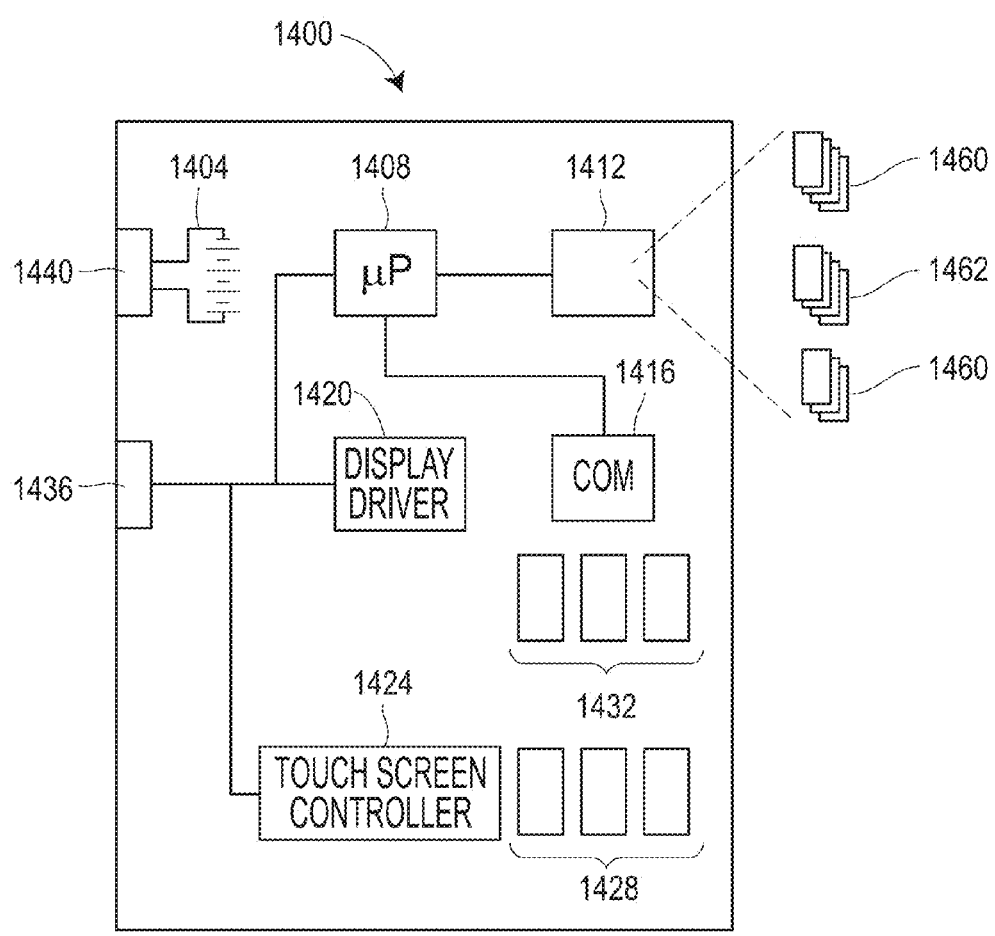
FIG. 13 is a block diagram of an electronics module that can be utilized in connection with any of the articles described herein.

FIG. 13 illustrates a block diagram of various electronic components, referred to herein as an electronics suite 1400, that may be used in or disposed in an electronics module (e.g., the electronics module 124) to drive a flexible electronic component (e.g., the flexible display 104) of an article (e.g., the article 100). In particular, the electronics suite 1400 illustrated in FIG. 13 includes a battery 1404 that powers a number of other modules or electronic components including a microprocessor or other processor 1408, a computer readable memory 1412, which may be, for example, a flash memory or other suitable type of non-transitory, tangible, data storage medium, a communication module 1416, a display driver 1420, a touch screen controller 1424 and a number of sensors 1428 and other secondary devices 1432. The sensors 1428 may include, for example, an impact sensor or step counter, one or more gyroscopic sensors or gyroscopes, temperature sensors, vibration sensors, pulse rate monitors, pressure sensors, strain gauges, etc. The secondary electronic devices 1432 may include, for example, an alarm or noise creation device, a speaker, a microphone, or a vibrator the operation of which causes the electronics module 19 to vibrate, etc. Although FIG. 13 illustrates the sensors 1428 and the secondary electronic devices 1432 as being integral with the electronics suite 1400, in some cases, one or more of the sensors 1428 and/or the secondary electronic devices 1432 are physically disposed at another location on or in the article (e.g., separate from the remainder of the electronics suite 1400). In these cases, though, the separately disposed sensors 1428 and/or secondary electronic devices 1432 remain in communicative connection with the remainder of the electronics suite 1400 (e.g., via a wired or wireless connection).

Similarly, although FIG. 13 illustrates the display driver 1420 as being integral with the electronics suite 1400, in some cases, the display driver 1420 is physically disposed at another location separate from the remainder of the electronics suite 1400. In an example, the display driver 1420 is disposed in a location that is proximate to the electrodes or connectors of the pixel elements of the flexible electronic component, e.g., on the backplane of the flexible electronic component or at some other suitable location. The separately located display driver 1420, though, remains in communicative connection with the remainder of the electronics suite 1400 (e.g., via a wired or wireless connection) despite of the remote locations.

As will be understood, the memory 1412, the communication module 1416, the display driver 1420 and the touch screen controller 1424, as well as the sensors 1428 and other secondary electronic devices 1432, are communicatively connected to the processor 1408 and may operate to perform various functions in conjunction with applications or other programs implemented by the processor 1408. Still further, each of these elements is connected to and is powered by the battery 1404 in any known or desired manner. Still further, the electronics suite 1400 of FIG. 13 may include one or more communication ports, such as communication port 1436 (e.g., a USB or other type of digital communication port) and a power or battery charger input port 1440. In this case, the power input port 1440 may be connected to the battery 1404 and enable charging or recharging of the battery 1404 using any known or desired recharging circuitry and methodology. Alternatively or in addition, the communications input port 1436 (in the form of for example, a USB input port) may be connected to the battery 1404 and provide power to the battery 1404 for charging battery 1404, and the input port 1436 may also be connected to the microprocessor 1408, as well as to the communication circuit module 1416, for performing wired-based communications via the input port 1436. Of course, the communication input port 1436, while being illustrated as a USB-type connection, could any other type of known wired or physical communication connection, including any desired serial or parallel digital communication port using any number of pins or wires, as is known in the art, an analog communication port, etc. In another embodiment, the power input port 1440 may be a wireless input port, and in this case may, for example, be part of a battery charger unit that operates to charge the battery 1404 using, for example, an inductively coupled charging technique. If the battery charger unit is part of an inductively coupled charging system, it generally responds to electromagnetic waves produced by an exterior charging unit (not shown) to charge the battery 1404 when the article is disposed near the external charging unit. In another case, the battery charger of the input port 1440 may be a kinetic energy charger unit that converts motion of the article (such as that associated with movement of an arm when the article is in the form of a wristband, as shown in FIGS. 2A-2C) into electrical energy which is provided to charge the battery 1404.

As will be understood, the processor 1408, which may be a programmable, general-purpose processor or a specially programmed processor programmed using any desired type of hardware or firmware programming, generally coordinates and implements the operation of the flexible electronic component and the associated electronic components as described in more detail herein. The computer readable memory 1412 stores various applications, including for example the general operating system implemented by the processor 1408, and various applications (illustrated as a set of applications 1460 in FIG. 13) to be run on the processor 1408 to implement various different types of functionality via the article, some of which will be described in more detail herein. The memory 1412 may also store one or more data files 1462, which may be, for example, image or video data files associated with various images to be displayed on the flexible electronic component at various different times. Still further, the memory 1412 may store application data that may be created by the various applications 1460 or the microprocessor 1408 as part of the operation of various applications 1460 and to be used by those applications 1460 either during runtime of the applications 1460 or at other times. If desired, the microprocessor 1408 or one of the secondary electronic components 1428 may include or be a clock that tracks the current time, day, date, month, year, time zone, etc.

As an example, one or more of the applications 1460 may implement various functionalities typically associated with standard computers or other types of electronic devices such as personal handheld electronic devices, including for example an e-mail application, an Internet or web-browsing application, an alarm clock application, a calendar application, a music-playing application such as an MP3 application, a video application, a digital picture slideshow application, a mapping application, an e-reading application which may provide books, notes, magazines or other types of articles, for reading by the user, etc. Still further, one or more of the applications 1460 may operate on the processor 1408 to turn the flexible electronic component associated with the dynamically flexible article into a slave display device that may be tied to or communicably coupled to an exterior master device that is generating content to be displayed via the flexible electronic component. The master device, which may be a smart phone or a nearby computer device, may be wirelessly connected to the electronics suite 1400 to provide content to be displayed on the flexible electronic component and will typically have more memory, and computing and processing power than the processor 1408.

The communication module 1416 of FIG. 13 may include or use any type of communication hardware/software/firmware that uses any desired types of communication techniques to enable the microprocessor 1408 to communicate with exterior devices or sources. Of course, the communication module 1416 could include multiple different types of communication hardware/software/firmware, including any kind of hardwire-based communication module or wireless-based communication module. As examples, the communication module 1416 may be a wired or wireless Internet-based communication module that may provide wired or wireless-based, IP protocol communications between the dynamically flexible, article and other devices or a communication network such as a LAN or a WAN to which other devices are communicatively connected. Likewise, the communication module 1416 may include a near field communications (NFC) module, a radio frequency identification (RFID) communications module for communicating with, sending messages to and/or receiving messages from RFID tags stored in other devices around or close to the article. In this case, the communications module 1416 may decode signals received from RFID tags in response to pings by the RFID communication module 1416 to identify the RFID tags or tag numbers (identifiers) associated with these devices. Likewise, the communication module 1416 may be a near field communication (NFC) module or a Bluetooth communication module, which may perform near field communications or Bluetooth communications in any known or desired manner with nearby NFC or Bluetooth enabled devices, thereby enabling wireless communication between the article and other closely situated or closely located electronic devices. Still further, the communications module 1416 may include a USB or other type of wired communication module for decoding and encoding USB-based communication signals to be sent out and received via the USB communication port 1436.

As illustrated in FIG. 13, the display driver 1420 is coupled to the microprocessor 1408 and to the flexible electronic component, and drives the flexible electronic component to present different images to a user and thus implement functionality via the flexible electronic component. The display driver 1420 may be associated with or use any type of display driver technology associated with the various different types of flexible displays that might be used, including, for example, e-ink or other bi-stable display drivers, organic light emitting diode (OLED) display drivers, etc. Of course, it will be understood that the display driver 1420 is connected to the various pixel elements of the flexible electronic component to cause the pixel elements to change their visual appearance so as to present content image on the flexible electronic component. Typically, but not necessarily, each pixel element is communicatively connected to two electrodes or connectors corresponding the (x, y) coordinates of the particular pixel element on the flexible electronic component. Thus, the display driver 1420 provides image content to a set of electrodes or connectors corresponding to a width of the flexible electronic component (and, in some cases, physically emanating from a width edge of the flexible electronic component to the driver 1420), and the same display driver 1420 may provide image content to another set of electrodes or connectors corresponding to a length of the flexible electronic component (and, in some cases, physically emanating from a length edge of the flexible electronic component to connect to the driver 1420).

Returning to FIG. 13, the display driver 1420 illuminates or causes the pixel elements to obtain or reach a color, a lighting level, an on-off state, etc., so as to drive the flexible electronic component to present various images and other functionality as determined by the particular application 1460 being executed on the microprocessor 1408. In some cases, the display driver 1420 may cause various images, such as one or more artistic renditions, patterns, etc. or other types of images stored in the memory 1412 to be displayed as one of the images 1462 on the flexible electronic component. Such an image may be any type of graphic element in the form of artwork, an indication of an association of the user with a particular university or other organization, such as a logo, a mascot, an icon, etc. In the case of a static display, and particularly when the flexible electronic component is a bi-stable type of flexible display, such as an e-ink type of display, the flexible electronic component might display a particular image or background image whenever the article is in a sleep mode, and thus in which the display driver 1420 is not operating to actively drive the flexible electronic component.

Of course, the touch screen controller 1424 is connected to a touch screen interface 109, such as the one illustrated in FIG. 2B, if such an interface exists, and receives input signals from the touch screen interface 109. The controller 1424 operates to decode these input signals to identify touch events that occur with respect to the touch screen interface 109. The touch screen interface 109 may be a capacitive touch screen interface or any other suitable type of touch screen interface disposed over the flexible electronic component, and may be transparent in nature to thus enable the pixel elements of the flexible electronic component to be viewable through the touch screen interface 109. Of course, other types of touch screen interfaces may be used instead or as well. In any event, the touch screen controller 1424 operates to energize and control the touch screen interface 109, as well as to recognize and decode touch screen events to identify, for example, the location of each touch screen event, a type of a touch screen event, such as a tap or a swipe movement, etc. If desired, the touch screen controller 1424 alone or in conjunction with the processor 1408 may operate to determine or recognize gestures that are input via the touch screen interface 109, such gestures being, for example, a slide, a swipe, a multi-finger pinch or any other type of gesture that includes one or more finger movements coordinated with one another. Each such gesture may indicate an action to be taken on or via the article. Of course, the article or device may include other or different types of user input devices configured to detect user-generated gestures, such as interfaces that include buttons switches, roller balls, slide bars, pressure sensors, strain gauges, etc., disposed on, for example, the flexible electronic component or the flexible support structure. Such user interfaces may enable the user to perform more rudimentary functions, such as scrolling movements, on-off powering movements, mode switching, etc. that are traditionally entered via actuateable buttons or switches.

As previously discussed, the sensors 1428 may include any of various different types of sensors. In an embodiment, the sensors 1428 include one or more gyroscopes which detect movement of or the orientation of the article, rapid shaking of the article, etc. One or more of these types of movements may be considered to be a particular type of input or user input, such as a gesture to reset the article, to change a mode of the article, etc. Likewise, the output of such gyroscopes can be used by the microprocessor 1408 to determine the orientation or direction of the flexible electronic component to enable the microprocessor 1408, or an application 1460 executed on the microprocessor 1408, to determine the proper orientation of the image to be displayed on the flexible electronic component. In some instances, such motion detection and position detection devices might be located in the flexible support structure or other electronics modules, to enable the article to more accurately determine whether the article is oriented around a wrist or other circular member or whether it is instead laid out flat or oriented in some other manner. The microprocessor 1408 or an application executed thereon may change functionality, behavior, and/or actions of the article based on the detected orientation of the support structure and/or flexible electronic component.

In some cases, the sensors 1428 include one or more pressure sensors and/or strain gauges which detect pressure, strain, or similar forces that are considered to be an input to cause the functionality, behavior, and/or actions of the article to change, e.g., reset the article, change a mode of the article, change a presentation displayed on the flexible electronic component of the article, etc. In one example, two pressure sensors are positioned on or attached to the article (e.g., as part of the flexible support structure) so that when the dynamically flexible article is attached to itself in a generally circular or looped configuration, the pressure sensors are diametrically opposed to each other.

Figure 14A:
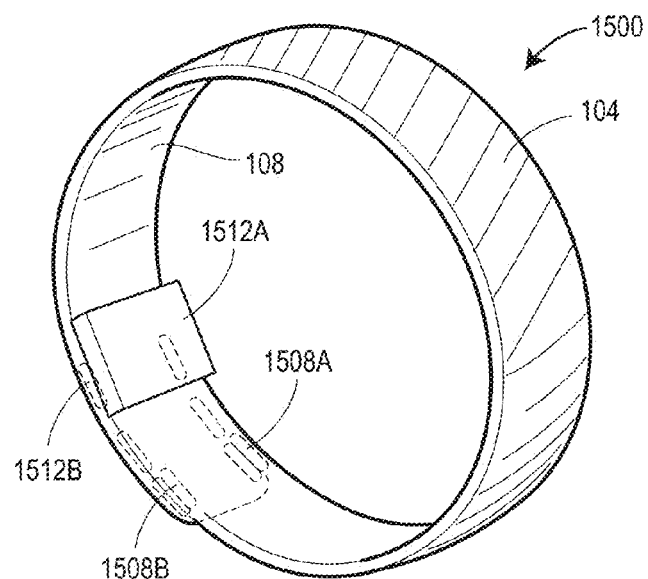
FIGS. 14A and 14B illustrate perspective and top views, respectively, of an example attachable article in the form of a wristband having a magnetically-based connection structure.
Figure 14B:
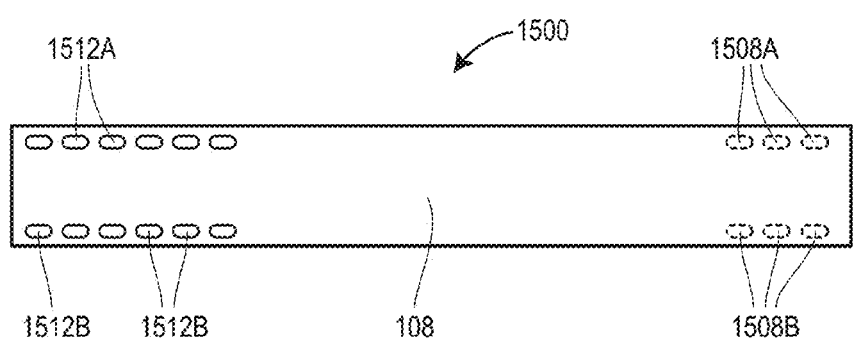

FIGS. 14A and 14B illustrate a dynamically flexible, attachable article 1500 in the form of a wristband. The article 1500 is essentially identical to the article 100 described above. The article 1500 thus includes the flexible electronic component 104, the interlayer 106, and the flexible support 108. The article 1500 differs from the article 100 in that it includes a connection structure 1504 in the form of magnets 1508A and 1508B disposed in a spaced apart manner on one side of the flexible support 108 and operate in conjunction with the magnets 1512A and 1512B, which are spaced apart and disposed on the other side of the flexible support 108 to form a secure magnetic connection when the article 1500 is wrapped around a user's wrist, for example. The spaced apart nature of the magnets enable the band to be adjustable in length so that a pair of magnetic members 1508A and 1508B (on opposite sides of the support 108) may meet up with any of a number of different pairs of magnets 1512A and 1512B (on opposite sides of the support 108) to enable the length of the band, when connected, to be adjustable. Of course, the magnets 1508A, 1508B, 1512A, and 1512B may each be permanent magnets, or one may be made of permanent magnets while the other is formed of magnetically permeable material. It will be appreciated that the connection structure 1504 and/or any other suitable connection structure can be employed in any of the articles described herein (e.g., the articles 10, 100, 200, 300, 700, 800, 900, 1100, 1200, 1300, etc.).

Figure 15:
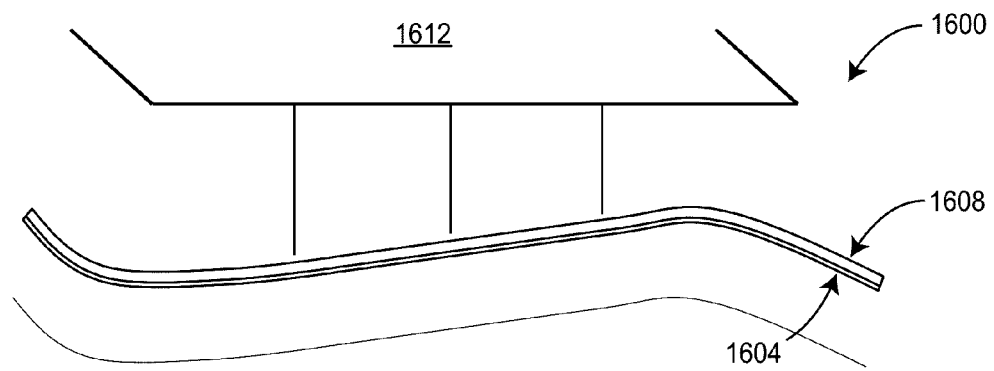
FIG. 15 is a side view of an another example article, this one in the form of a lamp or light, having a second type of flexible electronic component, an interlayer coupled to the flexible display, and a flexible support structure coupled to the flexible electronic component via the interlayer, the flexible support structure is configured to limit local bending of the flexible electronic component and support the flexible electronic component while also causing the article to have a desired bending range.
Figure 16:
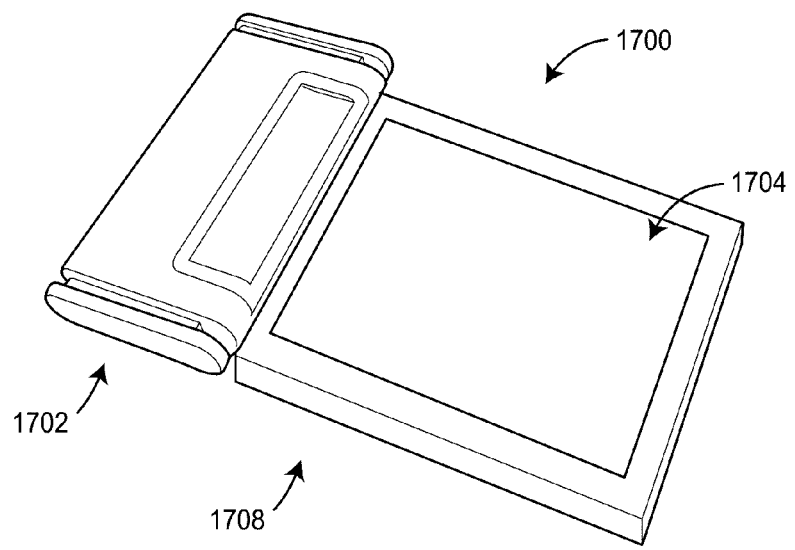
FIG. 16 is a perspective view of an another example article having a third type of flexible electronic component, an interlayer coupled to the flexible electronic component, and a flexible support structure coupled to the flexible electronic component via the interlayer, the flexible support structure is configured to limit local bending of the flexible electronic component and support the flexible electronic component while also causing the article to have a desired bending range.

FIGS. 15 and 16 illustrate other examples of dynamically flexible articles 1600 and 1700, respectively, constructed and assembled in accordance with the teachings of the present invention.

The article 1600 illustrated in FIG. 15 takes the form of a flexible light or lamp. The article 1600 includes a flexible electronic component 1604 and a flexible support structure 1608 coupled to the flexible electronic component 1604 via an interlayer (not shown), such as, for example, the interlayer 106. The flexible electronic component 1604 is similar to the flexible electronic component 104, but is an organic light-emitting diode (OLED) light instead of a flexible display. As shown in FIG. 15, the flexible electronic component 1604 is coupled (e.g., mounted) to a ceiling 1612. In other examples, the flexible electronic component 1604 can be a different component and/or need not be coupled to the ceiling 1612 (e.g., the component 1604 can be held by a user, the component 1604 can be coupled to or disposed on a different surface). Like the display 104, the flexible OLED light 1604 is dynamically bendable or flexible based on, for example, the lighting needs for the environment in which the flexible electronic component 1604 is disposed. As such, the flexible OLED light 1604 can have any number of various configurations. The flexible support structure 1608 can take the form of any of the flexible support structures described herein (e.g., the support structure 208, 308, 708, 808, 908, 1008, 1108, 1208, 1308), such that the flexible support 1608, like the other support structures described herein, fully supports the flexible OLED light 1604 in any number of various configurations while causing the article 1600 to have a desired bending range.

The article 1700 illustrated in FIG. 16 includes a base 1702, a flexible electronic component 1704, and a flexible support structure 1708. The flexible electronic component 1704 is partially disposed within and extends outward from the base 1702. The flexible support structure 1708 is coupled to the flexible electronic component 1404 via an interlayer (not shown), such as, for example, the interlayer 106. The flexible electronic component 1704 is similar to the flexible electronic component 104, but is a collapsible e-reader. Like the display 104, the flexible electronic component 1704 is dynamically bendable or flexible between, for example, the open or substantially flat in-use position depicted in FIG. 16 and a folded or closed position (not shown) in which the flexible electronic component 1704 is folded over and around an exterior surface of the base 1702. The flexible support structure 1708 can take the form of any of the flexible support structures described herein (e.g., the support structure 208, 308, 708, 808, 908, 1008, 1108, 1208, 1308), such that the flexible support 1708, like the other support structures described herein, fully supports the collapsible e-reader 1704 in both the open and closed positions while, at the same time, causing the article 1700 to have a desired bending range.

FIGS. 17-24 illustrate various mechanisms that can be used in any of the flexible support structures described herein to limit the bending or flexing motion of any of the flexible electronic components described herein. These mechanisms allow desired bending (e.g. to a bending radius that is greater than or equal to the minimum critical bending radius), while limiting undesirable bending motion such as, for example, longitudinal flexing and torsional or counter-rotational flexing of the flexible electronic component coupled to the flexible support structure. In particular, these or other mechanical structures can be used to limit the bending motion of the flexible electronic component to a minimal radius of curvature (e.g., in the rotational direction, such as when the display surface of the flexible electronic component through which the image content is viewable is bent to be concave and the surface of the flexible electronic component disposed near or adjacent the support structure or flexible band is bent to be convex) to be greater than or equal to the minimum critical bending radius of the flexible electronic component. Here, the minimum critical bending radius of the flexible electronic component is the minimal or smallest bending radius at which further bending, when done repeatedly (e.g., at least 50,000 times), will impair or destroy the functionality of the flexible electronic component by, for example, breaking the electronic connections or other components in the flexible electronic component.

Figure 17:
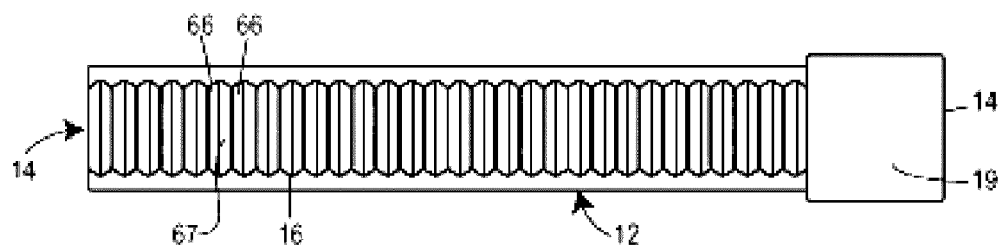
FIGS. 17-19 illustrate a flexible support of a wristband having a torsional, transverse and lateral bending limiting structure in the form of a plurality of grooves formed in an underside of the flexible support and evenly spaced from one another.
Figure 18:
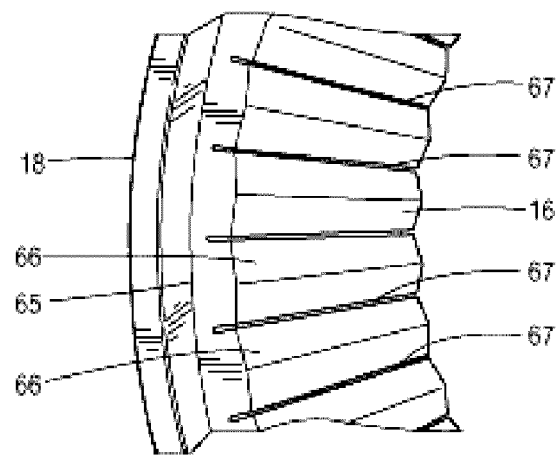
Figure 19:
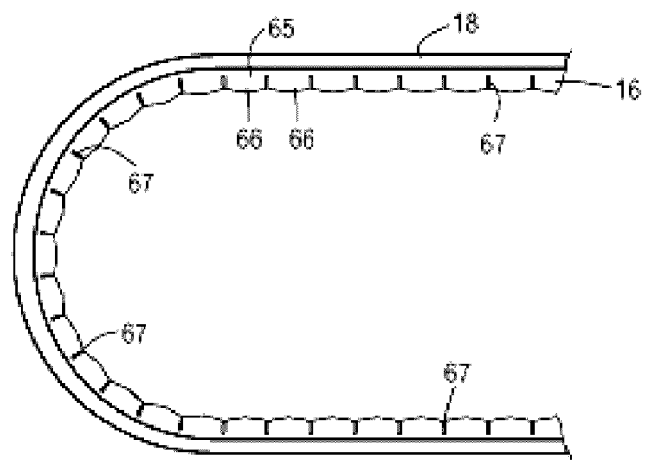

FIGS. 17-19 illustrate a dynamically flexible, attachable article or device 10 that includes a support 16 and a flexible electronic component, in the form of the flexible display 18, integrally formed with one another. As illustrated in FIGS. 17 and 18, a plurality of grooves 67 are formed (e.g., molded) in an underside of the support 16 of the band 12 from one side of the band 12 to another side of the band 12 (i.e., oriented transversely) across the band portion 12. As illustrated in FIG. 18, each groove 67 extends through only a portion of the thickness of the support 16, such that the support 16 includes a continuous bottom layer of material 65 immediately adjacent an underside of the flexible display 18 and a plurality of sections or islands 66 that jut or extend upward from the bottom layer 65 adjacent respective grooves 67. The grooves 67 illustrated herein each have a U-shape, but can, in other embodiments, have a different shape (e.g., a rectangular shape, can be more curved, can be flatter). So defined, each groove 67 forms a sort of "living hinge" that operates to control (e.g., limit or reduce) the amount of bending between the sections 66 of the support 16 that are adjacent to that groove 67. FIG. 19 illustrates how the grooves 67 can, when the band 12 is being bent, operate to control the amount of bending between the sections 66 of the support 16, and, in turn, control the amount of bending applied to the display 18. Because the grooves 67 are evenly spaced apart across the band portion 12, all of the sections 66 of the support 16 are subject to the same bending or flexing limit. The material forming the bottom layer of material 65 and the material forming the islands 66 may be made of the same or different material and each may be made of either compressible (such as foam, rubber, etc.) or non-compressible materials (such as hard plastic, metal, etc.) In fact, both of the layers 65 and 66 may be made of non-compressible materials, one of the layers 65 and 66 may be made of a compressible material while the other layer may be made of a non-compressible material, or the layers 65 and 66 may be both made of compressible materials with the same or different compressibility.

The size, number, spacing and/or compressibility of the material forming the grooves 67 may be varied to define, and thus limit, the amount of torsional or other bending motion that can be applied to the support 16. For example, while the grooves 67 shown in FIG. 18 only extend through a portion of the support 16, the grooves 67 can, in other embodiments, may extend through more or less of the support 16, which would, in turn, affect the degree of curvature permitted by the grooves 67. As noted above, the grooves 67 illustrated in FIGS. 17-19 are evenly spaced across the band portion 12, such that all portions of the band 12 are subject to the same bending or flexing limit.

Figure 20:
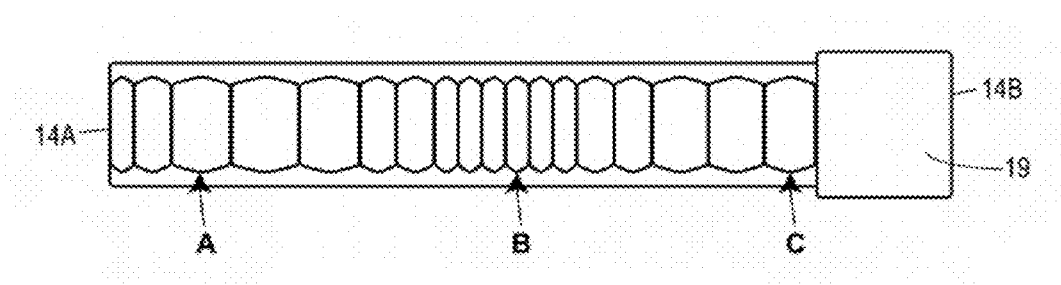
FIGS. 20 and 21 illustrate a flexible support of a wristband having a torsional, lateral and transverse bending limiting structure in the form of a plurality of grooves formed in an underside of the flexible support and spaced apart from one another at various distances.
Figure 21:
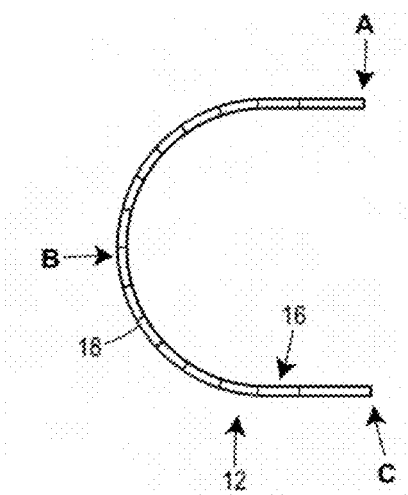

Alternatively, however, one or more of the grooves 67 can be spaced at different distances across the band 12, with the effect that different portions of the device 10 (e.g., the sides) can be bent or flexed more than other portions of the device 10 (e.g., the top and the bottom or one side versus the other side of the band). In the embodiment illustrated in FIGS. 20 and 21, the grooves 67 are spaced at different distances across the longitudinal span of the band 12. As illustrated in FIG. 20, the distance between the grooves 67 near or at the end 14A is greater than the distance between the grooves 67 near or at a middle portion of the band 12, and the distance between the grooves 67 near or at the end 14B is greater than the distance between the grooves 67 near or at the middle portion. As illustrated in FIG. 21, different portions of the device 10 can thus be bent or flexed more than other portions of the device 10. Specifically, the portion of the band 12 labeled B, by virtue of having grooves 67 that are spaced closer to one another, can be bent or flexed more than the portion of the band labeled A and the portion of the band 12 labeled C, which have grooves 67 that are further apart. Moreover, the width of the grooves 67 can be varied to provide more or less flexing in the band at particular locations.

Figure 22:
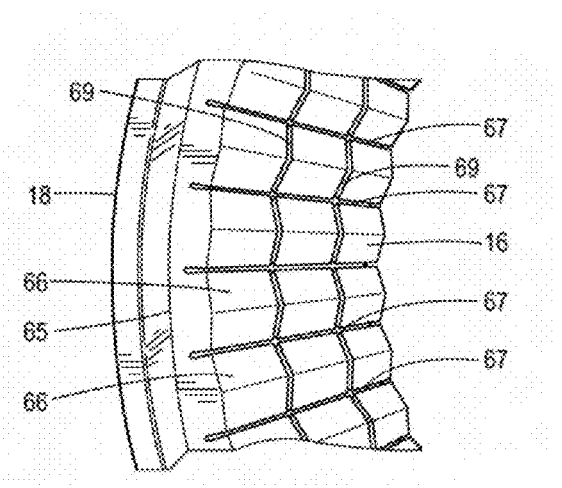
FIG. 22 illustrates a top view of a flexible support of a wristband having torsional, transverse and lateral bending limiting structure in the form of a number of longitudinal and transverse grooves formed in the flexible support.

In FIG. 22, for example, the article 10 includes a plurality of longitudinal grooves 69 formed in the support 16 between the ends 14 and along the longitudinal axis of the band 12. The grooves 69 can thus be oriented perpendicular to the grooves 67 described in FIGS. 17-19. The grooves 69, like the grooves 67, operate to permit a desired maximum amount of flexing and torsional rotation of the display 18. The grooves 69, however, permit a desired amount of flexing and torsional rotation in a direction perpendicular to the longitudinal axis of the band 12.

The size, width, number, and/or spacing of the longitudinal grooves 69 may be varied to adjust this maximum amount, limit flexing or rotation at certain points along the display 18, and/or facilitate flexing or rotation at certain points along the display 18. For example, the grooves 69 can be larger (e.g., wider) than what is illustrated in FIG. 22, can be formed in only a portion of the support 16, or can be more numerous (e.g., there can be a groove 69 between each of the transverse grooves) than what is illustrated in FIG. 17. Likewise, the grooves 69 can be spaced and/or positioned differently. As an example, the grooves 69 can be disposed closer to the edges of the band 12 (i.e., not on the longitudinal axis of the band 12). These grooves can also be equally spaced or the same size, or may vary as they get farther from the longitudinal center of the band to allow more or less torsional bending at different points along the width of the band 12.

Figure 23:
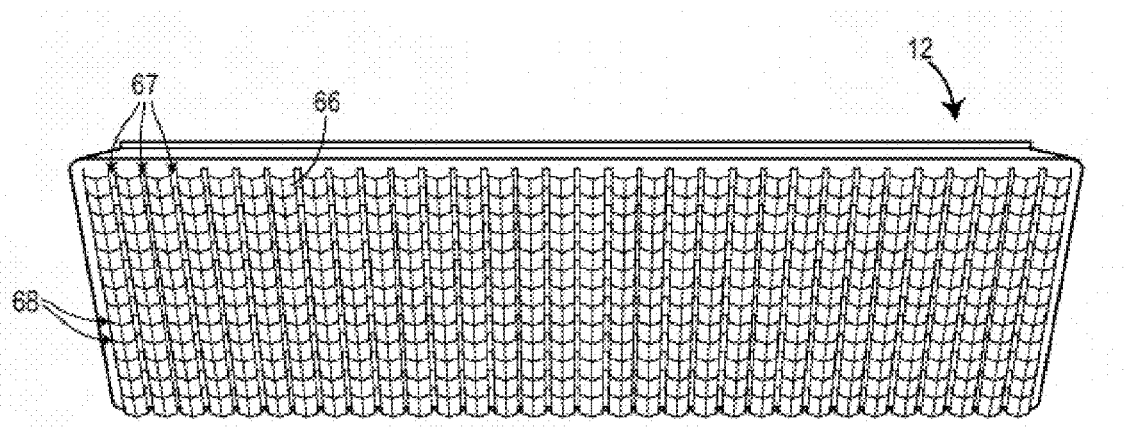
FIG. 23 illustrates a third flexible substrate having an integral material with grooves disposed along two dimensions that operate to limit the bending range of the flexible substrate in two dimensions.
Figure 24:
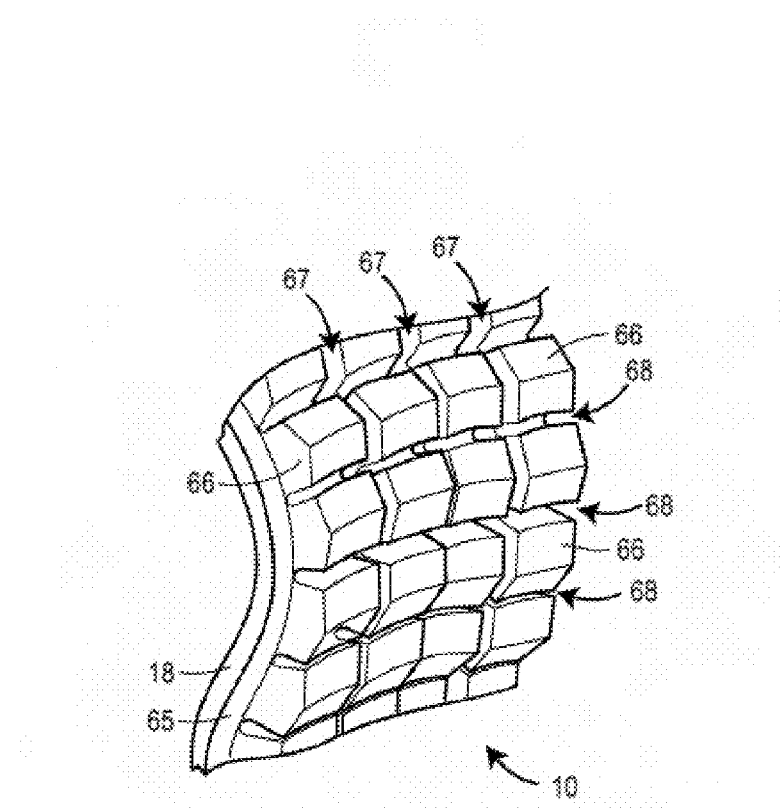
FIG. 24 depicts an expanded view of a portion of the flexible substrate of FIG. 23 bent in multiple directions to conform to a complex curved surface.

FIGS. 23 and 24 illustrate yet another bending limiting structure that can be used within the support 12. In this case, the material forming the support 12 may be used to effect the bending limiting motion. As illustrated in FIGS. 23 and 24, the support 12 is made, at least partially, of an integrally formed sheet of material 66 having a plurality of grooves 67 and 68 being formed (e.g., molded) into the underside of the support 12 generally extending from one side of the support 12 to another side of the support 12 in both directions. The grooves 67 and 68 are, in this case, orthogonal to each other and the grooves 67 run from one transverse side to the other transverse side while the grooves 68 run from one longitudinal side to the other longitudinal side of the support 12. As illustrated best in FIG. 24, each groove 67 and 68 extends through only a portion of the thickness of the support 12, such that the support 12 includes a continuous bottom layer of material 65 immediately adjacent an underside of the flexible display 18 and a plurality of sections or islands 66 that jut out or extend upward from the bottom layer 65 formed by the respective grooves 67 and 68. The grooves 67 and 68 illustrated herein each have a U-shape, but can, in other embodiments, have a different shape (e.g., a rectangular shape, a triangular or V-shape), could be more or less curved, could be flatter, etc. So defined, each of the grooves 67 and 68 forms a sort of "living hinge" that operates to control (e.g., limit or reduce) the amount of bending between the sections 66 of the support 12 that are adjacent to that groove 67 or 68, as the sides of these grooves 67 and 68 (forming the islands 66) come into contact with each other at some point of flexing, to limit further flexing motion. FIG. 24 illustrates how the grooves 67 and 68 can, when the support 12 is being bent, operate to control the amount of bending between the sections or islands 66 of the support 12, and, in turn, control the amount of bending applied to the display 18 at any particular location. Because the grooves 67 and 68 are evenly spaced apart across the support 12, all of the sections 66 of the support 12 are subject to the same amount of bending or flexing limit in both directions. The material forming the bottom layer of material 65 and the material forming the islands 66 may be made of the same or different material and each may be made of either compressible material (such as foam, rubber, etc.) or non-compressible material (such as hard plastic, metal, etc.) In fact, both of the layers 65 and the islands 66 may be made of non-compressible materials, one of the layers 65 and the islands 66 may be made of a compressible material while the other layer or island may be made of a non-compressible material, or the layers 65 and the islands 66 may be both made of compressible materials with the same or different degree of compressibility. Of course, the spacing between the various grooves 67 and the various grooves 68 can be varied to provide for more or less flexing of the support 12 in the different directions or even at different locations of the support 12 in or along a single direction.

Of course, the size, the number, the spacing and/or the compressibility of the material forming the islands 66 and the grooves 67 and 68 may be varied to define, and thus limit, the amount of bending motion that can be applied to the support 12 in each direction (e.g., the transverse direction and the longitudinal direction). For example, while the grooves 67 and 68 shown in FIGS. 23 and 24 only extend through a portion of the support 12, the grooves 67 and 68 may, in other embodiments, extend through more or less of (deeper or less deep into) the support 12, which would, in turn, affect the degree of curvature permitted by the grooves 67 and 68. As another example, the grooves 67 and 68 can be oriented differently relative to one another (i.e., so that the grooves 67 and 68 are not disposed orthogonal to one another). Moreover, the support 12 can include three sets of grooves angled with respect to one another (e.g., arranged at 60 degrees relative to one another), thereby forming a pattern of triangular islands 66. As noted above, the grooves 67 and 68 illustrated in FIGS. 23 and 24 are evenly spaced across the band portion 12, such that all portions of the band 12 are subject to the same bending or flexing limit. However, this spacing could be varied in any desired manner to vary the bending range or motion allowed by the grooves 67 and 68.

For example, sets of the grooves 67 and/or 68 can be spaced at different distances from each other across transverse or longitudinal length of the support 12, with the effect that different portions of the support 12 can be bent or flexed more than other portions of the support 12. For example, in an embodiment, the grooves 67 may be spaced at different distances from one another across the transverse span of the support 12 while the grooves 68 may be equally spaced apart. In one example, the distances between the grooves 67 near or at an end of the support 12 may be greater than the distance between the grooves 67 near or at a middle portion of the support 12. In another embodiment, the grooves 67 may be evenly spaced apart while the grooves 68 are spaced apart at different distances from one another across the longitudinal span of the support 12. In another embodiment, the grooves 67 and 68 may be unevenly spaced in both directions. Likewise, the spacing used for the grooves 67 may be the same or different than the spacing used for the grooves 68. As such, different portions of the support 12 can be bent or flexed more than other portions of the support 12.

The following additional considerations apply to the foregoing discussion. Throughout this specification, plural instances may implement components, operations, or structures described as a single instance. Although individual operations of one or more routines or methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter of the present disclosure.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" is employed to describe elements and components of the embodiments herein. This is done merely for convenience and to give a general sense of the description. This description should be read to include one or at least one and the singular also includes the plural unless it is obvious that it is meant otherwise.

Upon reading this disclosure, those of skill in the art will appreciate still additional alternative structural and functional designs for implementing display features via a flexible electronic display on a dynamically flexible, attachable article as disclosed herein. Thus, while particular embodiments and applications have been illustrated and described herein, it is to be understood that the disclosed embodiments are not limited to the precise construction and components disclosed herein. Various modifications, changes and variations, which will be apparent to those skilled in the art, may be made in the arrangement, operation and details of the methods and structure disclosed herein without departing from the spirit and scope defined in the claims.

The invention claimed is:

1. An article, comprising:
a flexible display movable between a first position and a second position, the flexible display having a neutral plane;
a flexible support coupled to the flexible display and configured to limit local bending of the flexible display, the flexible support comprising a plurality of interconnected support structures and a plurality of hinge points configured to facilitate movement of the flexible display between the first and second positions, the plurality of interconnected support structures movable with respect to one another and the plurality of hinge points defined by movement between the plurality of interconnected support structures, the plurality of hinge points positioned close to the neutral plane of the flexible display such that the article has one or more bending planes that are close to the neutral plane; and
an interlayer coupled between the flexible support and the flexible display, wherein the interlayer provides support for the flexible display when the flexible display is moved between the first position and the second position.

2. The article of claim 1, wherein the plurality of hinge points are substantially located along the neutral plane of the flexible electronic component.

3. The article of claim 1, wherein the plurality of hinge points is defined by a plurality of grooves formed in a top or bottom side of the flexible support, each of the plurality of grooves configured to limit bending of a corresponding portion of the flexible electronic component in an outward or inward direction.

4. The article of claim 3, wherein the plurality of support sections are defined by the plurality of grooves, wherein each of the plurality of grooves is configured to limit bending between support sections adjacent to that groove, and wherein, when the flexible electronic component is in the second position, portions of the adjacent support sections are configured to contact one another and substantially close a respective groove therebetween, thereby preventing further bending of the flexible electronic component.

5. The article of claim 4, wherein each pair of adjacent support sections comprises a slot formed in a first of the support sections and a corresponding stop tab extending from a second of the support sections and movably disposed within the slot, each slot being configured to limit the amount of bending between the adjacent first and second support sections.

6. The article of claim 5, wherein each slot defines a first stop surface and a second stop surface opposite the first stop surface, each first stop surface arranged to limit bending of the flexible electronic component in an outward direction, and each second stop surface arranged to limit bending of the flexible electronic component in an inward direction.

7. The article of claim 1, wherein the plurality of support sections comprise a plurality of links slidably connected to one another.

8. The article of claim 7, wherein each of the plurality of links comprises:
   a base; and
   at least one projection extending upward from the base, the at least one projection configured to interferingly contact a portion of an adjacent respective link to limit bending between adjacent links.

9. The article of claim 7, wherein each of the plurality of links comprises:
   a base having a first end and a second end opposite the first end;
   a pair of tabs that extend downward from the base proximate to the first end, the tabs configured to be disposed in portions, respectively, of a first respective link adjacent to the first end; and
   a pair of projections that extend upward from the base proximate to the first end, the projections configured to interferingly engage a portion of a second respective link adjacent to the second end so as to limit bending between adjacent links.

10. The article of claim 7, wherein each of the plurality of links includes a first end, a second end opposite the first end, a first slot formed proximate to the first end, a second slot formed proximate to the second end, a first pin, and a second pin, and wherein the first pin of a first link is disposed in the second slot of a second link, the second pin of the second link is disposed in the first slot of the first link, the second pin of the first link is disposed in the first slot of a third link, and the first pin of the third link is disposed in the second slot of the first link.

11. The article of claim 7, wherein each of the plurality of links includes a first end and a second end opposite the first end, a first pair of slots formed proximate to the first end, and a second pair of slots formed proximate to the second end, the first and second pairs of slots configured to limit bending between adjacent links.

12. The article of claim 11, wherein each first pair of slots defines a first pin guide path having a first slot position corresponding to the first position of the flexible electronic component and a second slot position corresponding to the second position of the flexible electronic component, and wherein each second pair of slots defines a second pin guide path having a third slot position corresponding to the first position of the flexible electronic component and a fourth slot position corresponding to the second position of the flexible electronic component.

13. The article of claim 12, wherein a first respective pin is disposed within the first guide path of each first pair of slots and slidable between the first slot position and the second slot position of that first guide path, and wherein a second respective pin is disposed within the second guide path of each second pair of slots and slidable between the third slot position and the fourth slot position of that second guide path.

14. The article of claim 11, wherein a first pair of pins slidably and pivotally connects a first pair of slots of a first link to a second pair of slots of a second link, and wherein a second pair of pins slidably and pivotally connects a second pair of slots of the first link to a first pair of slots of a third link.

15. The article of claim 11, wherein one of the first pair of slots is angled relative to one of the second pair of slots.

16. The article of claim 7, wherein each link of the plurality of links comprises a first housing portion and a second housing portion removably coupled to the first housing portion.

17. The article of claim 16, wherein the first housing portion comprises a plurality of tabs and the second housing portion comprises a plurality of grooves sized to receive the plurality of tabs to couple the second housing portion to the first housing portion.

18. The article of claim 7, wherein each of the plurality of links comprises:
   a base;
   a pair of sidewalls extending upward from the base;
   a slot formed in each of the sidewalls; and
   a tab extending outward from each of the sidewalls and movably disposed in the slot of a respective adjacent link so as to limit bending between adjacent links.

19. The article of claim 18, wherein each sidewall has a first portion, a second portion, and a transition portion disposed between the first and second portions, wherein each of the plurality of links comprises a first pair of apertures formed in the two first portions and a second pair of apertures formed in the two second portions, wherein the first pair of apertures are aligned with the second pair of apertures of a respective second adjacent link, and wherein the second pair of apertures are aligned with the first pair of apertures of a respective third adjacent link.

20. The article of claim 18, wherein each slot defines a first stop surface and a second stop surface opposite the first stop surface, each first stop surface arranged to limit bending of the flexible electronic component in an inward direction, and each second stop surface arranged to limit bending of the flexible electronic component in an outward direction.

21. The article of claim 1, wherein each of the plurality of support structures is substantially rigid.

22. An article, comprising:
   a flexible display movable between a first position and a second position, the flexible display having a neutral plane; and
   a flexible support coupled to the flexible display and configured to limit local bending of the flexible display, the flexible support comprising a plurality of links and a plurality hinge points defined by the plurality of links, wherein each of the plurality of links includes a first end and a second end opposite the first end, a first pair of slots formed proximate to the first end, and a second pair of slots formed proximate to the second end, the first and second pairs of slots configured to limit bending between adjacent links, and wherein the article has one or more bending planes defined by the hinge points, and wherein the bending planes are close to the neutral plane of the flexible display.

23. The article of claim 22, wherein each first pair of slots defines a first pin guide path having a first slot position corresponding to the first position of the flexible electronic component and a second slot position corresponding to the second position of the flexible electronic component, and wherein each second pair of slots defines a second pin guide path having a third slot position corresponding to the first position of the flexible electronic component and a fourth slot position corresponding to the second position of the flexible electronic component.

24. The article of claim 22, wherein a first respective pin is disposed within the first guide path of each first pair of slots and slidable between the first slot position and the second slot position of that first guide path, and wherein a second respective pin is disposed within the second guide path of each second pair of slots and slidable between the third slot position and the fourth slot position of that second guide path.

25. The article of claim 22, wherein a first pair of pins slidably and pivotally connects the first pair of slots of a first link to the second pair of slots of a second link, and wherein a second pair of pins slidably and pivotally connects the second pair of slots of the first link to the first pair of slots of a third link.

26. An article, comprising:
a flexible display movable between a first position and a second position; and
a flexible support coupled to the flexible display and configured to limit local bending of the flexible display, the flexible support comprising a plurality of interconnected support structures and a plurality of hinge points configured to facilitate movement of the flexible display between the first and second positions, the plurality of interconnected support structures movable with respect to one another and the plurality of hinge points defined by movement between the plurality of interconnected support structures, the plurality of hinge points being positioned substantially close to a neutral plane of the flexible display,
wherein the plurality of hinge points are movable, relative to the flexible support, when the flexible display is moved between the first position and the second position, such that the article has a desired bending range.

27. The article of claim 26, wherein the flexible display is locally coupled to the flexible support at a plurality of fixation points, the flexible display being freely movable, relative to the flexible support, between the fixation points when moved between the first and second positions.

28. The article of claim 26, wherein a continuous, curved line is defined by the plurality of hinge points when the flexible display is in the first position and when the flexible display is in the second position.

29. The article of claim 26, wherein the article further comprises a connection mechanism disposed proximate to one or both ends of the article to connect two different portions of the article together.

* * * * *